US012792192B2

(12) United States Patent
Jeon et al.

(10) Patent No.: US 12,792,192 B2
(45) Date of Patent: Nov. 10, 2026

(54) DISPLAY DEVICE AND ELECTRONIC DEVICE INCLUDING THE SAME

(71) Applicant: SAMSUNG DISPLAY CO., LTD., Yongin-si (KR)

(72) Inventors: Hyunjee Jeon, Yongin-si (KR); Gwang-Bum Ko, Yongin-si (KR); Sanghyun Lim, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 19/360,001

(22) Filed: Oct. 16, 2025

(65) Prior Publication Data

US 2026/0044241 A1 Feb. 12, 2026

Related U.S. Application Data

(63) Continuation of application No. 18/816,181, filed on Aug. 27, 2024, now Pat. No. 12,468,429.

(30) Foreign Application Priority Data

Aug. 29, 2023 (KR) ........................ 10-2023-0113799

(51) Int. Cl.
*G06F 3/046* (2006.01)
*G06F 3/0354* (2013.01)
(Continued)

(52) U.S. Cl.
CPC .......... *G06F 3/046* (2013.01); *G06F 3/03545* (2013.01); *G06F 3/0383* (2013.01);
(Continued)

(58) Field of Classification Search
CPC .. G06F 3/046; G06F 3/04164; G06F 3/03545; G06F 3/0383; G06F 3/0412;
(Continued)

(56) References Cited

U.S. PATENT DOCUMENTS 9,678,604 B2 * 6/2017 Lee .......................... G06F 3/046
2022/0052140 A1 * 2/2022 Choi .................... H10D 86/423
2025/0077035 A1 3/2025 Jeon et al.

FOREIGN PATENT DOCUMENTS

JP 2020095075 6/2020
KR 10-2015-0014295 2/2015
(Continued)

*Primary Examiner* — Lisa S Landis
(74) *Attorney, Agent, or Firm* — F. CHAU & ASSOCIATES, LLC

(57) ABSTRACT

The present application relates to a display device and an electronic device including the same. The display device includes a display panel including a display region and a non-display region, and an input sensor disposed on the display panel. The display panel includes a base layer including resin layers, pixels disposed on the base layer and overlapping the display region, a charging electrode disposed under at least one resin layer and overlapping the display region, and a first shielding pattern disposed on the base layer and overlapping the display region, the first shielding pattern having a first thickness and having at least one slit dividing the first shielding pattern into sections. The first thickness corresponds to a thickness satisfying a relation of the following equation:

$$T1 \leq \left(\frac{D}{ABC}\right)^{1/2},$$

where T1 represents the first thickness, A is π, B is permeability of the first shielding pattern, C is frequency of electric current flowing through the first shielding pattern, and D is resistivity of the first shielding pattern.

20 Claims, 34 Drawing Sheets

(51) Int. Cl.

| | |
|---|---|
| ***G06F 3/038*** | (2013.01) |
| ***G06F 3/041*** | (2006.01) |
| ***H10K 59/126*** | (2023.01) |
| ***H10K 59/40*** | (2023.01) |

(52) U.S. Cl.
CPC ........ *G06F 3/0412* (2013.01); *G06F 3/04164* (2019.05); *H10K 59/126* (2023.02); *H10K 59/40* (2023.02); *G06F 2203/04102* (2013.01); *G06F 2203/04107* (2013.01)

(58) Field of Classification Search
CPC G06F 2203/04102; G06F 2203/04107; H10K 59/126; H10K 59/40
See application file for complete search history.

(56) References Cited

FOREIGN PATENT DOCUMENTS

| | | |
|---|---|---|
| KR | 10-1572530 | 11/2015 |
| KR | 10-1750564 | 6/2017 |

* cited by examiner

DISPLAY DEVICE AND ELECTRONIC DEVICE INCLUDING THE SAME

CROSS-REFERENCE TO RELATED APPLICATIONS

This application is a continuation of U.S. application Ser. No. 18/816,181 filed on Aug. 27, 2024, which claims priority under 35 U.S.C. § 119 to Korean Patent Application No. 10-2023-0113799 filed on Aug. 29, 2023, in the Korean Intellectual Property Office, the disclosures of which are incorporated by reference herein in their entirety.

BACKGROUND

Embodiments of the present disclosure described herein relate to a display device and an electronic device including the same, and more particularly, relate to a display device including a sensing electrode, a charging electrode, and a shielding pattern.

Various display devices used in multimedia devices, such as mobile phones, tablet computers, car navigation units, game machines, and the like, are being developed. The display devices include a keyboard or a mouse as an input device. The display devices include an input sensor as an input device.

The input sensor may sense a user input in a capacitive type, or may sense a user input in a self-capacitive type. The input sensor may sense an input of a stylus pen using an electromagnetic induction method.

SUMMARY

Embodiments of the present disclosure provide a display device for preventing a magnetic field generated by a shielding electrode from decreasing charging efficiency of a charging electrode.

Embodiments of the present disclosure provide a display device for preventing interference with a pixel when driving a charging electrode.

Embodiments of the present disclosure provide an electronic device including the display device.

According to an aspect of the present disclosure, a display device includes a display panel including a display region and a non-display region around the display region, and an input sensor disposed on the display panel, the input sensor including a sensing electrode configured to sense an electromagnetically induced current. The display panel includes a base layer including a plurality of resin layers, a plurality of pixels disposed on the base layer and overlapping the display region, a charging electrode disposed under at least one resin layer among the plurality of resin layers and overlapping the display region, and a first shielding pattern disposed on the base layer and overlapping the display region, the first shielding pattern having a first thickness and having at least one slit dividing the first shielding pattern into a plurality of sections. The first thickness corresponds to a thickness satisfying a relation of the following equation:

$$T1 \leq \left(\frac{D}{ABC}\right)^{1/2},$$

where T1 represents the first thickness, A is pi (π), B is permeability of the first shielding pattern, C is frequency of electric current flowing through the first shielding pattern, and D is resistivity of the first shielding pattern.

The first shielding pattern overlaps the charging electrode when viewed in a plan view.

Each of the plurality of pixels may include a light emitting element and at least one transistor connected to the light emitting element, and the first shielding pattern may overlap the transistor when viewed in a plan view.

The first shielding pattern includes a plurality of unit patterns including a first unit pattern covering the transistor, and a plurality of connecting patterns, each of the plurality of connecting patterns connecting two adjacent unit patterns of the plurality of unit patterns.

The entirety of the transistor is covered by the first unit pattern when viewed in a plan view.

The charging electrode is disposed in spaces between two adjacent slits among the at least one slit when viewed in a plan view.

The at least one slit includes a plurality of slits, and the plurality of slits extend in a first direction and are spaced apart from each other in a second direction crossing the first direction.

The at least one slit includes a plurality of slits, and the plurality of slits radially extend with respect to a center of the first shielding pattern.

The at least one slit has a single slit, the single slit includes a plurality of first slit portions extending in a first direction and a plurality of second slit portions extending in a second direction crossing the first direction, and each of the plurality of second slit portions connects two adjacent first slit portions of the plurality of first slit portions.

The plurality of resin layers may include a first resin layer and a second resin layer disposed on the first resin layer. The charging electrode may be disposed on the first resin layer and may be covered by the second resin layer, and the first shielding pattern may be disposed on the second resin layer.

The display panel may further include an insulating layer that covers the first shielding pattern and a second shielding pattern that is disposed on the insulating layer and that overlaps the display region.

A second thickness of the second shielding pattern corresponds to a thickness satisfying the relation of the following equation:

$$T2 \leq \left(\frac{D}{ABC}\right)^{1/2},$$

where T2 represents the second thickness.

One of the first shielding pattern and the second shielding pattern may cover transistors of the plurality of pixels when viewed from above a plane, and the other of the first shielding pattern and the second shielding pattern may cover the charging electrode when viewed from above the plane.

The sensing electrode may include a first electrode of a first group that extends in a first direction, a second electrode of the first group that extends in a second direction crossing the first direction and that is capacitively coupled with the first electrode of the first group, a first electrode of a second group that extends in the first direction and senses the electromagnetically induced current, a second electrode of the second group that extends in the second direction and senses the electromagnetically induced current, a first signal line of a first group connected to one end of the first electrode of the first group, a second signal line of the first group connected to one end of the second electrode of the first group, a first signal line of a second group connected to one end of the first electrode of the second group, and a second signal line of the second group connected to one end of the second electrode of the second group.

The first shielding pattern may include at least one of rhodium (Rh), tungsten (W), and molybdenum (Mo).

According to an embodiment to the present disclosure, a display device includes a display panel including a display region and a non-display region around the display region, and an input sensor disposed on the display panel, the input sensor including a sensing electrode sensing an electromagnetically induced current. The display panel includes a plurality of pixels overlapping the display region, each pixel including a light emitting element and at least one transistor connected to the light emitting element, a charging electrode spaced apart from the sensing electrode with the plurality of pixels therebetween and overlapping the display region, wherein the charging electrode is below a first pixel of the plurality of pixels, and a shielding pattern disposed over the charging electrode and overlapping the display region, the shielding pattern being divided into a plurality of sections by at least one slit, and the shielding pattern disposed between the charging electrode and the first pixel. The plurality of sections are configured to form a current path generating a magnetic field.

A first thickness T1 of the shielding pattern satisfies a relation of the following equation:

$$T1 \leq \left(\frac{D}{ABC}\right)^{1/2},$$

where T1 is the first thickness, A is pi (π), B is permeability of the shielding pattern, C is frequency of electric current flowing through the shielding pattern, and D is resistivity of the shielding pattern.

The shielding pattern may cover the charging electrode when viewed in a plan view.

The shielding pattern may cover the transistor when viewed in a plan view.

According to an aspect of the present disclosure, an electronic device includes a housing, an electronic module disposed in the housing, a display device disposed to overlap the electronic module, and a stylus pen including a resonance circuit. The display device includes a display panel including a display region and a non-display region around the display region, and an input sensor disposed on the display panel and configured to sense a resonance signal transmitted from the stylus pen. The display panel includes a base layer including a plurality of resin layers, a plurality of pixels disposed on the base layer and overlapping the display region, a charging electrode disposed under at least one of the plurality of resin layers and charging the stylus pen, and a first shielding pattern disposed on the base layer and overlapping the display region, the first shielding pattern having a first thickness. The first thickness corresponds to a thickness satisfying a relation of the following equation:

$$T1 \leq \left(\frac{D}{ABC}\right)^{1/2},$$

where T1 represents the first thickness, A is pi (π), B is permeability of the first shielding pattern, C is frequency of electric current flowing through the first shielding pattern, and D is resistivity of the first shielding pattern.

BRIEF DESCRIPTION OF THE FIGURES

The above and other objects and features of the present disclosure will become apparent by describing in detail embodiments thereof with reference to the accompanying drawings.

DETAILED DESCRIPTION

Figure 1A:
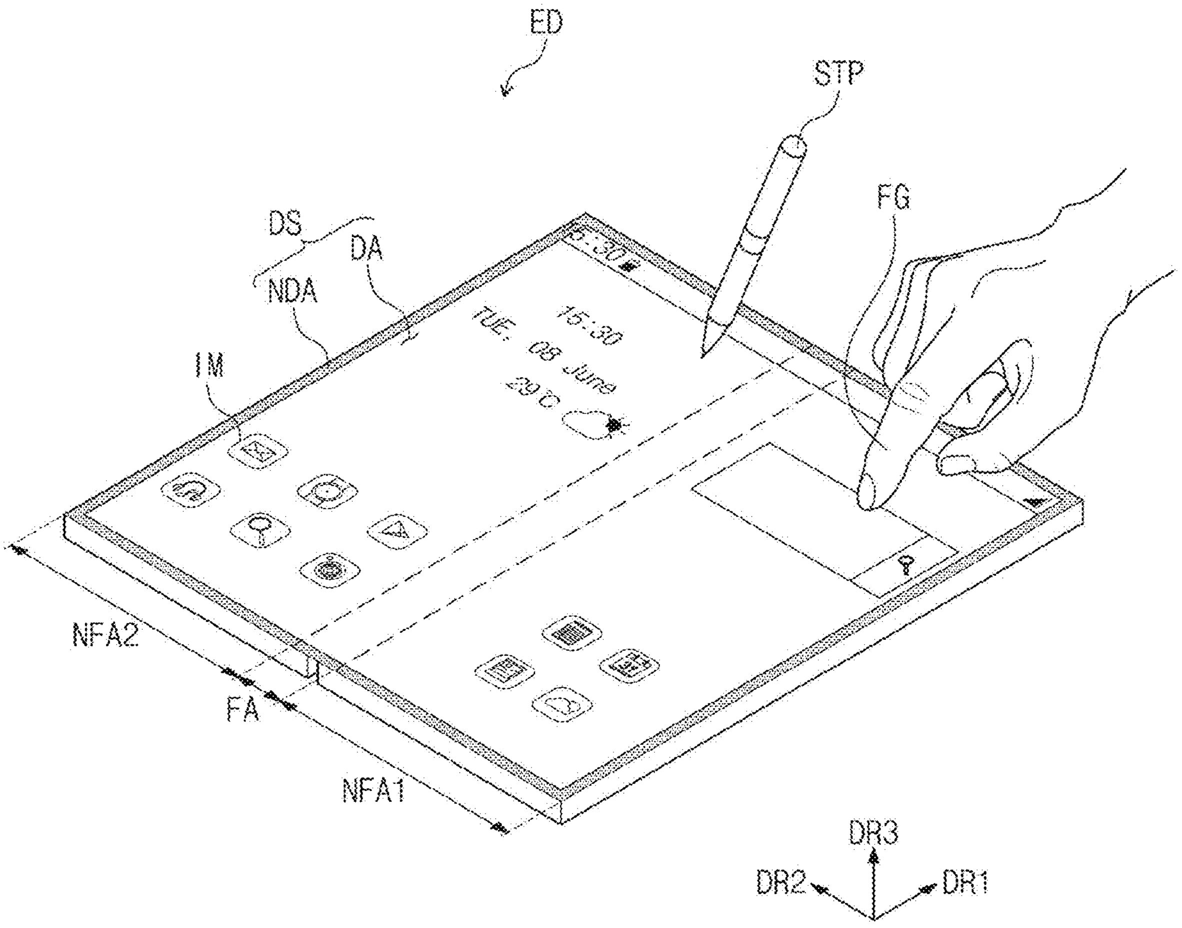
FIGS. 1A to 1C are perspective views of an electronic device according to an embodiment of the present disclosure.

In this specification, when it is mentioned that a component (or, an area, a layer, a part, etc.) is referred to as being "on", "connected to" or "coupled to" another component, this means that the component may be directly on, connected to, or coupled to the other component or a third component may be present therebetween.

Identical reference numerals refer to identical components. Additionally, in the drawings, the thicknesses, proportions, and dimensions of components are exaggerated for effective description. As used herein, the term "and/or" includes all of one or more combinations defined by related components.

Terms such as first, second, and the like may be used to describe various components, but the components should not be limited by the terms. The terms may be used only for distinguishing one component from other components. For example, without departing the scope of the present disclosure, a first component may be referred to as a second component, and similarly, the second component may also be referred to as the first component. The terms of a singular form may include plural forms unless otherwise specified.

In addition, terms such as "below", "under", "above", and "over" are used to describe a relationship of components illustrated in the drawings. The terms are relative concepts and are described based on directions illustrated in the drawing.

It should be understood that terms such as "comprise", "include", and "have", when used herein, specify the presence of stated features, numbers, steps, operations, components, parts, or combinations thereof, but do not preclude the presence or addition of one or more other features, numbers, steps, operations, components, parts, or combinations thereof.

Unless otherwise defined, all terms used herein, including technical or scientific terms, have the same meanings as those generally understood by those skilled in the art to which the present disclosure pertains. Such terms as those defined in a generally used dictionary are to be interpreted as having meanings equal to the contextual meanings in the relevant field of art, and are not to be interpreted as having ideal or excessively formal meanings unless clearly defined as having such in the present application.

Hereinafter, embodiments of the present disclosure will be described with reference to the accompanying drawings.

Figure 1B:
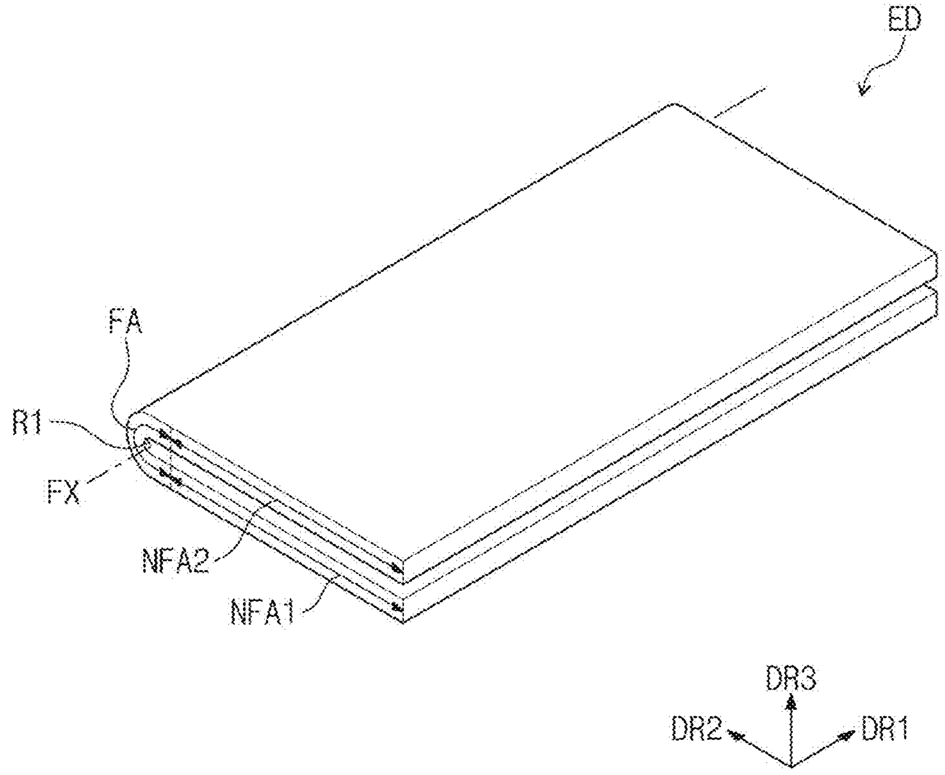
Figure 1C:
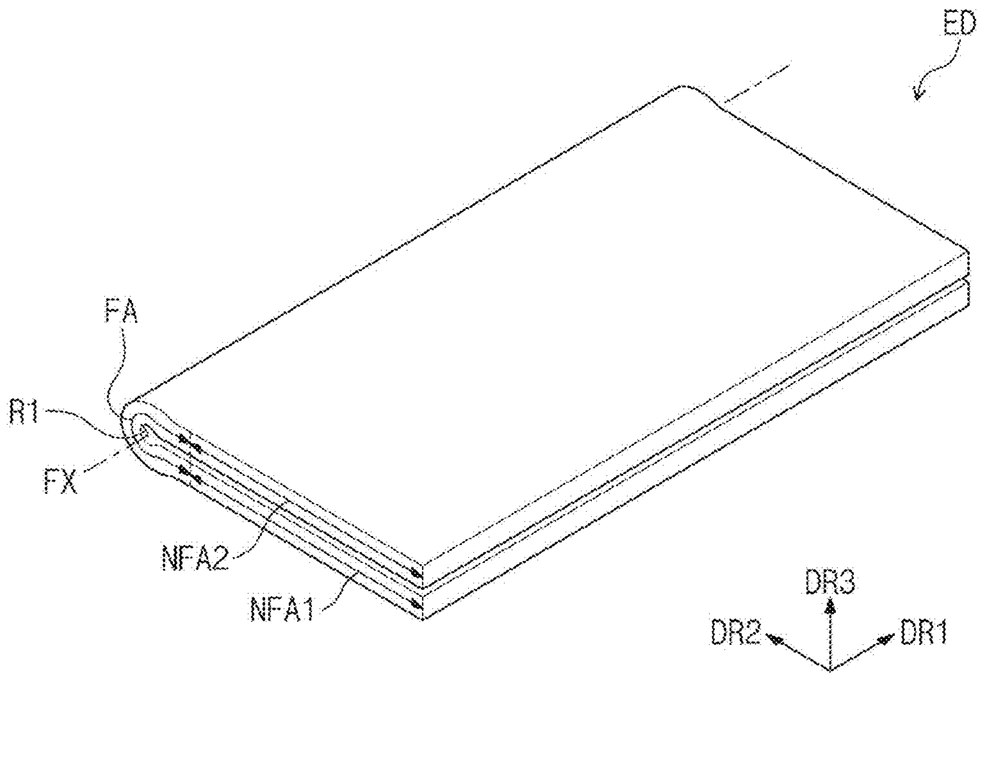

FIGS. 1A to 1C are perspective views of an electronic device ED according to an embodiment of the present disclosure. FIG. 1A illustrates an unfolded state of the electronic device ED, and FIGS. 1B and 1C illustrate a folded state of the electronic device ED.

Referring to FIGS. 1A to 1C, the electronic device ED according to an embodiment of the present disclosure may include a display surface DS defined by a first direction DR1 and a second direction DR2 crossing the first direction DR1. The electronic device ED may provide an image IM to a user through the display surface DS.

The display surface DS may include a display region DA and a non-display region NDA around the display region DA. In an embodiment, the non-display region NDA may surround the display region DA. The display region DA may display the image IM, and the non-display region NDA may not display the image IM. It is illustrated that the non-display region NDA may surround the display region DA, however, without being limited thereto, the shape of the display region DA and the shape of the non-display region NDA may be modified.

Hereinafter, a direction substantially perpendicular to a plane defined by the first direction DR1 and the second direction DR2 is defined as a third direction DR3. The third direction DR3 is the basis of the distinction between front surfaces and rear surfaces of members. The expression "when viewed from above the plane" or "when viewed in a plan view" used herein may mean that it is viewed in the third direction DR3. Hereinafter, the first to third directions DR1, DR2, and DR3 are directions indicated by first to third directional axes, respectively, and are assigned with the same reference numerals as those of the first to third directional axes.

The electronic device ED may include a folding region FA and a plurality of non-folding regions NFA1 and NFA2. The non-folding regions NFA1 and NFA2 may include the first non-folding region NFA1 and the second non-folding region NFA2. The folding region FA may be disposed between the first non-folding region NFA1 and the second non-folding region NFA2 in the second direction DR2. In this embodiment, the foldable electronic device ED is illustrated as an example. However, the present disclosure is not limited thereto. The electronic device ED may be a bar-type electronic device, a rollable electronic device, or a slidable electronic device.

The electronic device ED may sense an input of a stylus pen STP and an input by the user's body FG. A finger is illustrated as an example of the user's body FG. The electronic device ED may sense an input of the user's body FG during a first mode period and an input of the stylus pen STP during a second mode period through time division driving.

As illustrated in FIG. 1B, the folding region FA may be folded along a folding axis FX that is parallel to the first direction DR1. The folding region FA has a certain curvature and a radius of curvature R1. The electronic device ED may be folded in an in-folding manner such that the first non-folding region NFA1 and the second non-folding region NFA2 face each other and the display surface DS is not exposed to the outside.

In an embodiment of the present disclosure, the electronic device ED may be folded in an out-folding manner such that the display surface DS is exposed to the outside. In an embodiment of the present disclosure, the electronic device ED may be configured such that an in-folding operation and an out-folding operation are repeatedly performed in an unfolded state. However, the present disclosure is not limited thereto. In an embodiment of the present disclosure, the electronic device ED may be configured to select one of an unfolding operation, an in-folding operation, and an out-folding operation.

As illustrated in FIG. 1B, the distance between the first non-folding region NFA1 and the second non-folding region NFA2 may be substantially the same as twice the radius of curvature R1. However, as illustrated in FIG. 1C, the distance between the first non-folding region NFA1 and the second non-folding region NFA2 may be smaller than twice the radius of curvature R1. FIGS. 1B and 1C are illustrated based on the display surface DS, and a housing HM (refer to FIG. 2) that form the exterior of the electronic device ED may contact distal end regions of the first non-folding region NFA1 and the second non-folding region NFA2.

Figure 2:
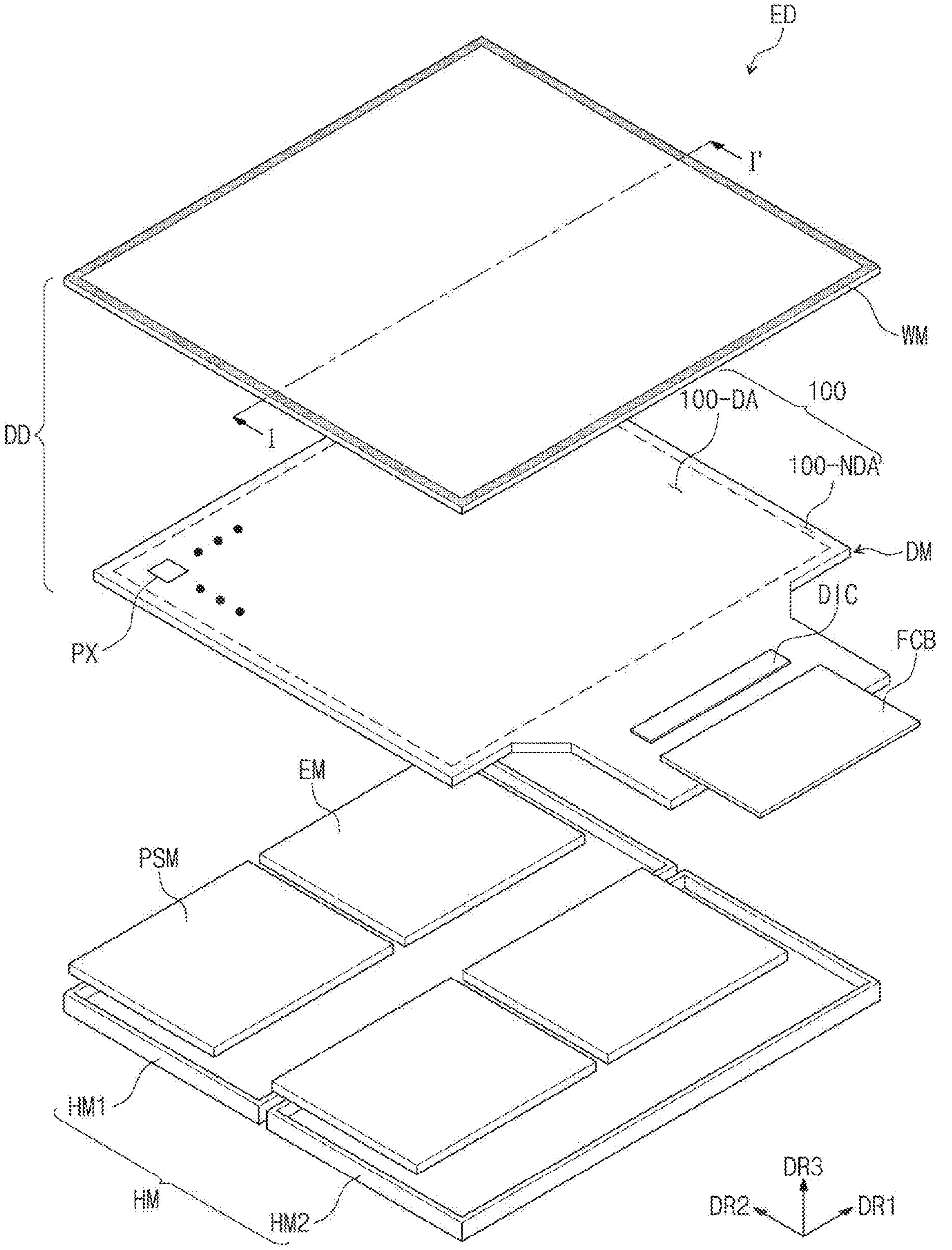
FIG. 2 is an exploded perspective view of an electronic device according to an embodiment of the present disclosure.

FIG. 2 is an exploded perspective view of the electronic device ED according to an embodiment of the present disclosure.

As illustrated in FIG. 2, the electronic device ED may include a display device DD, electronic modules EM, power supply modules PSM, and the housing HM. Although not separately illustrated, the electronic device ED may further include a mechanical structure for controlling a folding operation of the display device DD. In FIG. 2, adhesive layers that couple components with each other are not illustrated.

The display device DD generates an image and senses an external input. The display device DD includes a window WM and a display module DM. The window WM provides the front surface of the electronic device ED. The display device DD may further include additional components between the window WM and the display module DM, or may further include additional components under the display module DM.

The display module DM may include at least a display panel 100. Although only the display panel 100 among stacked structures of the display module DM is illustrated in FIG. 2, the display module DM may further include a plurality of components disposed on the display panel 100. Detailed description of a stack structure of the display module DM will be given below.

The display panel 100 is not particularly limited and may be, for example, an emissive display panel such as an organic light emitting display panel and an inorganic light emitting display panel.

The display panel 100 includes a display region 100-DA and a non-display region 100-NDA that correspond to the display region DA (refer to FIG. 1A) and the non-display region NDA (refer to FIG. 1A) of the electronic device ED. Pixels PX are disposed in the display region 100-DA. The pixels PX are not disposed in the non-display region 100-NDA, and signal lines for providing voltages to the pixels PX are disposed in the non-display region 100-NDA. The expression "one region/portion corresponds to another region/portion" used herein means that the regions/portions overlap each other and is not limited to having the same area.

As illustrated in FIG. 2, a driver IC DIC may be disposed on the non-display region 100-NDA of the display panel 100. A flexible circuit board FCB may be coupled to the non-display region 100-NDA of the display panel 100. The flexible circuit board FCB may be connected to a main circuit board. The main circuit board may be one electronic part constituting the electronic modules EM. The electronic modules EM may further include a control module (e.g., an application processor), a wireless communication module, an image input module, and the like. Meanwhile, unlike in FIG. 2, a portion of the flexible circuit board FCB may be disposed under the display panel 100. In the electronic device ED of one embodiment, a portion of the flexible circuit board FCB may be disposed under the display panel 100 as a portion of the display module DM or a portion of the flexible circuit board FCB is bent.

The driver IC DIC may include drive elements (e.g., a data drive circuit) for driving the pixels PX of the display panel 100. Although FIG. 2 illustrates the structure in which the driver IC DIC is mounted on the display panel 100, the present disclosure is not limited thereto. For example, the driver IC DIC may be mounted on the flexible circuit board FCB.

Referring to FIG. 2, the electronic modules EM may be disposed in a first housing HM1 and a second housing HM2, respectively, and the power supply modules PSM may be disposed in the first housing HM1 and the second housing HM2, respectively. Although not illustrated, the electronic module EM disposed in the first housing HM1 and the electronic module EM disposed in the second housing HM2 may be electrically connected with each other through a flexible circuit board. The housings HM1 and HM2 are coupled with the display device DD to accommodate other modules. For example, the housings HM1 and HM2 may be coupled to the window WM of the display device DD and accommodate the other modules. Although the housing HM are illustrated as including the first and second housings HM1 and HM2 separated from each other, the present disclosure is not limited thereto. Although not illustrated, the electronic device ED may further include a hinge structure for connecting the first and second housings HM1 and HM2.

Figure 3:
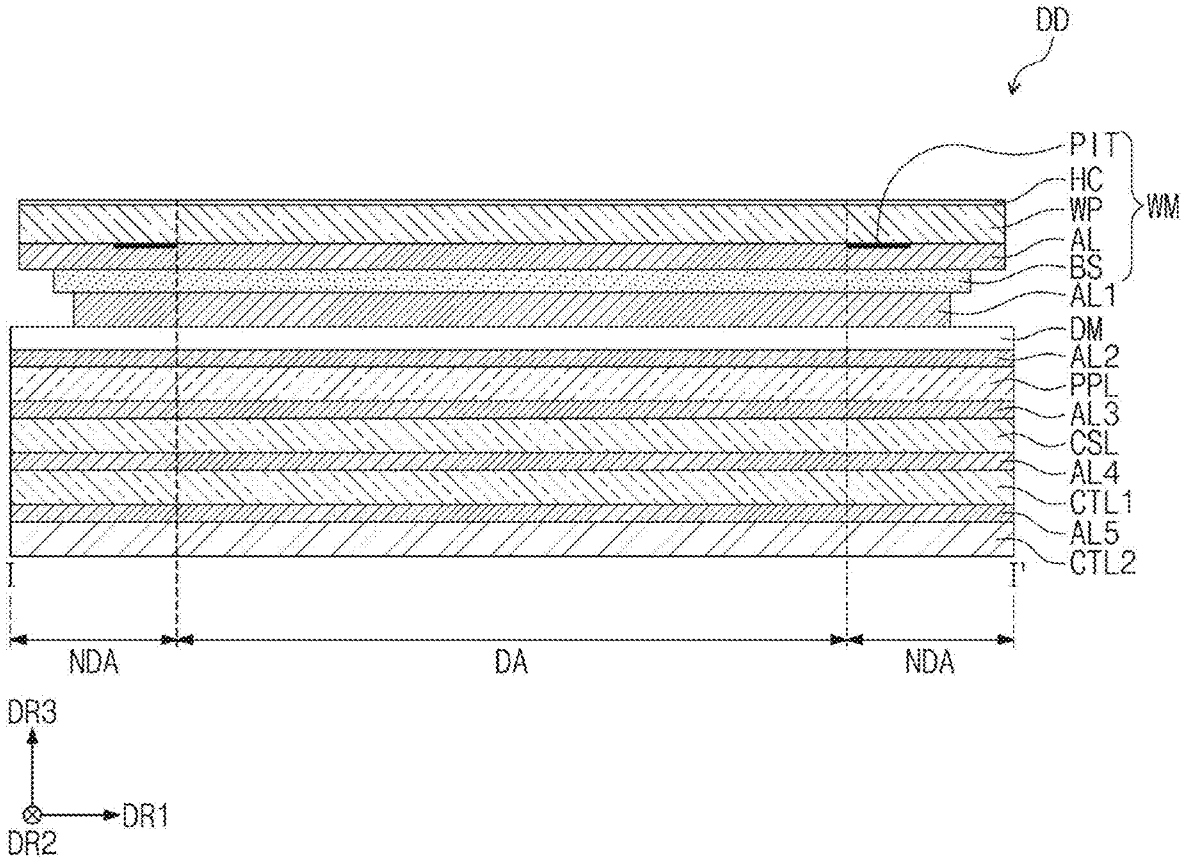
FIG. 3 is a sectional view of a display device according to an embodiment of the present disclosure.

FIG. 3 is a sectional view of the display device according to an embodiment of the present disclosure. FIG. 3 is a sectional view of the display device DD corresponding to line I-I' illustrated in FIG. 2.

Referring to FIG. 3, the display device DD may include the window WM, the display module DM, a panel protection layer PPL, a cushion layer CSL, a first conductive sheet CTL1, a second conductive sheet CTL2, and first to fifth adhesive layers AL1 to AL5. Each of the first to fifth adhesive layers AL1 to AL5 couples two components stacked adjacent to each other among the components. The first to fifth adhesive layers AL1 to AL5 may include a pressure sensitive adhesive (PSA) or an optically clear adhesive (OCA). However, the types of adhesive layers are not limited thereto.

The window WM provides the outer surface of the display device DD. The window WM may include a base layer BS, a window protection layer WP, a hard coating layer HC, and a printed layer PIT (or, a black matrix layer). The base layer BS may have a property of being optically clear. The base layer BS may include or may be formed of glass or a synthetic resin film. The window protection layer WP is attached to the base layer BS through an adhesive layer AL. The window protection layer WP may include or may be formed of a flexible plastic material such as polyimide and polyethylene terephthalate. The hard coating layer HC may be disposed on the upper surface of the window protection layer WP.

The printed layer PIT may be disposed on the lower surface of the window protection layer WP. The printed layer PIT may be a black matrix layer. The printed layer PIT may be black in color. However, the color of the printed layer PIT is not limited thereto. The printed layer PIT may be adjacent to the periphery of the window protection layer WP. The printed layer PIT may overlap the non-display region NDA. However, a stacked structure of the window WM is not necessarily limited to the above-described structure.

The panel protection layer PPL may be disposed under the display module DM. The panel protection layer PPL may protect the bottom of the display module DM. The panel protection layer PPL may include or may be formed of a flexible plastic material. For example, the panel protection layer PPL may include or may be formed of polyethylene terephthalate (PET). In an embodiment of the present disclosure, the panel protection layer PPL may be omitted.

The cushion layer CSL is disposed under the panel protection layer PPL. The cushion layer CSL absorbs external impact. The cushion layer CSL may include or may be formed of foamed plastic. In an embodiment of the present disclosure, the cushion layer CSL may be omitted.

The first conductive sheet CTL1 may be disposed under the cushion layer CSL. The first conductive sheet CTL1 may include or may be formed of a material having a high magnetic permeability. The first conductive sheet CTL1 may include or may be formed of a ferromagnetic material. For example, the first conductive sheet CTL1 may include or may be a magnetic metal powder layer. The magnetic metal powder layer may include a base resin and magnetic metal powders mixed in the base resin. In an embodiment of the present disclosure, the first conductive sheet CTL1 may be omitted.

The second conductive sheet CTL2 may be disposed under the first conductive sheet CTL1. The second conductive sheet CTL2 may block electromagnetic waves generated from the electronic modules EM of FIG. 2 to prevent the electromagnetic waves from interfering with the display module DM. The second conductive sheet CTL2 may include or may be formed of a diamagnetic material. In addition, the second conductive sheet CTL2 may radiate heat generated from the display module DM (e.g., the driver IC DIC (refer to FIG. 2)).

The second conductive sheet CTL2 may include a metal layer such as copper, aluminum, gold, and titanium. The second conductive sheet CTL2 may include a metal oxide layer such as indium tin oxide (ITO) and indium zinc oxide (IZO). The second conductive sheet CTL2 may include carbon nanotubes, conductive polymer-coated carbon nanotubes, or graphite.

Figure 4:
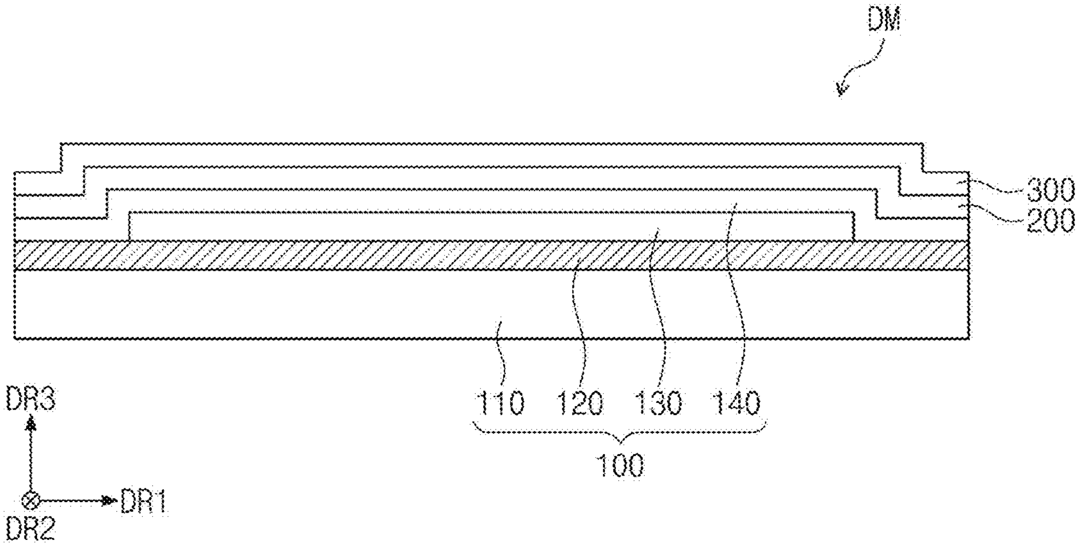
FIG. 4 is a sectional view of a display module according to an embodiment of the present disclosure.

FIG. 4 is a sectional view of the display module DM according to an embodiment of the present disclosure. Referring to FIG. 4, the display module DM may include the display panel 100, an input sensor 200, and an anti-reflector 300.

The display panel 100 may include a base layer 110, a driving element layer 120, a light emitting element layer 130, and an encapsulation layer 140. The base layer 110 may provide a base surface on which the driving element layer 120 is disposed.

The base layer 110 may be a rigid substrate. In an embodiment, the base layer 110 may be a flexible substrate, which can be bent, folded, or rolled.

The base layer 110 has a multi-layer structure. In an embodiment, the base layer 110 may include a plurality of resin layers. The base layer 110 may include the plurality of resin layers and an inorganic layer that is disposed between the plurality of resin layers and that has a single-layer structure or a multi-layer structure. A specific structure of the base layer 110 will be described below.

The driving element layer 120 may be disposed on the base layer 110. The driving element layer 120 may include an insulating layer, a semiconductor pattern, a conductive pattern, and a signal line. The driving element layer 120 includes drive circuits of the pixels PX described with reference to FIG. 2. The light emitting element layer 130 may be disposed on the driving element layer 120. The light emitting element layer 130 may include light emitting elements of the pixels PX described with reference to FIG. 2.

The encapsulation layer 140 may be disposed on the light emitting element layer 130. The encapsulation layer 140 may protect the light emitting element layer 130 from foreign matter such as moisture, oxygen, and dust particles. The encapsulation layer 140 may include at least one inorganic layer. The encapsulation layer 140 may include a stacked structure of an inorganic layer/an organic layer/an inorganic layer.

The input sensor 200 may be disposed on the display panel 100. The input sensor 200 may sense an input of the stylus pen STP (e.g., a resonance signal transmitted from the stylus pen STP) and an input by the user's body FG illustrated in FIG. 1A. The input sensor 200 may be formed on the display panel 100 through a continuous process. In an embodiment, the continuous process may refer to two or more processes that is performed on the display panel 100 in a multi-chamber system without being exposed to an atmospheric air environment. In this case, the input sensor 200 may be directly disposed on the display panel 100. The input sensor 200 may be directly disposed on the encapsulation layer 140. As used herein, the expression "component A is directly disposed on component B" means that an adhesive layer is not disposed between component A and component B.

The anti-reflector 300 may be disposed on the input sensor 200. The anti-reflector 300 may decrease the reflectance of external light. The anti-reflector 300 may be directly disposed on the input sensor 200 through a continuous process.

The anti-reflector 300 may include color filters. The color filters have colors corresponding to the colors of source light. For example, a red color filter is disposed on a light emitting element that generates red light. The anti-reflector 300 may further include a light blocking pattern disposed between the color filters.

Figure 5:
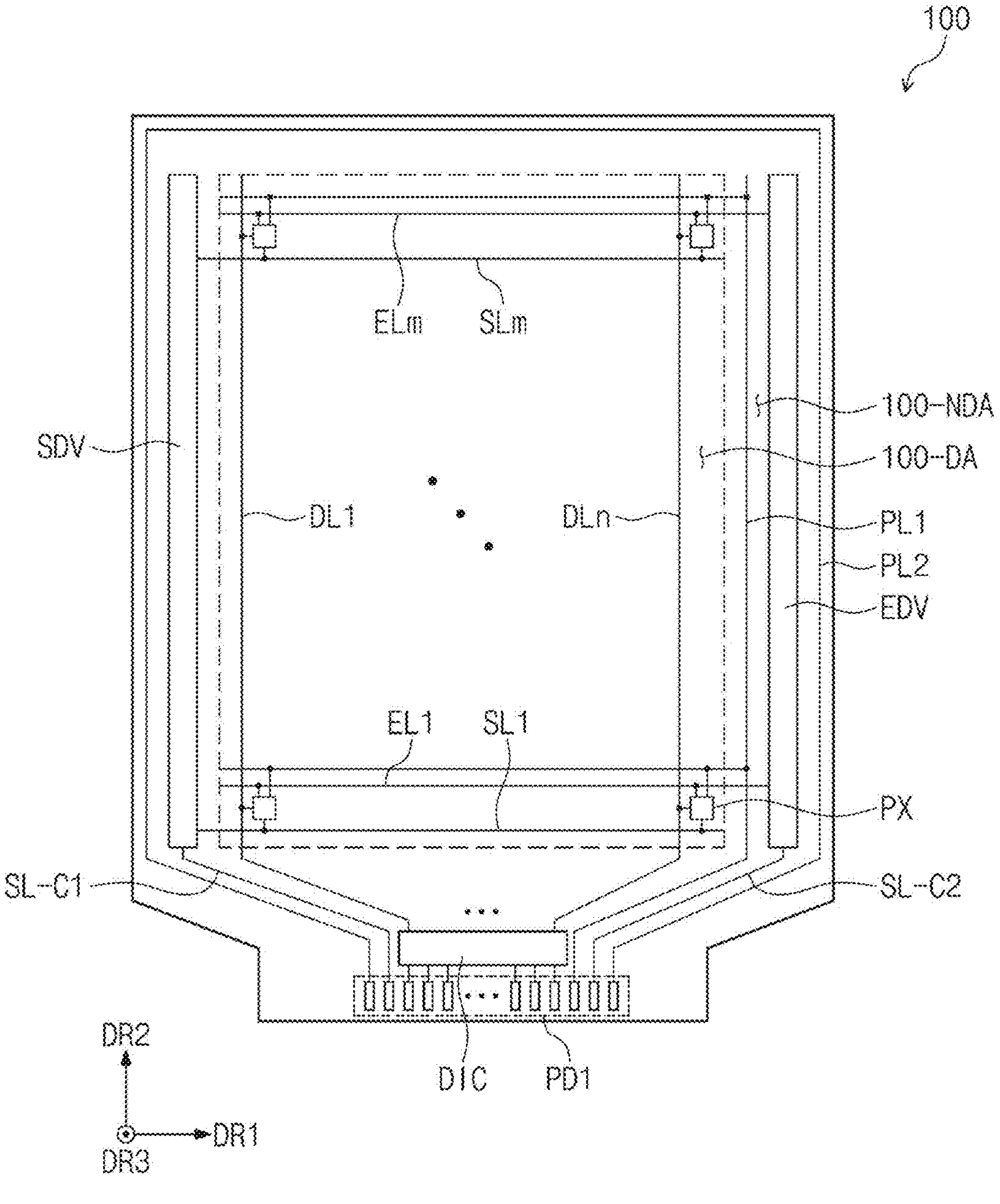
FIG. 5 is a plan view of a display panel according to an embodiment of the present disclosure.

FIG. 5 is a plan view of the display panel 100 according to an embodiment of the present disclosure.

Referring to FIG. 5, the display panel 100 may include the plurality of pixels PX, a scan drive circuit SDV, an emission drive circuit EDV, a plurality of signal lines, and a plurality of first pads PD1. The driver IC DIC mounted on the non-display region 100-NDA may include a data drive circuit. In an embodiment of the present disclosure, the data drive circuit may be integrated into the display panel 100 like the scan drive circuit SDV and the emission drive circuit EDV.

The plurality of signal lines may include a plurality of scan lines SL1 to SLm, a plurality of data lines DL1 to DLn, a plurality of emission lines EL1 to ELm, first and second control lines SL-C1 and SL-C2, and first and second power lines PL1 and PL2. Here, "m" and "n" are natural numbers of 2 or larger.

The scan lines SL1 to SLm may extend in the first direction DR1 and may be connected to the pixels PX and the scan drive circuit SDV. The data lines DL1 to DLn may extend in the second direction DR2 and may be connected to the pixels PX and the driver IC DIC. The emission lines EL1 to ELm may extend in the first direction DR1 and may be connected to the pixels PX and the emission drive circuit EDV.

The first power line PL1 receives a first power voltage, and the second power line PL2 receives a second power voltage having a lower level than the first power voltage. In an embodiment, the second power voltage may be a ground level voltage. Although not illustrated, second electrodes (that is, cathodes) of the light emitting elements are connected to the second power line PL2.

The first control line SL-C1 may be connected to the scan drive circuit SDV and may extend toward a lower end of the display panel 100. The second control line SL-C2 may be connected to the emission drive circuit EDV and may extend toward the lower end of the display panel 100. The first pads PD1 may be disposed in the non-display region 100-NDA adjacent to the lower end of the display panel 100 and may be closer to the lower end of the display panel 100 than the driver IC DIC. The first pads PD1 may be connected to the driver IC DIC and some of the signal lines.

The scan drive circuit SDV may generate a plurality of scan signals, and the scan signals may be applied to the pixels PX through the scan lines SL1 to SLm. The driver IC DIC may generate a plurality of data voltages, and the data voltages may be applied to the pixels PX through the data lines DL1 to DLn. The emission drive circuit EDV may generate a plurality of emission signals, and the emission signals may be applied to the pixels PX through the emission lines EL1 to ELm.

The pixels PX may receive the data voltages in response to the scan signals. The pixels PX may display an image by emitting light having luminance corresponding to the data voltages in response to the emission signals.

Figure 6:
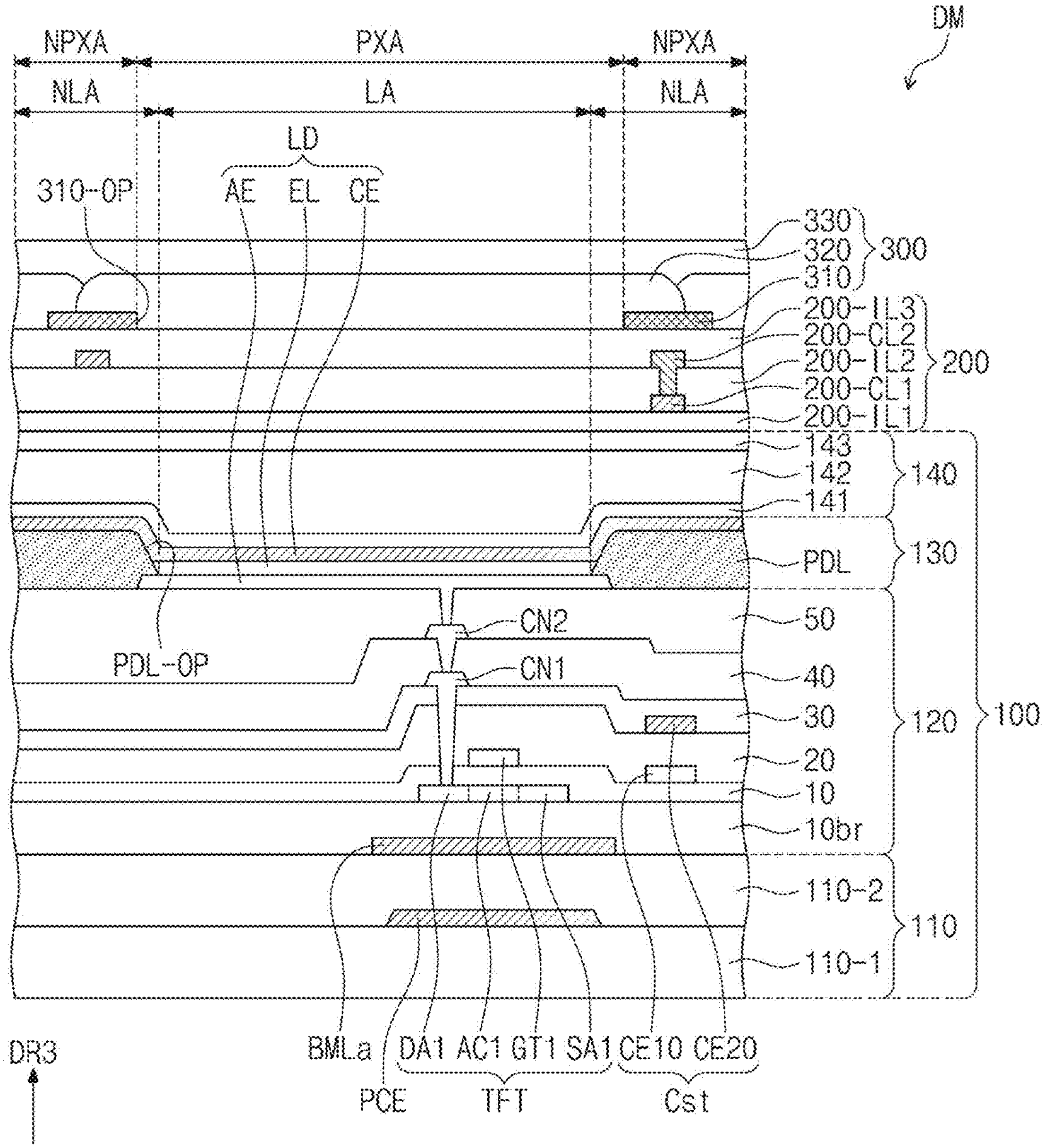
FIG. 6 is an enlarged sectional view of a display module according to an embodiment of the present disclosure.

FIG. 6 is an enlarged sectional view of the display module DM according to an embodiment of the present disclosure.

In FIG. 6, a section corresponding to one emissive region LA and a non-emissive region NLA around the one emissive region LA is illustrated. In FIG. 6, a light emitting element LD included in one pixel PX and a transistor TFT connected to the light emitting element LD are illustrated. The transistor TFT may be one of a plurality of transistors included in a drive circuit of the pixel PX. In this embodiment, the transistor TFT is described as a silicon transistor. However, the transistor TFT may be a metal oxide transistor.

The base layer 110 has a multi-layer structure. In an embodiment, the base layer 110 may include a plurality of resin layers. In an embodiment, the base layer 110 may further include an inorganic layer that is disposed between the plurality of resin layers. In an embodiment, the base layer 110 may be a single-layer structure.

The base layer 110 may be a multi-layer structure that includes a first resin layer 110-1 and a second resin layer 110-2. The second resin layer 110-2 may be disposed on the first resin layer 110-1. Each of the first resin layer 110-1 and the second resin layer 110-2 may include or may be formed of a polymer resin. Each of the first resin layer 110-1 and the second resin layer 110-2 may include or may be formed of, for example, an acrylic resin, a methacrylic resin, a polyisoprene resin, a vinyl resin, an epoxy resin, a urethane-based resin, a cellulosic resin, a siloxane-based resin, a polyimide resin, a polyamide resin, or a perylene-based resin. Each of the first resin layer 110-1 and the second resin layer 110-2 may include or may be formed of polyimide.

Although not illustrated, the base layer 110 may further include an inorganic layer that is disposed between the first resin layer 110-1 and the second resin layer 110-2. The inorganic layer may include or may be formed of, for example, silicon oxide, silicon nitride, or silicon oxy nitride. In an embodiment, the base layer 110 may be a single-layer structure.

In an embodiment, the display panel 100 includes a charging electrode PCE. The charging electrode PCE is disposed under at least one of the plurality of resin layers 110-1 and 110-2 included in the base layer 110. As illustrated in FIG. 6, the charging electrode PCE may be disposed under the second resin layer 110-2. The charging electrode PCE may be disposed on the first resin layer 110-1 and may be covered by the second resin layer 110-2. Meanwhile, when the base layer 110 includes an inorganic layer that is disposed between the first resin layer 110-1 and the second resin layer 110-2, the charging electrode PCE may be disposed on the inorganic layer.

The charging electrode PCE charges a resonance circuit of the stylus pen STP (refer to FIG. 1A) during a charging period. The charging electrode PCE may generate a magnetic field by forming a coil-shaped current path through a constant voltage applied from the outside, and the resonance circuit of the stylus pen STP (refer to FIG. 1A) may be charged by receiving the generated magnetic field. Description thereabout will be given below.

Referring to FIGS. 5 and 6, the charging electrode PCE overlaps the display region 100-DA when viewed from above the plane. The charging electrode PCE, when viewed from above the plane, may overlap the pixels PX disposed in the display region 100-DA. At least a portion of the charging electrode PCE may overlap the light emitting element LD when viewed from above the plane. For example, at least a portion of the charging electrode PCE may overlap the emissive region LA. Since the charging electrode PCE is disposed under the driving element layer 120 and the light emitting element layer 130, the charging electrode PCE may not deteriorate the emission efficiency of the light emitting element LD even though the charging electrode PCE overlaps the emissive region LA, unlike conductive pattern layers 200-CL1 and 200-CL2 of the input sensor 200 that will be described below.

The charging electrode PCE may have a single-layer structure, or may have a multi-layer structure stacked in the third direction DR3. A conductive pattern having a multi-layer structure may include at least one metal layer. The multi-layered conductive pattern may further include a transparent conductive layer. The multi-layered conductive pattern may include metal layers containing different metals. The transparent conductive layer may include indium tin oxide (ITO), indium zinc oxide (IZO), zinc oxide (ZnO), indium tin zinc oxide (ITZO), PEDOT, metal nano-wire, or graphene. The metal layers may include or may be formed of molybdenum, silver, titanium, copper, aluminum, or an alloy thereof.

A buffer layer 10*br* may be disposed on the base layer 110. The buffer layer 10*br* may prevent diffusion of metal atoms or impurities from the base layer 110 to a semiconductor pattern on the upper side of the buffer layer 10*br*. The semiconductor pattern includes an active region AC1 of the transistor TFT.

A shielding pattern BMLa may be disposed under the transistor TFT. The shielding pattern BMLa may block external light from reaching the transistor TFT. The shielding pattern BMLa may be disposed between the base layer 110 and the buffer layer 10*br*. In an embodiment of the present disclosure, an inorganic barrier layer may be additionally disposed between the shielding pattern BMLa and the buffer layer 10*br*. The shielding pattern BMLa may be connected with an electrode or a line and may receive a constant voltage or a signal from the electrode or the line.

The shielding pattern BMLa may overlap the charging electrode PCE when viewed from above the plane. The shielding pattern BMLa may be disposed on the second resin layer 110-2 and may be disposed to entirely overlap the charging electrode PCE when viewed from above the plane. In an embodiment, the shielding pattern BMLa may be disposed on an uppermost resin layer of the base layer 110. In an embodiment, the shielding pattern BMLa may be disposed in a space between the charging electrode PCE and the transistor TFT. For example, the shielding pattern BMLa may be disposed to cover the top of the charging electrode PCE. However, without being limited thereto, the shielding pattern BMLa may be disposed to overlap only a portion of the charging electrode PCE. The shielding pattern BMLa may be disposed over the charging electrode PCE and may prevent parasitic capacitance generated by the charging electrode PCE from deteriorating characteristics of the semiconductor pattern, a conductive pattern, and a signal line included in the driving element layer 120. A specific arrangement of the shielding pattern BMLa and the shape thereof will be described below.

The semiconductor pattern may be disposed on the buffer layer 10*br*. The semiconductor pattern may include or may be formed of a silicon semiconductor material. For example, the silicon semiconductor material may include or may be formed of amorphous silicon or polycrystalline silicon. For example, the semiconductor pattern may include or may be formed of low-temperature poly silicon.

The semiconductor pattern may include a first region having a high conductivity and a second region having a low conductivity. The first region may be doped with an N-type dopant or a P-type dopant. A P-type transistor may include a doped region that is doped with a P-type dopant, and an N-type transistor may include a doped region that is doped with an N-type dopant. The second region may be an un-doped region, or may be a region more lightly doped than the first region.

The conductivity of the first region may be higher than the conductivity of the second region, and the first region may serve as an electrode or a signal line. The second region may correspond to the active region (or, channel) of the transistor. In other words, one portion of the semiconductor pattern may be the active region of the transistor, another portion may be a source or drain of the transistor, and another portion may be a connecting electrode or a connecting signal line.

The source region (or, the source) SA1, the active region (or, the channel) AC1, and the drain region (or, the drain) DAI of the transistor TFT may be formed from the semiconductor pattern. The source region SA1 and the drain region DAI may extend from the active region AC1 in opposite directions in the sectional view of the transistor TFT.

A first insulating layer 10 may be disposed on the buffer layer 10*br*. The first insulating layer 10 may commonly overlap the plurality of pixels PX (refer to FIG. 2) and may cover the semiconductor pattern. The first insulating layer 10 may include an inorganic layer and/or an organic layer and may have a single-layer structure or a multi-layer structure. The inorganic layer may include at least one of aluminum oxide, titanium oxide, silicon oxide, silicon nitride, silicon oxy nitride, zirconium oxide, and hafnium oxide. In this embodiment, the first insulating layer 10 may be a single silicon oxide layer. Not only the first insulating layer 10 but also insulating layers of the driving element layer 120 that will be described below may be inorganic layers and/or organic layers and may have a single-layer structure or a multi-layer structure. The inorganic layers may include at least one of the aforementioned materials, but are not limited thereto.

A gate GT1 of the transistor TFT is disposed on the first insulating layer 10. The gate GT1 may be a portion of a metal pattern. The gate GT1 overlaps the active region AC1. The gate GT1 may function as a mask in a process of doping the semiconductor pattern. The gate GT1 may include or may be formed of titanium (Ti), silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), indium tin oxide (ITO), or indium zinc oxide (IZO), but is not particularly limited thereto.

A second insulating layer 20 may be disposed on the first insulating layer 10 and may cover the gate GT1. A third insulating layer 30 may be disposed on the second insulating layer 20. A second electrode CE20 of a storage capacitor Cst may be disposed between the second insulating layer 20 and the third insulating layer 30. Furthermore, a first electrode CE10 of the storage capacitor Cst may be disposed between the first insulating layer 10 and the second insulating layer 20.

A first connecting electrode CN1 may be disposed on the third insulating layer 30. The first connecting electrode CN1 may be connected to the drain region DAI of the transistor TFT through a contact hole penetrating the first to third insulating layers 10, 20, and 30.

A fourth insulating layer 40 may be disposed on the third insulating layer 30. A second connecting electrode CN2 may be disposed on the fourth insulating layer 40. The second connecting electrode CN2 may be connected to the first connecting electrode CN1 through a contact hole penetrating the fourth insulating layer 40. A fifth insulating layer 50 may be disposed on the fourth insulating layer 40 and may cover the second connecting electrode CN2. The stacked structure of the first to fifth insulating layers 10, 20, 30, 40, and 50 is merely illustrative, and an additional conductive layer and an additional insulating layer may be further disposed in addition to the first to fifth insulating layers 10, 20, 30, 40, and 50.

The fourth insulating layer 40 and the fifth insulating layer 50 may be organic layers. For example, the organic layers may include a general purpose polymer, such as benzocyclobutene (BCB), polyimide, hexamethyldisiloxane (HMDSO), Polymethylmethacrylate (PMMA), and Polystyrene (PS), a polymer derivative having a phenolic group, an acrylate-based polymer, an imide-based polymer, an aryl ether-based polymer, an amide-based polymer, a fluorine-based polymer, a p-xylene-based polymer, a vinyl alcohol-based polymer, or a blend thereof.

The light emitting element LD may include a first electrode (or, a pixel electrode) AE, an emissive layer EL, and a second electrode (or, a common electrode) CE. The first electrode AE may be disposed on the fifth insulating layer 50. The first electrode AE may be a semi-transparent electrode, a transparent electrode, or a reflective electrode. The first electrode AE may include or may be a reflective layer formed of Ag, Mg, Cu, Al, Pt, Pd, Au, Ni, Nd, Ir, Cr, Li, Ca, Mo, Ti, Yb, W, or a compound or mixture thereof (e.g., AgMg, AgYb, or MgAg) or a material with a multilayer structure such as LiF/Ca or LiF/Al and a transparent or translucent electrode layer formed on the reflective layer. The transparent or translucent electrode layer may include or may be formed of at least one selected from the group consisting of indium tin oxide (ITO), indium zinc oxide (IZO), indium gallium zinc oxide (IGZO), zinc oxide ($ZnO_x$), indium oxide ($In_2O_3$), and aluminum-doped zinc oxide (AZO). For example, the first electrode AE may include or may be a stacked structure of ITO/Ag/ITO.

A pixel defining layer PDL may be disposed on the fifth insulating layer 50. According to an embodiment, the pixel defining layer PDL may include or may be formed of a material absorbing light. For example, the pixel defining layer PDL may be black in color. For example, the pixel defining layer PDL may include or may be formed of a black coloring agent. The black coloring agent may include a black dye or a black pigment. The black coloring agent may include carbon black, metal such as chromium, or oxide thereof. The pixel defining layer PDL may correspond to a light blocking pattern having light blocking characteristics.

The pixel defining layer PDL may cover a portion of the first electrode AE (e.g., the anode). In an embodiment, the pixel defining layer PDL may cover an edge portion of the first electrode AE. For example, the pixel defining layer PDL may have an opening PDL-OP that exposes a portion of the first electrode AE. The opening PDL-OP of the pixel defining layer PDL may define the emissive region LA.

The pixel defining layer PDL may increase the distance between the edge of the first electrode AE and the second electrode CE (e.g., the cathode). Accordingly, the pixel defining layer PDL may serve to prevent an arc from occurring at the edge of the first electrode AE.

Although not illustrated, a hole control layer may be disposed between the first electrode AE and the emissive layer EL. The hole control layer may include a hole transport layer. In an embodiment, the hole control layer may further include a hole injection layer. An electron control layer may be disposed between the emissive layer EL and the second electrode CE. The electron control layer may include an electron transport layer. In an embodiment, the electron control layer may further include an electron injection layer.

The encapsulation layer 140 may be disposed on the light emitting element layer 130. The encapsulation layer 140 may include an inorganic layer 141, an organic layer 142, and an inorganic layer 143 sequentially stacked one above another. However, layers constituting the encapsulation layer 140 are not limited thereto.

The inorganic layers 141 and 143 may protect the light emitting element layer 130 from moisture and oxygen, and the organic layer 142 may protect the light emitting element layer 130 from foreign matter such as dust particles. The inorganic layers 141 and 143 may include or may be formed of a silicon nitride layer, a silicon oxy nitride layer, a silicon oxide layer, a titanium oxide layer, or an aluminum oxide layer. The organic layer 142 may include or may be formed of an acrylic organic layer, but is not limited thereto.

The input sensor 200 may be disposed on the display panel 100. The input sensor 200 may include a first insulating layer 200-IL1, the first conductive pattern layer 200-CL1, a second insulating layer 200-IL2, the second conductive pattern layer 200-CL2, and a third insulating layer 200-IL3. The first insulating layer 200-IL1 may be directly disposed on the encapsulation layer 140.

In an embodiment of the present disclosure, the first insulating layer 200-IL1 and/or the third insulating layer 200-IL3 may be omitted. When the first insulating layer 200-IL1 is omitted, the first conductive pattern layer 200-CL1 may be disposed on the uppermost insulating layer of the encapsulation layer 140. The third insulating layer 200-IL3 may be replaced with an adhesive layer or an insulating layer of the anti-reflector 300 disposed on the input sensor 200.

The first conductive pattern layer 200-CL1 may include first conductive patterns, and the second conductive pattern layer 200-CL2 may include second conductive patterns. The first conductive pattern layer 200-CL1 is disposed on the first insulating layer 200-IL1. The second conductive pattern layer 200-CL2 is disposed on the second insulating layer 200-IL2. Hereinafter, the first conductive pattern layer 200-CL1 and the first conductive patterns are referred to by the same reference numeral, and the second conductive pattern layer 200-CL2 and the second conductive patterns are referred to by the same reference numeral. Meanwhile, the first conductive patterns 200-CL1 and the second conductive patterns 200-CL2 may correspond to sensing electrodes which will be described below.

Each of the first conductive patterns 200-CL1 and the second conductive patterns 200-CL2 may have a single-layer structure, or may have a multi-layer structure stacked in the third direction DR3. A conductive pattern having a multi-layer structure may include at least two of transparent conductive layers and metal layers. The multi-layered conductive pattern may include metal layers containing different metals. The transparent conductive layers may include indium tin oxide (ITO), indium zinc oxide (IZO), zinc oxide (ZnO), indium tin zinc oxide (ITZO), PEDOT, metal nanowire, or graphene. The metal layers may include molybdenum, silver, titanium, copper, aluminum, or an alloy thereof.

Each of the first conductive patterns 200-CL1 and the second conductive patterns 200-CL2 may have a thickness selected from a range of 0.1 μm to 1 μm. When each of the first conductive patterns 200-CL1 and the second conductive patterns 200-CL2 has a thickness of less than 0.1 μm, the wiring resistance may be increased, and therefore the input sensing performance of the input sensor 200 may be decreased. When each of the first conductive patterns 200-CL1 and the second conductive patterns 200-CL2 has a thickness of more than 1 μm, the input sensor 200 may increase the total thickness of the electronic device ED (refer to FIG. 1A) to the extent that folding characteristics of the electronic device ED may be deteriorated.

In this embodiment, each of the first to third insulating layers 200-IL1, 200-IL2, and 200-IL3 may include an inorganic layer or an organic layer. In this embodiment, the first to third insulating layers 200-IL1, 200-IL2, and 200-IL3 may include inorganic layers. The inorganic layers may include silicon oxide, silicon nitride, or silicon oxy nitride.

In an embodiment of the present disclosure, at least one of the first to third insulating layers 200-IL1, 200-IL2, and 200-IL3 may be an organic layer. For example, the third insulating layer 200-IL3 may include or may be an organic layer. The organic layer may include at least one of an acrylic resin, a methacrylic resin, a polyisoprene resin, a vinyl resin, an epoxy resin, a urethane-based resin, a cellulosic resin, a siloxane-based resin, a polyimide resin, a polyamide resin, and a perylene-based resin.

The anti-reflector 300 may be disposed on the input sensor 200. The anti-reflector 300 may include a light blocking pattern 310, a color filter 320, and a planarization layer 330. In an embodiment of the present disclosure, the light blocking pattern 310 may be omitted.

A material constituting the light blocking pattern 310 is not particularly limited as long as it is a material capable of absorbing light. The light blocking pattern 310 may be a layer having a black color. In an embodiment, the light blocking pattern 310 may include or may be formed of a black coloring agent. The black coloring agent may include a black dye or a black pigment. The black coloring agent may include carbon black, metal such as chromium, or oxide thereof.

The light blocking pattern 310 may overlap the first conductive patterns 200-CL1 and the second conductive patterns 200-CL2 when viewed from above the plane. The light blocking pattern 310 may prevent reflection of external light by the first conductive patterns 200-CL1 and the second conductive patterns 200-CL2. The light blocking pattern 310 may have an opening 310-OP defined therein. The opening 310-OP of the light blocking pattern 310 may overlap the first electrode AE and may have a larger area than the opening PDL-OP of the pixel defining layer PDL. The opening 310-OP of the light blocking pattern 310 may define a pixel region PXA. The pixel region PXA may be defined as a region through which light generated by the light emitting element LD is emitted to the outside. As the area of the pixel region PXA is increased, the luminance of an image may be increased.

The color filter 320 may overlap the pixel region PXA. In an embodiment, the color filter 320 may overlap both the pixel region PXA and a non-pixel region NPXA. A portion of the color filter 320 may be disposed on the light blocking pattern 310. The color filter 320 may transmit light generated by the light emitting element LD and may block some wavelength bands of external light. Accordingly, the color filter 320 may decrease reflection of external light by the first electrode AE or the second electrode CE.

The planarization layer 330 may cover the light blocking pattern 310 and the color filter 320. The planarization layer 330 may include or may be formed of an organic material. The planarization layer 330 may provide a flat upper surface.

Figure 7A:
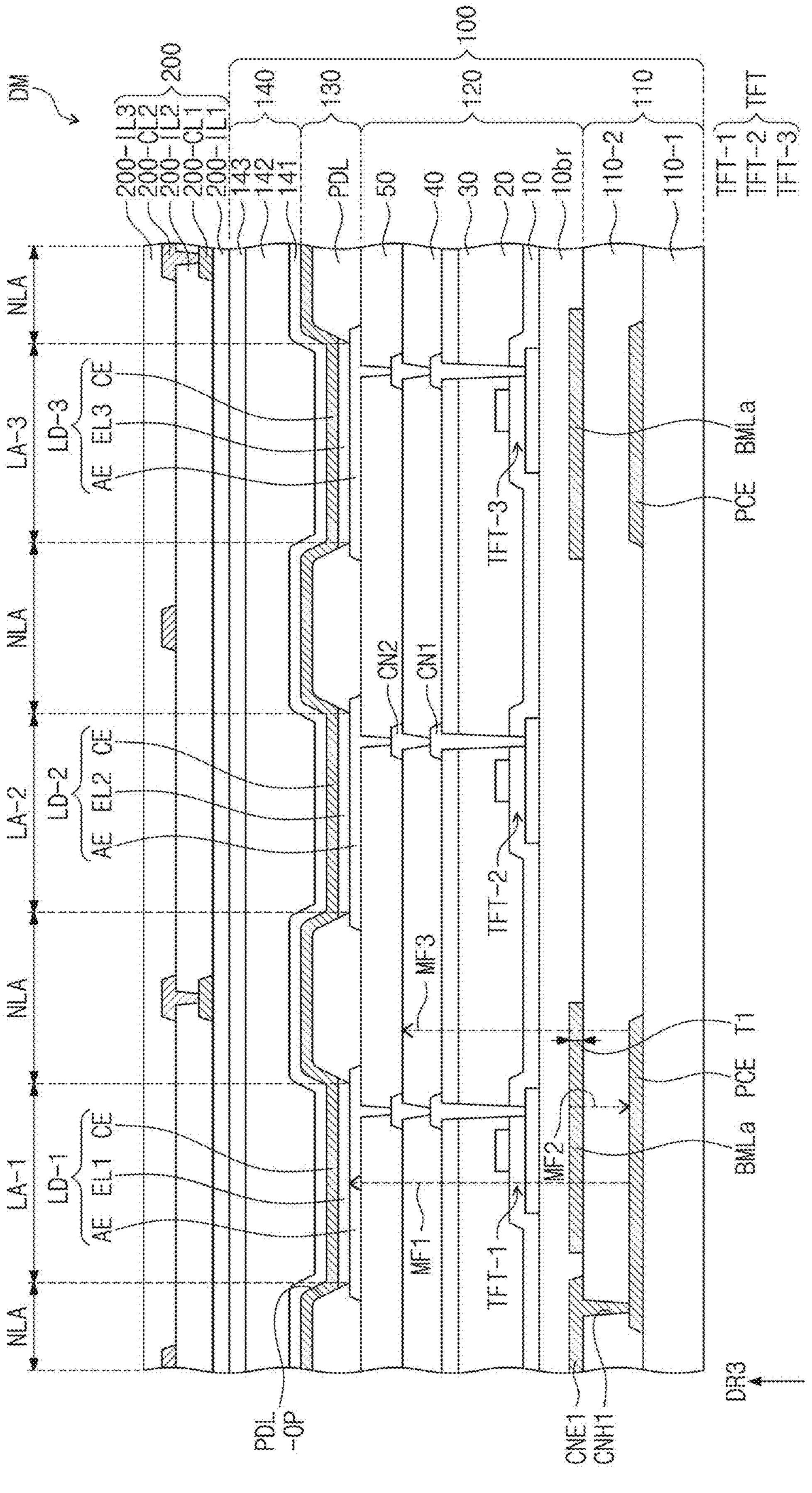
FIGS. 7A and 7B are sectional views of a portion of a display module according to an embodiment of the present disclosure.
Figure 7B:
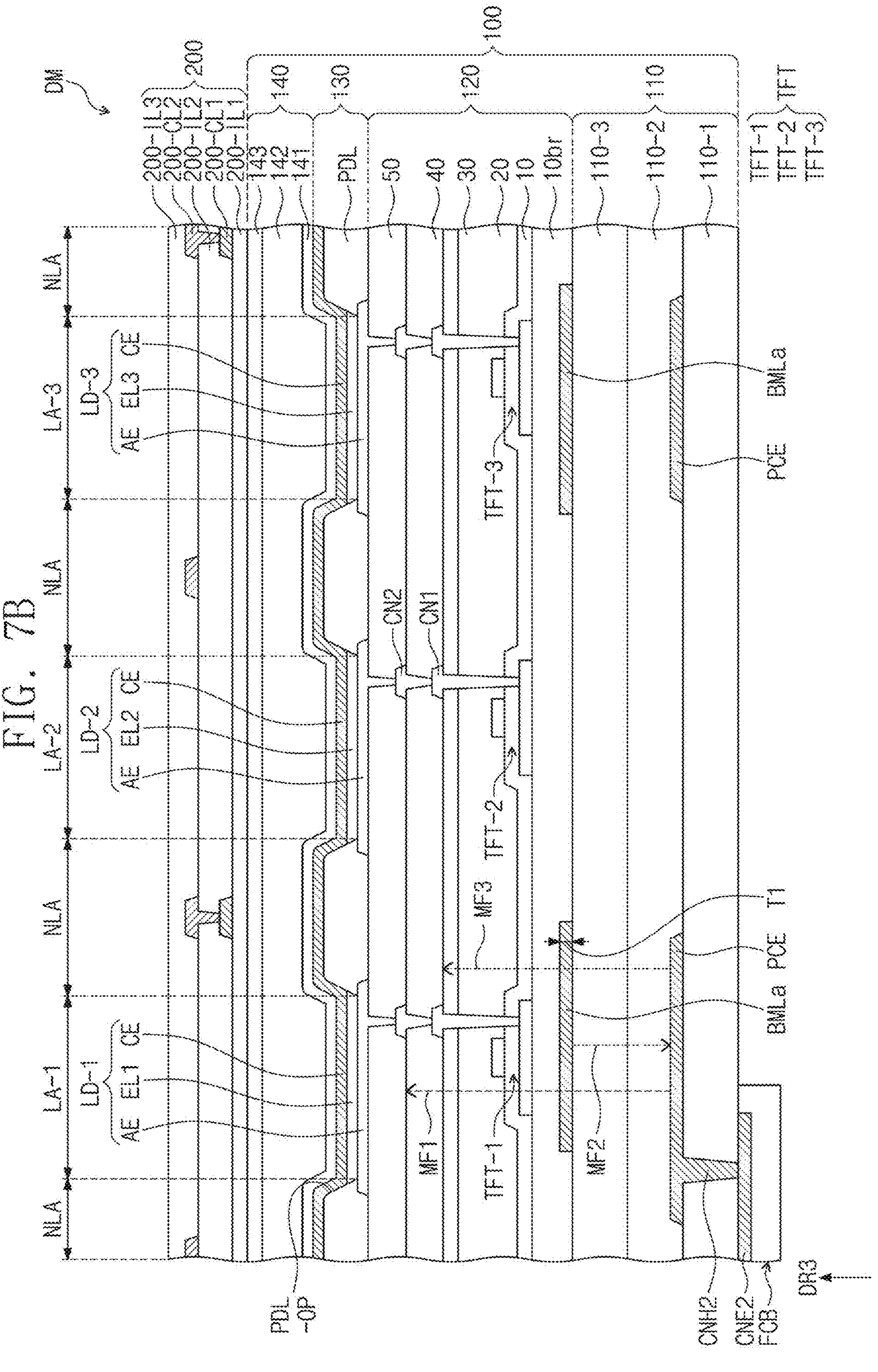

FIGS. 7A and 7B are sectional views of a portion of the display module DM according to an embodiment of the present disclosure. In FIGS. 7A and 7B, sections of three light emitting elements LD and transistors TFT connected thereto are illustrated. Meanwhile, in FIGS. 7A and 7B, a stacked structure of the display panel 100 and the input sensor 200 included in the display module DM is illustrated, and the anti-reflector 300 (refer to FIG. 6) is omitted.

Referring to FIGS. 6 and 7A together, the display panel 100 may include a plurality of pixels, and the pixels may include a plurality of light emitting elements LD-1, LD-2, and LD-3 disposed in the light emitting element layer 130 and transistors TFT-1, TFT-2, and TFT-3 connected to the light emitting elements LD-1, LD-2, and LD-3, respectively.

The display module DM may include a non-emissive region NLA and emissive regions LA-1, LA-2, and LA-3. The emissive regions LA-1, LA-2, and LA-3 may be regions through which light generated by the light emitting elements LD-1, LD-2, and LD-3 is emitted. The emissive regions LA-1, LA-2, and LA-3 may be spaced apart from each other when viewed from above the plane.

The emissive regions LA-1, LA-2, and LA-3 may be regions divided from one another by the pixel defining layer PDL. The non-emissive region NLA may correspond to regions between the emissive regions LA-1, LA-2, and LA-3 and may be a region corresponding to the pixel defining layer PDL. The pixel defining layer PDL may divide the light emitting elements LD-1, LD-2, and LD-3 from one another. Emissive layers EL1, EL2, and EL3 of the light emitting elements LD-1, LD-2, and LD-3 may be divided from one another by being disposed in openings PDL-OP defined in the pixel defining layer PDL.

The emissive regions LA-1, LA-2, and LA-3 may be divided into a plurality of groups depending on the colors of light generated by the light emitting elements LD-1, LD-2, and LD-3. In an embodiment illustrated in FIGS. 7A and 7B, the display device DD may include the three emissive regions LA-1, LA-2, and LA-3 that emit red light, green light, and blue light. For example, the display device DD may include the first emissive region LA-1, the second emissive region LA-2, and the third emissive region LA-3 divided from one another.

In the display device DD according to an embodiment, the plurality of light emitting elements LD-1, LD-2, and LD-3 may emit light in different wavelength ranges. For example, in an embodiment, the display device DD may include the first light emitting element LD-1 that emits red light, the second light emitting element LD-2 that emits green light, and the third light emitting element LD-3 that emits blue light. That is, the first emissive region LA-1, the second emissive region LA-2, and the third emissive region LA-3 of the display device DD may correspond to the first light emitting element LD-1, the second light emitting element LD-2, and the third light emitting element LD-3, respectively.

However, embodiments of the present disclosure are not limited thereto, and the first to third light emitting elements LD-1, LD-2, and LD-3 may emit light in the same wavelength range, or at least one of the first to third light emitting elements LD-1, LD-2, and LD-3 may emit light in a different wavelength range. For example, the first to third light emitting elements LD-1, LD-2, and LD-3 may all emit blue light.

The first to third light emitting elements LD-1, LD-2, and Ld-3 may include first electrodes AE, the emissive layers EL1, EL2, and EL3, and a second electrode CE (or, a common electrode). The first electrodes AE may be disposed on the fifth insulating layer 50. The first electrodes AE may be semi-transparent electrodes, transparent electrodes, or reflective electrodes. The first electrodes AE may include a reflective layer formed of Ag, Mg, Al, Pt, Pd, Au, Ni, Nd, Ir, Cr, or a compound thereof and a transparent or translucent electrode layer formed on the reflective layer. The transparent or translucent electrode layer may include at least one selected from the group consisting of indium tin oxide (ITO), indium zinc oxide (IZO), indium gallium zinc oxide (IGZO), zinc oxide ($ZnO_x$), indium oxide ($In_2O_3$), and aluminum-doped zinc oxide (AZO). For example, the first electrodes AE may include or may be a stacked structure of ITO/Ag/ITO.

The emissive layers EL1, EL2, and EL3 may have a single-layer structure formed of a single material, a single-layer structure formed of a plurality of different materials, or a multi-layer structure having a plurality of layers formed of a plurality of different materials. The emissive layers EL1, EL2, and EL3 may include well-known host and dopant for emitting light in the above-described wavelength range. For example, the light emitting elements LD-1, LD-2, and LD-3 may include an organic light-emitting diode such as Tris(8-hydroxyquinolinato)aluminum ($Alq_3$) and rubrene, a polymer light-emitting diode, or a quantum dot.

The second electrode CE may be provided as a common layer and may be a transparent electrode or a transflective electrode. The second electrode CE may include Ag, Mg, Cu, Al, Pt, Pd, Au, Ni, Nd, Ir, Cr, Li, Ca, Mo, Ti, Yb, W, or a compound or mixture thereof (e.g., AgMg, AgYb, or MgYb) or a material with a multilayer structure such as LiF/Ca or LiF/Al.

In an embodiment, the display panel 100 may include the charging electrode PCE, and the charging electrode PCE may overlap the pixels. At least a portion of the charging electrode PCE may overlap at least a part of the plurality of light emitting elements LD-1, LD-2, and LD-3 when viewed from above the plane. For example, a portion of the charging electrode PCE may overlap at least a part of the first emissive region LA-1, the second emissive region LA-2, and the third emissive region LA-3. In FIGS. 7A and 7B, the charging electrode PCE is illustrated as overlapping the first emissive region LA-1 and the third emissive region LA-3. However, without being limited thereto, the charging electrode PCE may overlap only one of the first emissive region LA-1, the second emissive region LA-2, and the third emissive region LA-3, or may overlap the first emissive region LA-1, the second emissive region LA-2, and the third emissive region LA-3.

The base layer 110 includes a plurality of resin layers, and the charging electrode PCE is disposed under at least one of the plurality of resin layers. For example, the charging electrode PCE may be disposed in a space between two adjacent resin layers of the plurality of resin layers. As illustrated in FIG. 7A, the base layer 110 may include the first resin layer 110-1 and the second resin layer 110-2, and the charging electrode PCE may be disposed under the second resin layer 110-2. For example, the charging electrode PCE may be disposed in a space between the first and second resin layers 110-1 and 110-2. The upper surface of the charging electrode PCE may be covered by the second resin layer 110-2. Meanwhile, when the base layer 110 includes an inorganic layer that is disposed between the first resin layer 110-1 and the second resin layer 110-2 and that has a single-layer structure or a multi-layer structure, the charging electrode PCE may be disposed on the inorganic layer.

The charging electrode PCE may be disposed between the plurality of resin layers 110-1 and 110-2 of the display panel 100 and may be spaced apart from the conductive pattern layers 200-CL1 and 200-CL2 included in the input sensor 200. The charging electrode PCE may be spaced apart from the conductive pattern layers 200-CL1 and 200-CL2 with the plurality of pixels therebetween. The charging electrode PCE may be spaced apart from the conductive pattern layers 200-CL1 and 200-CL2 with the driving element layer 120 and the light emitting element layer 130 therebetween. The driving element layer 120, the light emitting element layer 130, and the encapsulation layer 140 may be disposed between the charging electrode PCE and the conductive pattern layers 200-CL1 and 200-CL2 in the third direction DR3.

The charging electrode PCE may form a magnetic field MF1 by forming a coil-shaped current path. The magnetic field MF1 formed by the charging electrode PCE may be transferred to the resonance circuit of the stylus pen STP (refer to FIG. 9B) and may charge the stylus pen STP (refer to FIG. 9B).

The shielding pattern BMLa may be disposed on the second resin layer 110-2 and may be covered by the buffer layer 10*br*. The shielding pattern BMLa may include or may be formed of a conductive material. The shielding pattern BMLa may overlap the display region 100-DA (refer to FIG. 5).

Since the shielding pattern BMLa is a conductive metal, eddy currents may be induced by the magnetic field MF1 formed by the charging electrode PCE. Here, eddy currents are loops of electric current induced within a second conductor adjacent to a first conductor by an electromagnetic induction phenomenon when a magnetic field applied to the first conductor changes with time. The eddy currents flowing in the direction opposite to that of the electric current applied to the first conductor are formed in the second conductor. Accordingly, a magnetic field opposite to the magnetic field formed in the first conductor is formed in the second conductor, and thus the strength of the magnetic field formed in the first conductor is reduced.

The eddy currents of the shielding pattern BMLa may form a cancelling magnetic field MF2 that cancels out the magnetic field MF1 formed by the charging electrode PCE. In an embodiment, the magnetic field MF1 formed by the charging electrode PCE may be cancelled out by the cancelling magnetic field MF2 formed by the shielding pattern BMLa so that an actual magnetic field MF3, the strength of which is reduced when compared to that of the magnetic field MF1, may be transmitted to the stylus pen STP (refer to FIG. 9B). Due to this, the charging efficiency of the charging electrode PCE may be decreased. The decrease in the charging efficiency may be prevented by the shielding pattern BMLa having a first thickness T1 of which a specific thickness is set based on Equation 1 described below.

The shielding pattern BMLa may have the first thickness T1, and slits SLT (refer to FIG. 10A) may be defined in the shielding pattern BMLa. The first thickness T1 of the shielding pattern BMLa may satisfy the range of Equation 1 below. The first thickness T1 of the shielding pattern BMLa may be the thickness of the shielding pattern BMLa in the third direction DR3. In Equation 1 below, A is pi (π), B is the permeability of the shielding pattern BMLa, C is the frequency of electric current flowing through the shielding pattern BMLa, and D is the resistivity of the shielding pattern BMLa.

$$T1 \leq \left(\frac{D}{ABC}\right)^{1/2} \qquad \text{[Equation 1]}$$

The first thickness T1 of the shielding pattern BMLa to secure the charging efficiency of the charging electrode PCE may depend on the composition of the material constituting the shielding pattern BMLa and the frequency of electric current flowing through the shielding pattern BMLa. Hereinafter, the maximum value of the first thickness T1 expressed on the right-hand side of Equation 1 is referred to as the critical thickness. The critical thickness may be decreased as the permeability of the shielding pattern BMLa and the frequency of electric current flowing through the shielding pattern BMLa are increased. The critical thickness may be increased as the resistivity of the shielding pattern BMLa is increased. In an embodiment, the first thickness T1 of the shielding pattern BMLa to secure the charging efficiency of the charging electrode PCE may be greater than or equal to a minimum thickness greater than zero and smaller than the critical thickness. For example, the first thickness T1 may have a thickness selected from a range of the minimum thickness to the critical thickness.

When the first thickness T1 is greater than the critical thickness, the skin effect of the shielding pattern BMLa may be increased so that the cancelling magnetic field MF2 generated by the shielding pattern BMLa may be increased. Accordingly, the cancelling magnetic field MF2 may be minimized by making the first thickness T1 smaller than the critical thickness. The magnitude of the actual magnetic field MF3 transmitted to the stylus pen STP (refer to FIG. 9B) of the magnetic field MF1 generated by the charging electrode PCE may be increased by decreasing the cancelling magnetic field MF2. Thus, the charging efficiency of the charging electrode PCE may be increased.

The shielding pattern BMLa may include at least one of silver (Ag), copper (Cu), aluminum (Al), rhodium (Rh), tungsten (W), and molybdenum (Mo). When a metal having high resistivity is used as the shielding pattern BMLa, the magnitude of the cancelling magnetic field MF2 formed by the shielding pattern BMLa may be reduced, and the charging efficiency of the charging electrode PCE may be increased. In an embodiment, the shielding pattern BMLa may include or may be formed of at least one of rhodium, tungsten, and molybdenum having relatively high resistivity compared to silver, copper, or aluminum having relatively low resistivity. This may be confirmed by referring to Equation 2 below.

In Equation 2 below, S is the shielding factor of the shielding pattern BMLa, A is pi (π), B is permeability in a vacuum state, C is the frequency of electric current flowing through the shielding pattern BMLa, D is the resistivity of the shielding pattern BMLa, T is the thickness of the shielding pattern BMLa, and L is the length of a current path of an eddy current formed in the shielding pattern BMLa.

$$S = \left[1 + \left(\frac{LTCAB}{2D}\right)^2\right]^{1/2} \qquad \text{[Equation 2]}$$

Referring to Equation 2, the shielding factor of the shielding pattern BMLa may be decreased when the resistivity of the shielding pattern BMLa is increased. Accordingly, the magnitude of the cancelling magnetic field MF2 formed in the shielding pattern BMLa may be reduced, and the magnitude of the actual magnetic field MF3 transmitted to the resonance circuit of the stylus pen STP (refer to FIG. 9B) may be increased. Thus, the charging efficiency of the charging electrode PCE may be increased. In Equation 2, as the thickness of the shielding pattern BMLa increases, the shielding factor thereof increases. However, as discussed above, when the thickness exceeds the critical thickness, the magnitude of the actual magnetic field MF3 transmitted to the resonance circuit of the stylus pen STP (refer to FIG. 9B) may be decreased.

The display panel 100 of one embodiment may further include a connecting line CNE1 that is connected to the charging electrode PCE and that applies a ground voltage to the charging electrode PCE. The connecting line CNE1 may pass through the resin layer disposed on the charging electrode PCE and may be connected to the charging electrode PCE. In an embodiment, the connecting line CNE1 may be connected to the charging electrode PCE by a contact hole CNH1 penetrating the second resin layer 110-2.

The connecting line CNE1 may be disposed on the same layer as the shielding pattern BMLa. The connecting line CNE1 may be disposed on the second resin layer 110-2 like the shielding pattern BMLa and may include the same material as the shielding pattern BMLa. The connecting line CNE1 may be formed through the same process as that of the shielding pattern BMLa. For example, the connecting line CNE1 and the shielding pattern BMLa may be formed by forming a conductive layer on the second resin layer 110-2 and then patterning the conductive layer.

Meanwhile, although FIGS. 6 and 7A illustrate an example that the base layer 110 has the structure in which the two resin layers 110-1 and 110-2 are stacked on each other, the present disclosure is not limited thereto, and the base layer 110 may have a structure in which three or more resin layers are stacked one above another.

Referring to FIG. 7B, the base layer 110 may include the first resin layer 110-1, the second resin layer 110-2, and a third resin layer 110-3. The second resin layer 110-2 may be disposed on the first resin layer 110-1, and the third resin layer 110-3 may be disposed on the second resin layer 110-2. Each of the first resin layer 110-1, the second resin layer 110-2, and the third resin layer 110-3 may include or may be formed of polymer resin. Each of the first resin layer 110-1, the second resin layer 110-2, and the third resin layer 110-3 may include or may be formed of, for example, an acrylic resin, a methacrylic resin, a polyisoprene resin, a vinyl resin, an epoxy resin, a urethane-based resin, a cellulosic resin, a siloxane-based resin, a polyimide resin, a polyamide resin, or a perylene-based resin. Each of the first resin layer 110-1, the second resin layer 110-2, and the third resin layer 110-3 may include or may be formed of polyimide.

Although not illustrated, the base layer 110 may further include inorganic layers that are disposed between the first resin layer 110-1 and the second resin layer 110-2 and between the second resin layer 110-2 and the third resin layer 110-3 and that have a single-layer structure or a multi-layer structure. The inorganic layers may include or may be formed of, for example, silicon oxide, silicon nitride, or silicon oxy nitride.

The charging electrode PCE is disposed under at least one of the plurality of resin layers 110-1, 110-2, and 110-3. As illustrated in FIG. 7B, the charging electrode PCE may be disposed under the second resin layer 110-2 and the third resin layer 110-3. The charging electrode PCE may be disposed on the first resin layer 110-1, and the upper surface of the charging electrode PCE may be covered by the second resin layer 110-2. For example, the charging electrode PCE may be disposed in a space between the first resin layer 110-1 and the second resin layer 110-2. Meanwhile, when the base layer 110 includes an inorganic layer that is disposed between the first resin layer 110-1 and the third resin layer 110-3 and that has a single-layer structure or a multi-layer structure, the charging electrode PCE may be disposed on the inorganic layer.

The charging electrode PCE may be electrically connected with the flexible circuit board FCB. The flexible circuit board FCB may be disposed under at least a portion of the display panel 100 and connected with the charging electrode PCE and may apply a ground voltage to the charging electrode PCE. In an embodiment, the resin layer disposed under the charging electrode PCE may be penetrated, and the charging electrode PCE and the flexible circuit board FCB may be electrically connected accordingly. In an embodiment, the charging electrode PCE may be connected to the flexible circuit board FCB by a contact hole CNH2 penetrating the first resin layer 110-1. The charging electrode PCE may be electrically connected with a connecting line CNE2 included in the flexible circuit board FCB. Meanwhile, unlike that illustrated in FIG. 7B, the charging electrode PCE may be electrically connected to the flexible circuit board FCB through a separate additional connecting line.

The charging electrode PCE may have a thickness selected from a range of 0.1 μm to 1 μm. When the charging electrode PCE has a thickness of less than 0.1 μm, the wiring resistance may be increased, and therefore the charging efficiency of the stylus pen STP (refer to FIG. 1A) may be decreased. When the charging electrode PCE has a thickness of more than 1 μm, the thicknesses of the charging electrode PCE and the base layer 110 in which the charging electrode PCE is disposed may increase the total thickness of the electronic device ED (refer to FIG. 1A) to the extent that folding characteristics of the electronic device ED may be deteriorated.

The shielding pattern BMLa may be disposed on the third resin layer 110-3 and may be covered by the buffer layer 10*br*. The shielding pattern BMLa may be disposed over the charging electrode PCE. However, the position of the shielding pattern BMLa is not limited thereto, and the shielding pattern BMLa may be disposed in various positions. For example, the shielding pattern BMLa may be disposed on the second resin layer 110-2 and may be covered by the third resin layer 110-3.

Figure 8:
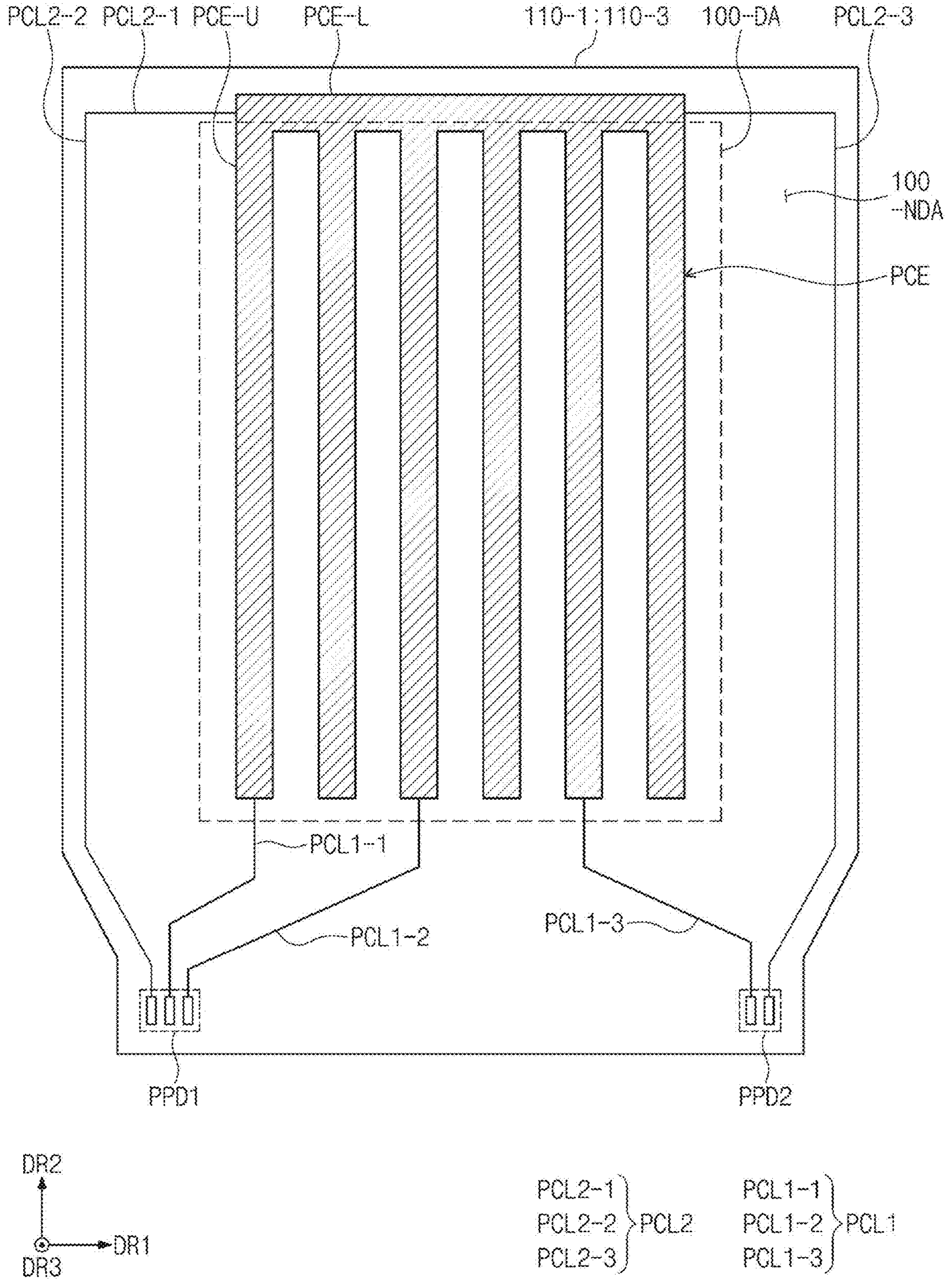
FIG. 8 is a plan view of a charging electrode included in a display device according to an embodiment of the present disclosure.
Figure 9A:
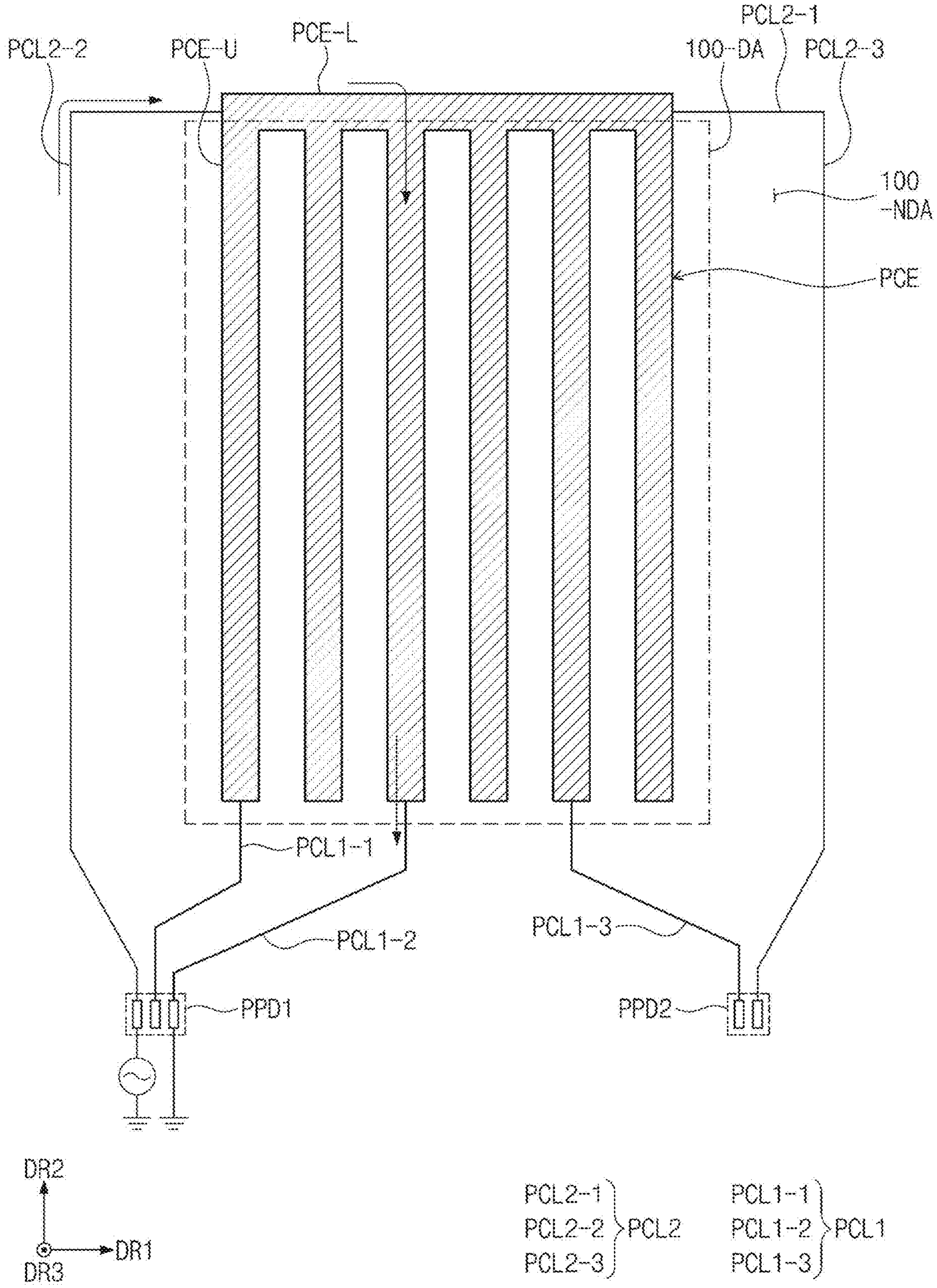
FIGS. 9A to 9C are plan views illustrating a charging electrode included in a display device according to an embodiment of the present disclosure during a charging period of an operation period.
Figure 9B:
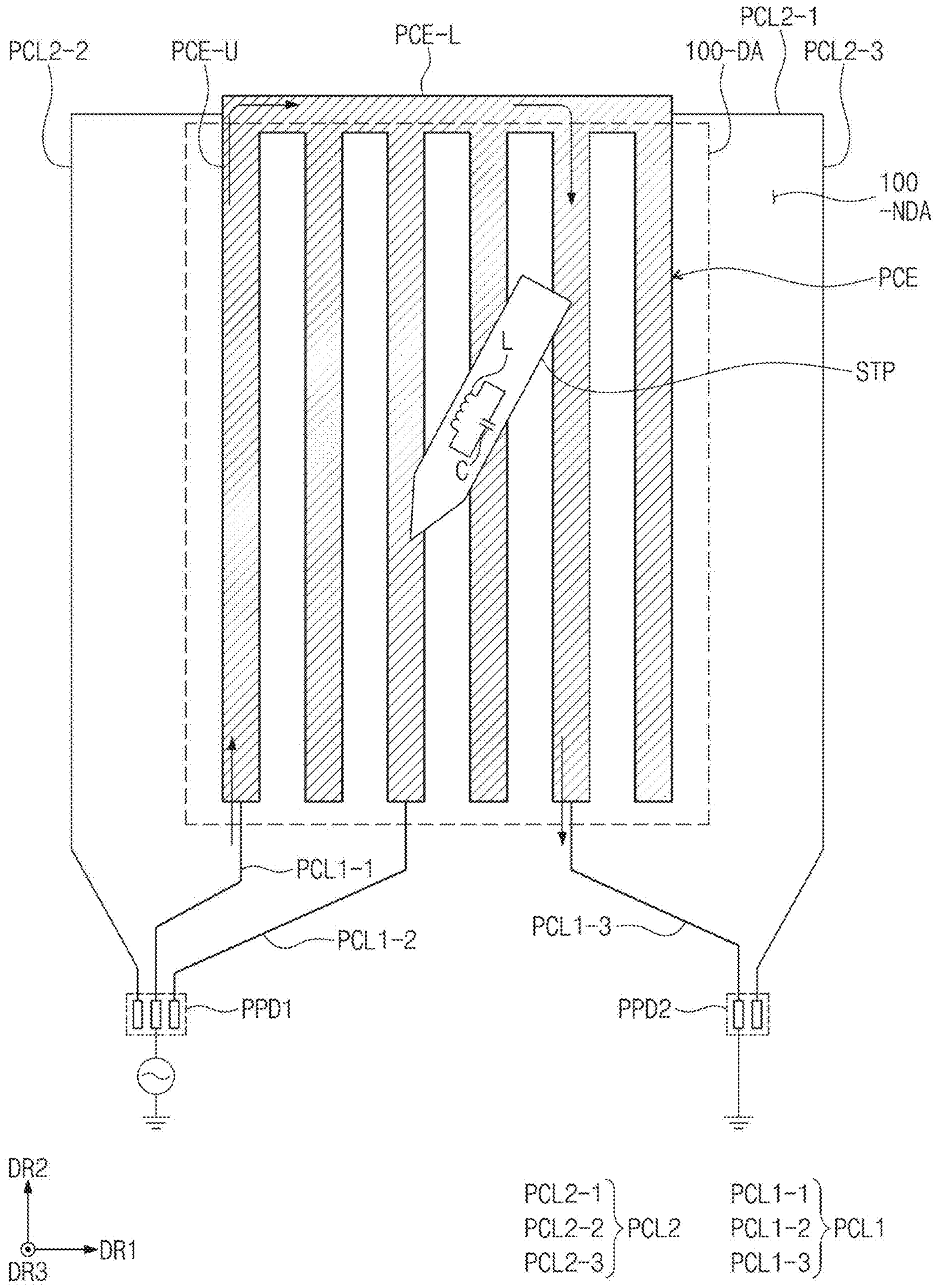
Figure 9C:
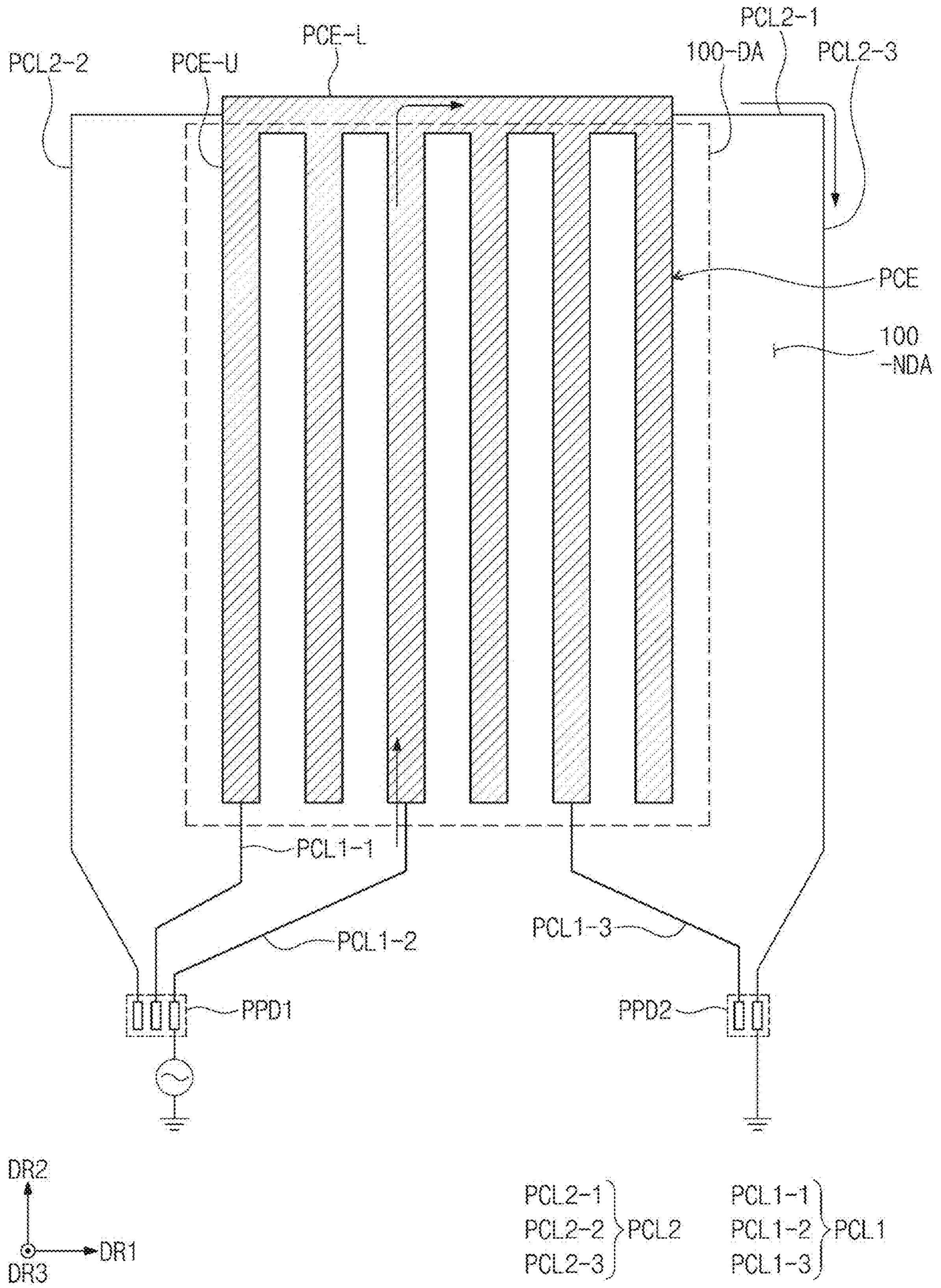

FIG. 8 is a plan view of the charging electrode PCE included in the display device DD according to an embodiment of the present disclosure. FIGS. 9A to 9C are plan views illustrating the charging electrode PCE of FIG. 8 during a charging period of an operation period.

Referring to FIGS. 6 to 8 together, the charging electrode PCE may be disposed under at least one of the plurality of resin layers 110-1 and 110-2 included in the base layer 110. As illustrated in FIG. 7A, the charging electrode PCE may be disposed on the first resin layer 110-1 and may be covered by the second resin layer 110-2. In an embodiment, as illustrated in FIG. 7B, the charging electrode PCE may be disposed on the first resin layer 110-1 and may be covered by the second resin layer 110-2.

The charging electrode PCE may include first partial electrodes PCE-U (i.e., finger electrodes) extending in the second direction DR2 and having a bar shape and a second partial electrode PCE-L (i.e., a connection electrode) extending in the first direction DR1 and having a bar shape. The first partial electrodes PCE-U may extend in the second direction DR2 and may be spaced apart from each other in the first direction DR1. Although FIG. 8 illustrates an example that the charging electrode PCE includes six first partial electrodes PCE-U having a bar shape, the present disclosure is not limited thereto, and the number of first partial electrodes PCE-U may be diversely provided depending on the shape and size of the electronic device. Upper ends of the first partial electrodes PCE-U may be connected to the second partial electrode PCE-L. The second partial electrode PCE-L may connect the upper ends of the first partial electrodes PCE-U with each other and may extend in the first direction DR1. A portion of the second partial electrode PCE-L may overlap the non-display region 100-NDA.

The display panel 100 may further include signal lines connected to the charging electrode PCE. In an embodiment, the display panel 100 may include first voltage lines PCL1 connected to ends of the first partial electrodes PCE-U and second voltage lines PCL2 connected to opposite ends of the second partial electrode PCE-L. The second voltage lines PCL2 may include first portions PCL2-1 that extend in the first direction DR1 and that are connected to the opposite ends of the second partial electrode PCE-L, a second portion PCL2-2 bent from one of the first portions PCL2-1 and connected to a first voltage pad PPD1, and a third portion PCL2-3 bent from the other one of the first portions PCL2-1 and connected to a second voltage pad PPD2.

At least a portion of the charging electrode PCE may overlap the display region 100-DA. The first voltage lines PCL1 and the second voltage lines PCL2 may be disposed in the non-display region 100-NDA. The charging electrode PCE, the first voltage lines PCL1, and the second voltage lines PCL2 may be disposed on the same layer, or may be disposed on different layers. In an embodiment, each of the first voltage lines PCL1 and the second voltage lines PCL2 may be the connecting line CNE1 as illustrated in FIG. 7A, or may be the connecting line CNE2 connected to the flexible circuit board FCB as illustrated in FIG. 7B.

The display panel 100 may include first voltage pads PPD1 and second voltage pads PPD2. The first voltage pads PPD1 and the second voltage pads PPD2 may be disposed in regions spaced apart from each other in the first direction DR1. Each of the first voltage lines PCL1 and the second voltage lines PCL2 may be connected to at least one corresponding pad among the first voltage pads PPD1 and the second voltage pads PPD2. The first voltage pads PPD1 and the second voltage pads PPD2 may be adjacent to the lower end of the display panel 100 when viewed from above the plane. The first pads PD1 illustrated in FIG. 5 may be disposed in a space between a region where the first voltage pads PPD1 are formed and a region where the second voltage pads PPD2 are formed when viewed from above the plane.

Although FIG. 8 illustrates an example that the charging electrode PCE includes the bar-shaped first partial electrodes PCE-U extending in the second direction DR2 and the bar-shaped second partial electrode PCE-L extending in the first direction DR1, the charging electrode PCE may have any shape capable of forming a coil-shaped current path. Various shapes of the charging electrode PCE will be described below with reference to FIGS. 11A to 11C.

FIGS. 9A to 9C are plan views illustrating the charging electrode PCE of FIG. 8 during the charging period of the operation period.

In FIGS. 9A to 9C, for convenience of description, among three first voltage lines PCL1, the left first voltage line PCL1 is indicated using reference PCL1-1, the middle first voltage line PCL1 is indicated using reference PCL1-2, and the right first voltage line PCL1 is indicated using reference PCL1-3.

During the charging period, the second voltage lines PCL2 may receive a drive signal or a ground voltage from at least one of the first voltage pad PPD1 and the second voltage pad PPD2. One of the voltage lines PCL1-1, PCL1-2, and PCL1-3 may be selected to receive the ground voltage, and the rest may not be selected. The selected voltage line may receive the drive signal or the ground voltage. The charging electrode PCE connected with the selected voltage line may also receive the drive signal or the ground voltage. The unselected voltage lines may be floated. Some of the second voltage lines PCL2, the charging electrodes PCE, and the first voltage lines PCL1 may be selected such that a current path is formed in a coil (or, a coil is defined).

Referring to FIG. 9A, during a first section of the charging period, the drive circuit of the display module may select the first voltage pad PPD1 connected to the second voltage lines PCL2 and the first voltage pad PPD1 to which the middle first voltage line PCL1-2 is connected. The drive circuit of the display module may apply a drive signal to the first voltage pad PPD1 connected to the second voltage lines PCL2 and may apply a ground voltage to the first voltage pad PPD1 connected to the middle first voltage line PCL1-2. At this time, the left and right first voltage lines PCL1-1 and PCL1-3 may be floated. The second voltage lines PCL2, the second partial electrode PCE-L, the first partial electrode PCE-U of the charging electrode PCE disposed in the center, and the middle first voltage line PCL1-2 define a coil-shaped current path. The coil-shaped current path may generate a magnetic field.

Referring to FIG. 9B, during a second section of the charging period, the drive circuit of the display module may select the first voltage pad PPD1 connected to the left first voltage line PCL1-1 and the second voltage pad PPD2 to which the right first voltage line PCL1-3 is connected. The drive circuit of the display module may apply a drive signal to the first voltage pad PPD1 connected to the left first voltage line PCL1-1 and may apply a ground voltage to the second voltage pad PPD2 connected to the right first voltage line PCL1-3. The left first voltage line PCL1-1, the first partial electrode PCE-U of the charging electrode PCE disposed on the left side, the second partial electrode PCE-L, the first partial electrode PCE-U of the charging electrode PCE disposed on the right side, and the right first voltage line PCL1-3 define a coil-shaped current path. The coil-shaped current path may generate a magnetic field.

Referring to FIG. 9C, during a third section of the charging period, the drive circuit of the display module may select the first voltage pad PPD1 connected to the middle first voltage line PCL1-2 and the second voltage pad PPD2 to which the second voltage lines PCL2 are connected. The drive circuit of the display module may apply a drive signal to the first voltage pad PPD1 connected to the middle first voltage line PCL1-2 and may apply a ground voltage to the second voltage pad PPD2 connected to the second voltage lines PCL2. The middle first voltage line PCL1-2, the first partial electrode PCE-U of the charging electrode PCE disposed in the center, the second partial electrode PCE-L, and the second voltage lines PCL2 define a coil-shaped current path. The coil-shaped current path may generate a magnetic field.

During the charging period as described with reference to FIGS. 9A and 9C, a constant voltage may be applied to a part of the first partial electrodes PCE-U and the second partial electrode PCE-L of the charging electrode PCE through the first voltage line PCL1 and the second voltage line PCL2. The driving sequence of the charging period as described with reference to FIGS. 9A to 9C is only an embodiment, and the present disclosure is not necessarily limited thereto. The operating sequence of the first to third sections may be changed. In addition, two first partial electrodes PCE-U closest to each other and a portion of the second partial electrode PCE-L of the charging electrode PCE may define a portion of a coil-shaped current path.

Referring to FIG. 9B, the resonance circuit of the stylus pen STP may be charged during the second section of the charging period. The resonance circuit of the stylus pen STP disposed on the first partial electrode PCE-U disposed in the center receives the magnetic field formed in the current path as described with reference to FIG. 9B. The resonance circuit of the stylus pen STP resonates using a signal received through a change in the magnetic field in the current path as described with reference to FIG. 9B. The resonance circuit of the stylus pen STP may include an inductor L and a capacitor C connected to the inductor L. An LC resonance circuit may be formed by the inductor L and the capacitor C. The capacitor C may be a variable capacitor whose capacitance is varied.

FIGS. 10A to 10E are plan views of the shielding pattern BMLa according to an embodiment of the present disclosure.

Referring to FIGS. 10A to 10E, the shielding pattern BMLa may have slits SLT defined therein. The shielding pattern BMLa may be divided into a plurality of sections by the slits SLT. The slits SLT defined in the shielding pattern BMLa may decrease the area of a continuous region or a flat region of the shielding pattern BMLa to reduce the strength of a magnetic field formed by eddy currents. For example, coil-shaped current paths of the eddy currents EDC may be formed into a small loop, and thus the shielding pattern BMLa divided by the slits SLT may suppress the eddy currents EDC in a small loop from forming a large loop. Hereinafter, the shapes of the shielding pattern BMLa capable of suppressing eddy currents EDC from being formed into a large loop will be described with reference to FIGS. 10A to 10E.

Figure 10A:
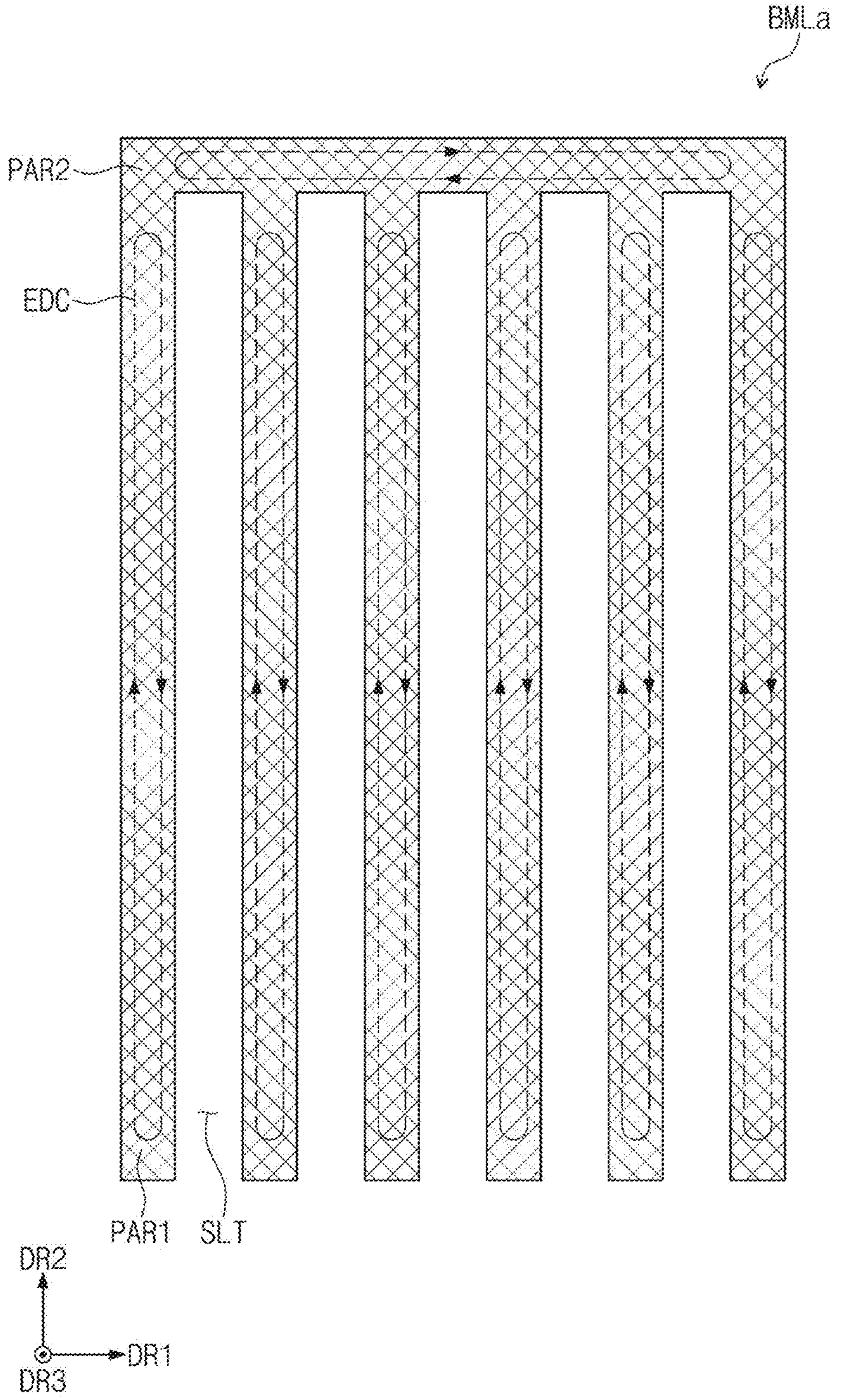
FIGS. 10A to 10E are plan views of a shielding pattern according to an embodiment of the present disclosure.

Referring to FIG. 10A, the shielding pattern BMLa may have a plurality of slits SLT defined therein. The plurality of slits SLT may extend in the second direction DR2 and may be arranged in the first direction DR1 so as to be spaced apart from each other. The plurality of slits SLT may be connected with the outside of the shielding pattern BMLa. The plurality of slits SLT are not limited to extending in a straight line.

The shielding pattern BMLa may include first sections PAR1 that extend in the second direction DR2 and that are arranged in the first direction DR1 and a second section PAR2 that extends in the first direction DR1 and that is connected with the first sections PAR1. Among the plurality of first sections PAR1, first sections PAR1 closest to each other may be divided from each other by the slit SLT. For example, the slits SLT may be located between the plurality of first sections PAR1. Upper ends of the first sections PAR1 may be connected by the second section PAR2. In an embodiment, each of the slits SLT may be an open-ended slit surrounded by the second section PAR2 and two adjacent first sections PAR1, and a lower end of each slit SLT is open.

Eddy currents EDC may be formed into a small loop in the plurality of first sections PAR1 and the second section PAR2. Since the plurality of first sections PAR1 are spaced apart from each other without forming a continuous region, the loops of the eddy currents EDC may have a small size. As compared with when the shielding pattern BMLa is implemented with one continuous flat plate in which the slits SLT are not defined, the loops of the eddy currents EDC may be divided from one another and may have a small size. Since the loops of the eddy currents EDC have a small size, the magnitude of the cancelling magnetic field MF2 (refer to FIGS. 7A and 7B) formed by the shielding pattern BMLa may be decreased, and the charging efficiency of the charging electrode PCE may be improved.

Figure 10B:
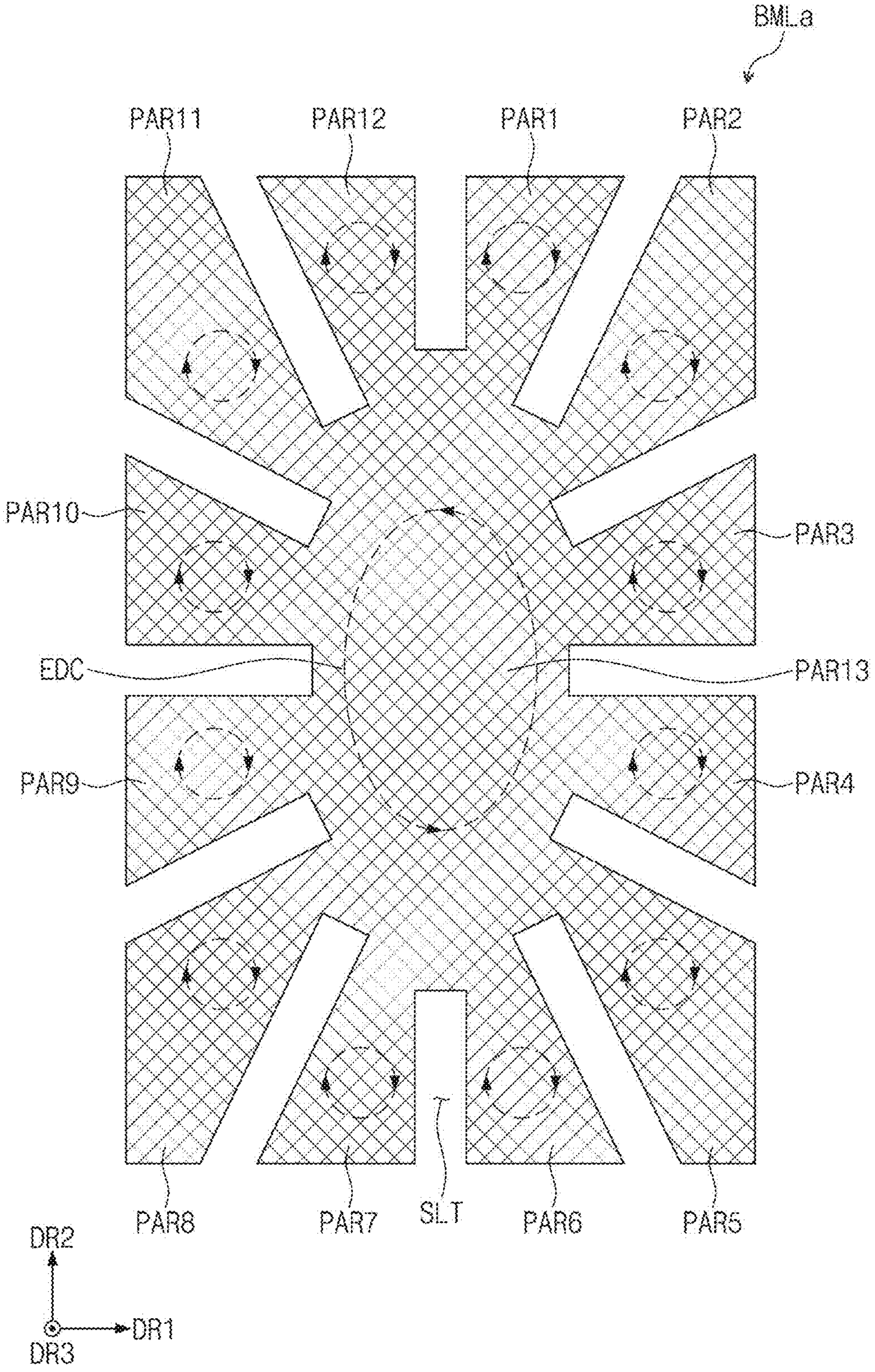

Referring to FIG. 10B, the shielding pattern BMLa may be divided into a plurality of sections PAR1 to PAR13 by a plurality of slits SLT. The plurality of slits SLT may radially extend with respect to the center of the shielding pattern BMLa. The plurality of slits SLT may divide the shielding pattern BMLa into thirteen sections including a thirteenth section PAR13 located at the center of the shielding pattern BMLa and first to twelfth sections PAR1 to PAR12 surrounding the thirteenth section PAR13. Each of the plurality of slits SLT may be an open ended slit surrounded by the thirteenth section PAR13 and two adjacent sections of the first to twelfth sections PAR1 to PAR12, and a farther end of each slit SLT from the thirteenth section PAR13 is open. Eddy currents EDC may be formed into a small loop in the first to thirteenth sections PAR1 to PAR13, and thus the plurality of slits SLT may prevent the eddy currents EDC from being formed into a large loop in the shielding pattern BMLa.

Figure 10C:
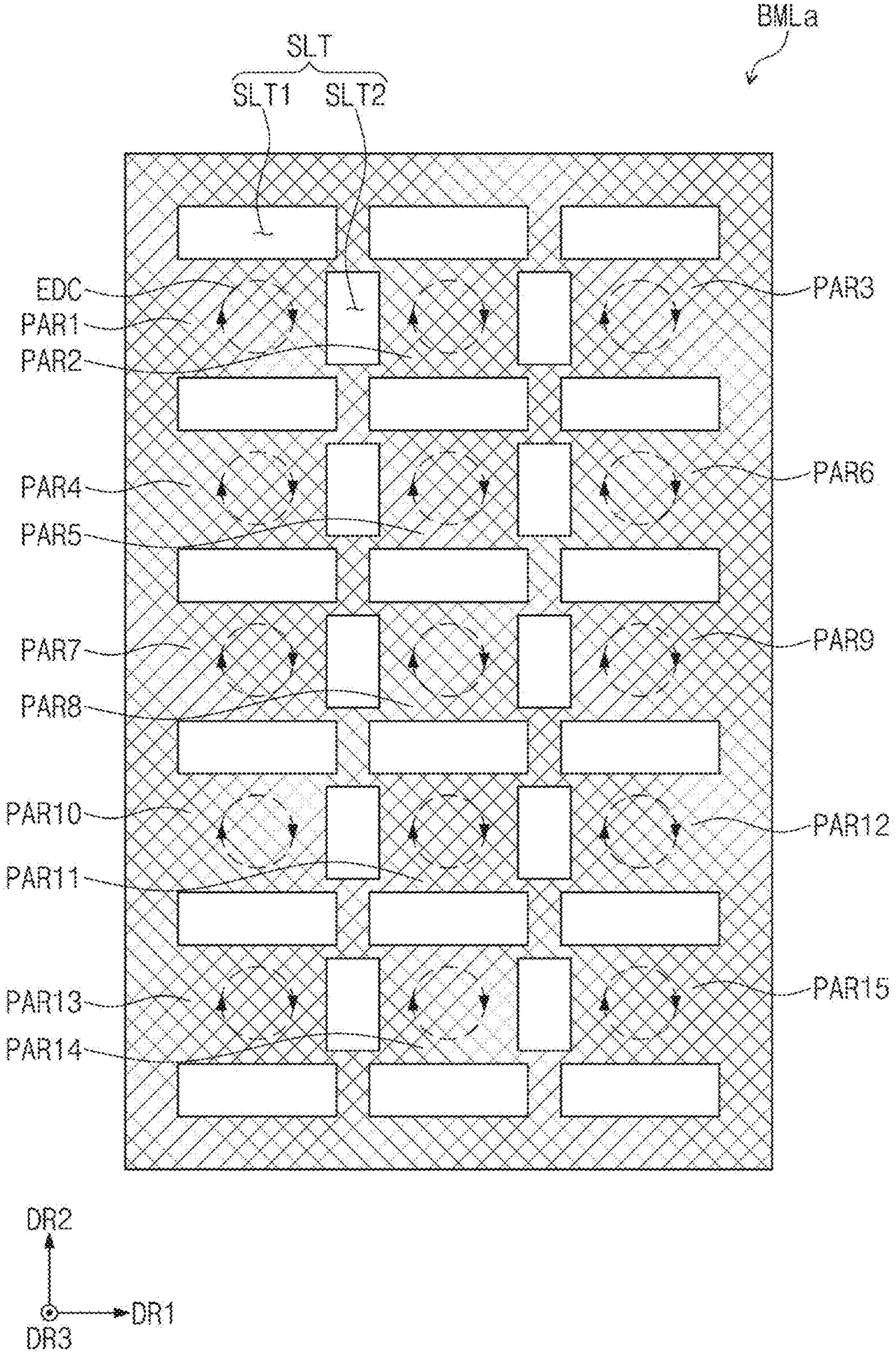

Referring to FIG. 10C, the shielding pattern BMLa may have a plurality of slits SLT defined therein. The plurality of slits SLT may include first slits SLT1 extending in the first direction DR1 and second slit SLT2 extending in the second direction DR2. The first slits SLT1 may form a plurality of rows arranged in the first direction DR1. The plurality of rows of the first slits SLT1 may be arranged in the second direction DR2. The second slits SLT2 may be disposed between the plurality of rows of the first slits SLT1 in the second direction DR2. The second slits SLT2 may be disposed between the first slits SLT1 in the first direction DR1. The shielding pattern BMLa may be divided into first to fifteenth sections PAR1 to PAR15 by the first slits SLT1 and the second slits SLT2. In an embodiment, each of the first and second slits SLT1 and SLT2 may be enclosed by the shielding pattern BMLa. The first and second slits SLT1 and SLT2 that are arranged in the first and second directions DR1 and DR2 may divide the shielding pattern BMLa into the first to fifteenth sections PAR1 to PAR15. Eddy currents EDC may be formed into a small loop in the first to fifteenth sections PAR1 to PAR15. The plurality of slits SLT may prevent the eddy currents EDC from being formed into a large loop in the shielding pattern BMLa.

Figure 10D:
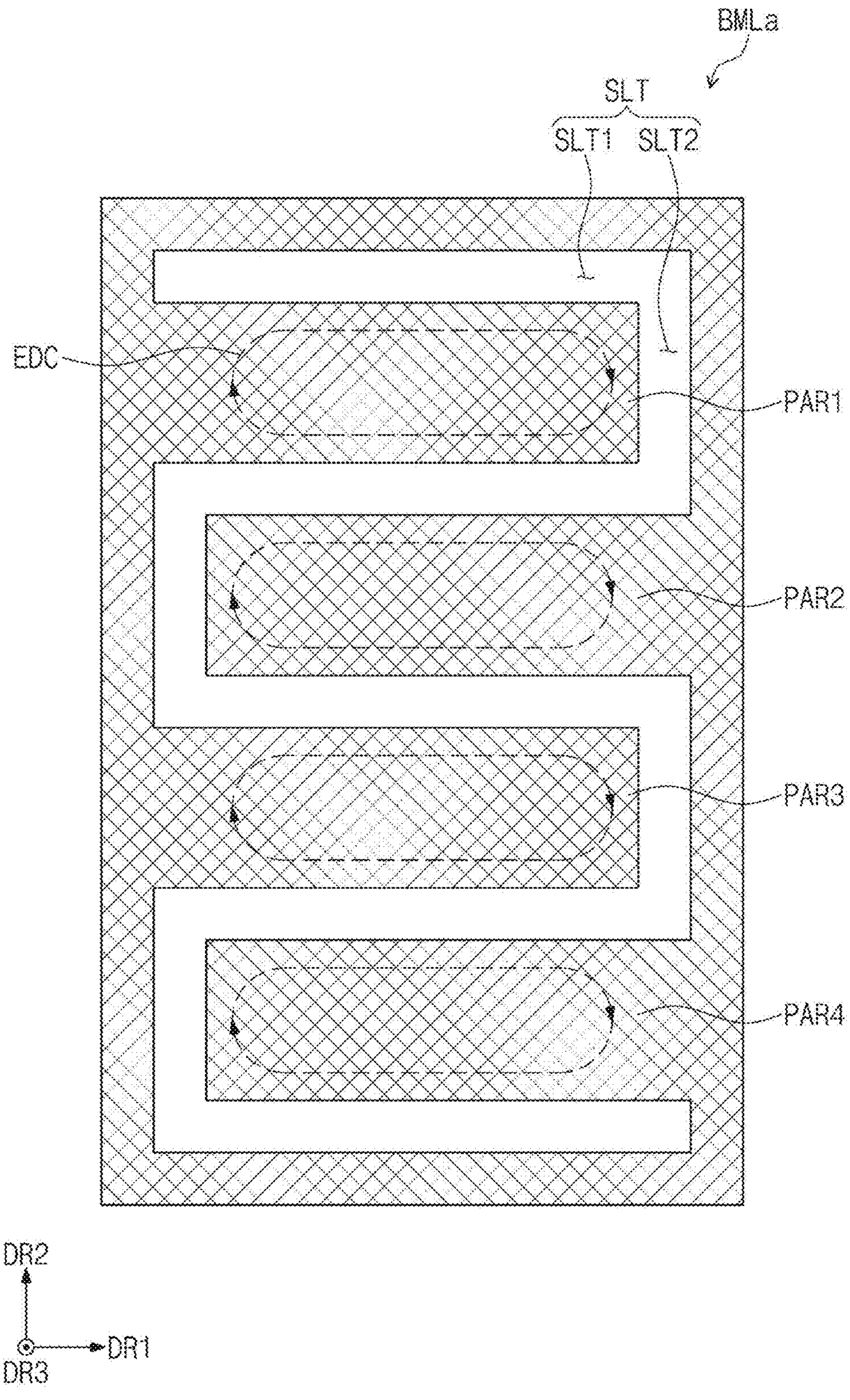

Referring to FIG. 10D, the shielding pattern BMLa may have a slit SLT defined therein. The slit SLT may include a plurality of first slit portions SLT1_1 extending in the first direction DR1 and a plurality of second slit portions SLT2_1 extending in the second direction DR2. The plurality of first slit portions SLT1_1 may be connected with the plurality of second slit portions SLT2_1. Each of the second slit portions SLT2_1 may connect two first slit portions SLT1_1 closest to each other among the first slit portions SLT1_1. The second slit portions SLT2_1 may be alternately disposed on the right and left sides of the shielding pattern BMLa.

The shielding pattern BMLa may be divided into first to fourth sections PAR1 to PAR4 by the first slit portions SLT1_1 and the second slit portions SLT2_1. Eddy currents EDC may be formed into a small loop in the first to fourth sections PAR1 to PAR4. The slit SLT may prevent the eddy currents EDC from being formed into a large loop.

Figure 10E:
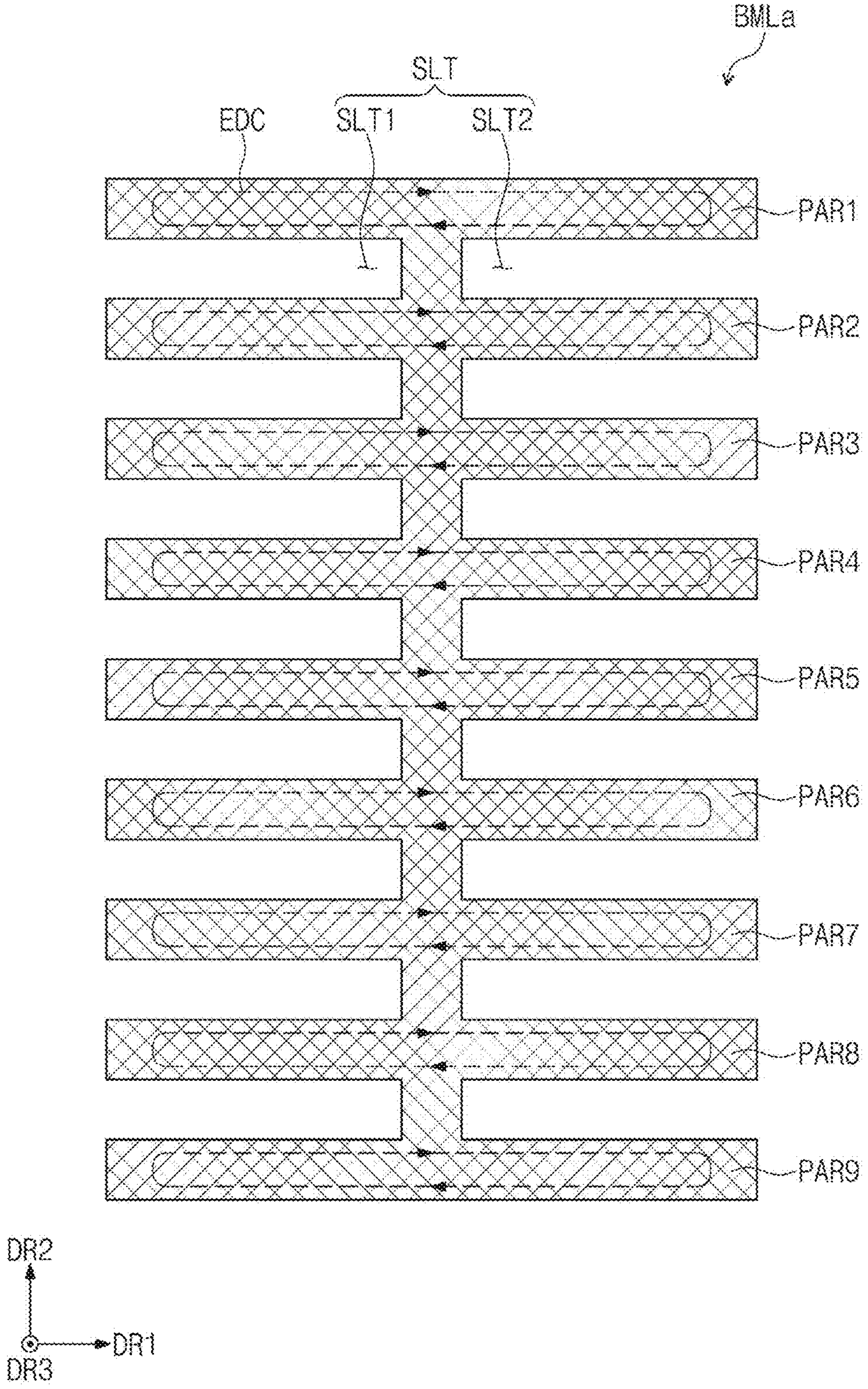

Referring to FIG. 10E, the shielding pattern BMLa may have a plurality of slits SLT defined therein. The plurality of slits SLT may include first and second slits SLT1 and SLT2 extending in the first direction DR1. The first slits SLT1 may extend from the left surface of the shielding pattern BMLa toward a center portion of the shielding pattern BMLa. The center portion may extend in the second direction DR2. The first slits SLT1 may be arranged in the second direction DR2. The second slits SLT2 may extend from the right surface of the shielding pattern BMLa toward the center portion of the shielding pattern BMLa. The second slits SLT2 may be arranged in the second direction DR2. Each of the first slits SLT1 and a corresponding one of the second slits SLT2 may be disposed in the same position in the second direction DR2. The pair of the first and second slits SLT1 and SLT2 at the same position in the second direction DR2 may be disposed on the left and right sides of the center portion of the shielding pattern BMLa.

The shielding pattern BMLa may be divided into first to ninth sections PAR1 to PAR9 by the first slits SLT1 and the second slits SLT2. In an embodiment, each of the first and second slits SLT1 and SLT2 may be an open ended slit surrounded by the center portion and two adjacent sections of the first to ninth section PAR1 to PAR9, and a farther end of each slit SLT from the center portion of the shielding pattern BMLa is open. Eddy currents EDC may be formed into a small loop in the first to ninth sections PAR1 to PAR9. The plurality of slits SLT may prevent the eddy currents EDC from being formed into a large loop.

Figure 11A:
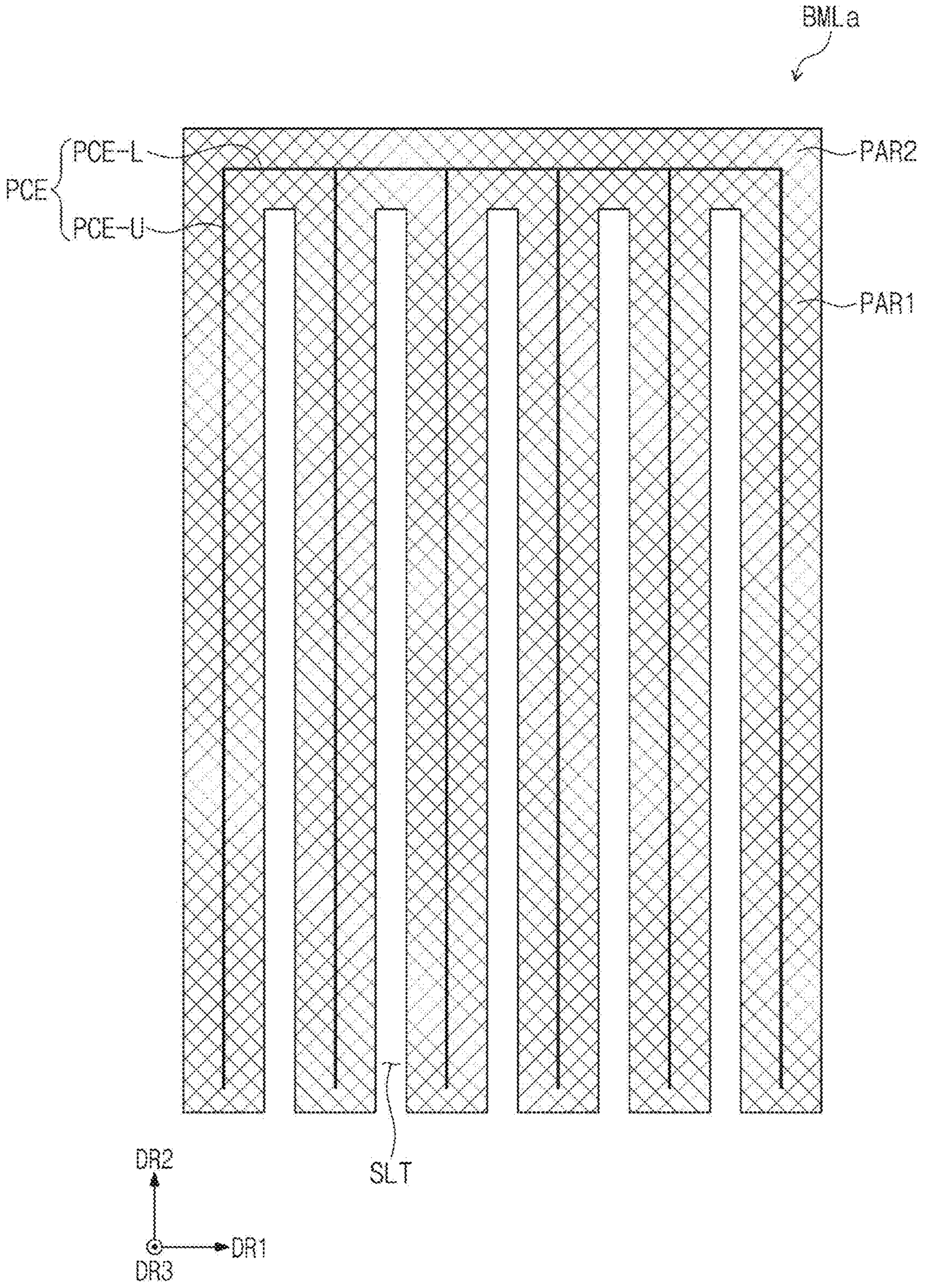
FIGS. 11A to 11C are plan views of a shielding pattern and a charging electrode according to an embodiment of the present disclosure.
Figure 11B:
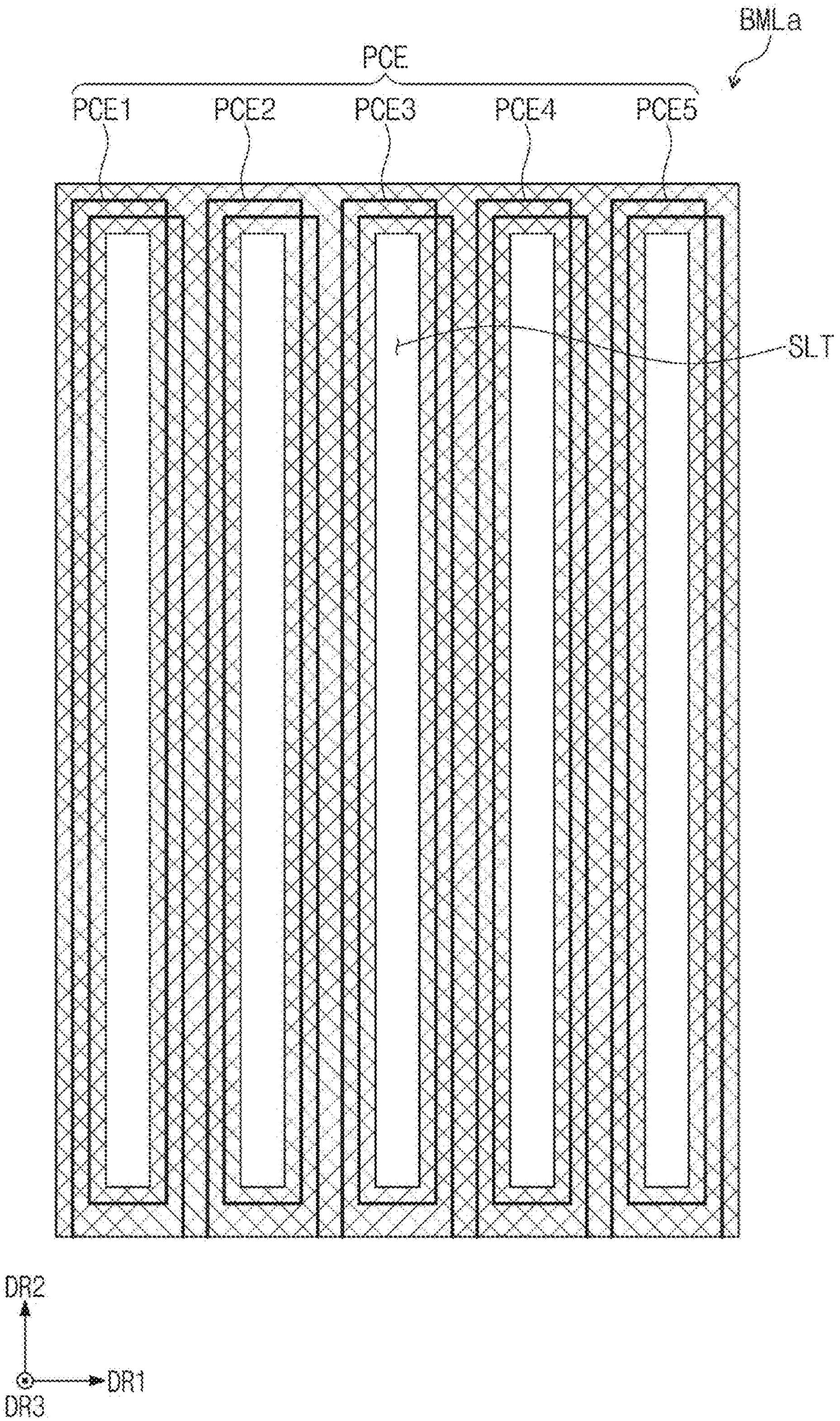
Figure 11C:
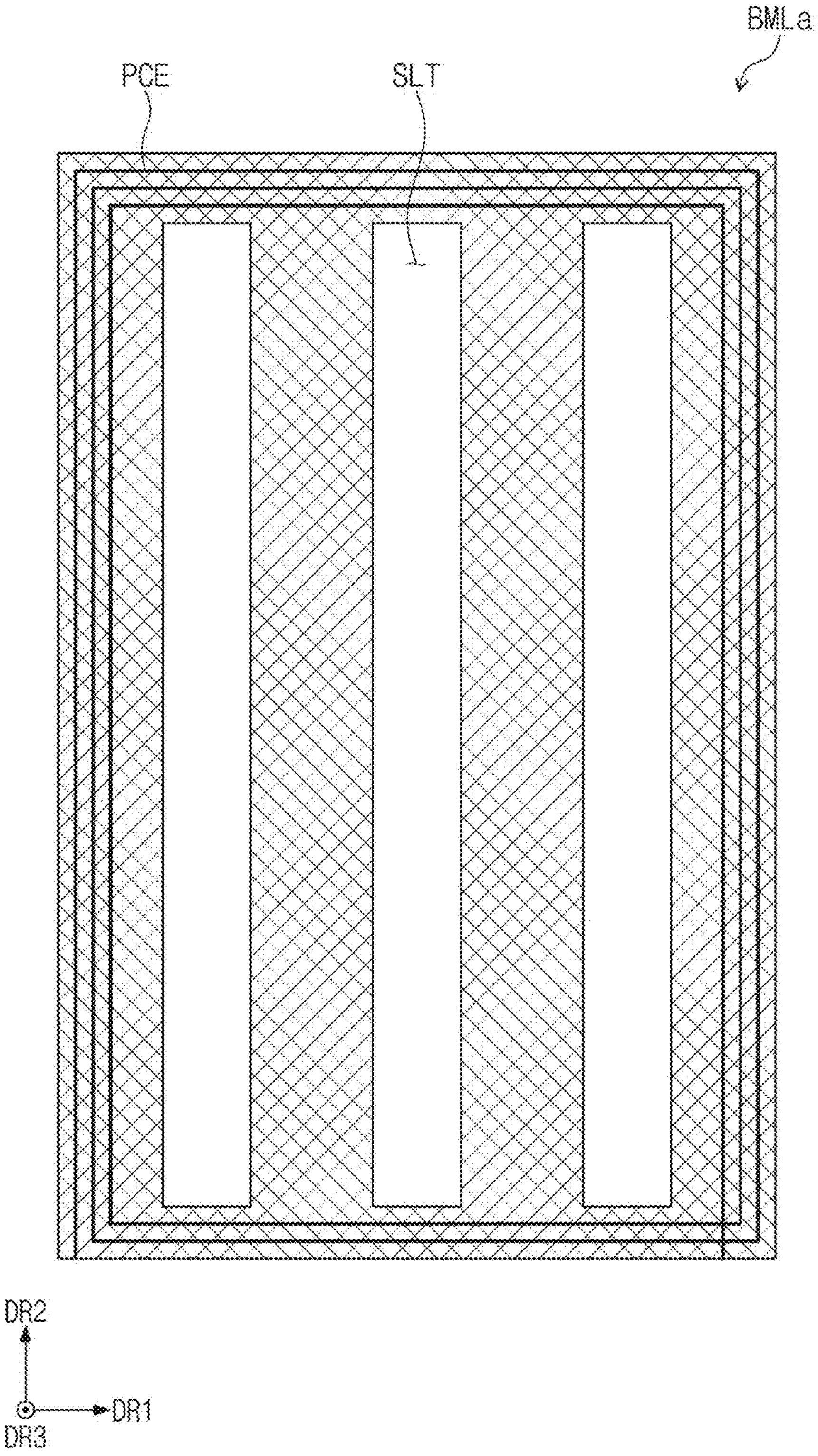

FIGS. 11A to 11C are plan views of the shielding pattern BMLa and the charging electrode PCE according to an embodiment of the present disclosure.

Referring to FIGS. 11A to 11C, the charging electrode PCE may have various shapes. The shielding pattern BMLa may cover the charging electrode PCE when viewed from above the plane. The shielding pattern BMLa may have a shape corresponding to the charging electrode PCE. The shielding pattern BMLa may be disposed to cover the top of the charging electrode PCE when viewed from above the plane. Accordingly, the shielding pattern BMLa may prevent parasitic capacitance and a magnetic field generated by the charging electrode PCE from deteriorating the characteristics of the semiconductor pattern, the conductive pattern, and the signal line included in the driving element layer 120 (refer to FIGS. 7A and 7B). In FIGS. 11A to 11C, for convenience, the charging electrode PCE is illustrated by solid lines without regard to the width of the charging electrode PCE.

Referring to FIG. 11A, the charging electrode PCE may include the first partial electrodes PCE-U extending in the second direction DR2 and having a bar shape and the second partial electrode PCE-L extending in the first direction DR1 and having a bar shape. The shape of the charging electrode PCE illustrated in FIG. 11A may be the same as the shape of the charging electrode PCE as described with reference to FIG. 8.

The plurality of slits SLT that extend in the second direction DR2 and that are arranged in the first direction DR1 so as to be spaced apart from each other may be defined in the shielding pattern BMLa. The shielding pattern BMLa may include the first sections PAR1 that extend in the second direction DR2 and that are arranged in the first direction DR1 and the second section PAR2 that extends in the first direction DR1 and that is connected with the first sections PAR1. The shielding pattern BMLa may have a shape corresponding to the charging electrode PCE. The first sections PAR1 may cover the first partial electrodes PCE-U when viewed from above the plane. The second section PAR2 may cover the second partial electrode PCE-L when viewed from above the plane. The plurality of slits SLT may not expose the charging electrode PCE when viewed from above the plane. For example, the charging electrode PCE may be disposed in spaces between two adjacent slits of the plurality of slits SLT when viewed from above the plane.

Referring to FIG. 11B, the charging electrode PCE may be a multi-coil. The charging electrode PCE may include first to fifth charging electrodes PCE1 to PCE5. Each of the first to fifth charging electrodes PCE1 to PCE5 may have a coil shape wound at least once when viewed from above the plane. Each of the first to fifth charging electrodes PCE1 to PCE5 may have a coil shape that is long in the second direction DR2. The first to fifth charging electrodes PCE1 to PCE5 may be arranged in the first direction DR1 so as to be spaced apart from each other.

The shielding pattern BMLa may have a shape corresponding to the first to fifth charging electrodes PCE1 to PCE5. The shielding pattern BMLa may cover the first to fifth charging electrodes PCE1 to PCE5 when viewed from above the plane. The plurality of slits SLT defined in the shielding pattern BMLa may not expose the first to fifth charging electrodes PCE1 to PCE5. For example, the first to fifth charging electrodes PCE1 to PCE5 may be disposed in spaces between two adjacent slits of the plurality of slits SLT. The plurality of slits SLT may be disposed within the coil shapes of the first to fifth charging electrodes PCE1 to PCE5 when viewed from above the plane. The plurality of slits SLT may extend in the second direction DR2 and may be arranged in the first direction DR1.

Referring to FIG. 11C, the charging electrode PCE may be a single coil. The charging electrode PCE may be one large coil. The shielding pattern BMLa may have a shape corresponding to the charging electrode PCE. However, the plurality of slits SLT may be arranged in the first direction DR1 to divide the shielding pattern BMLa into smaller regions. The shielding pattern BMLa may cover the charging electrode PCE when viewed from above the plane.

Figure 12:
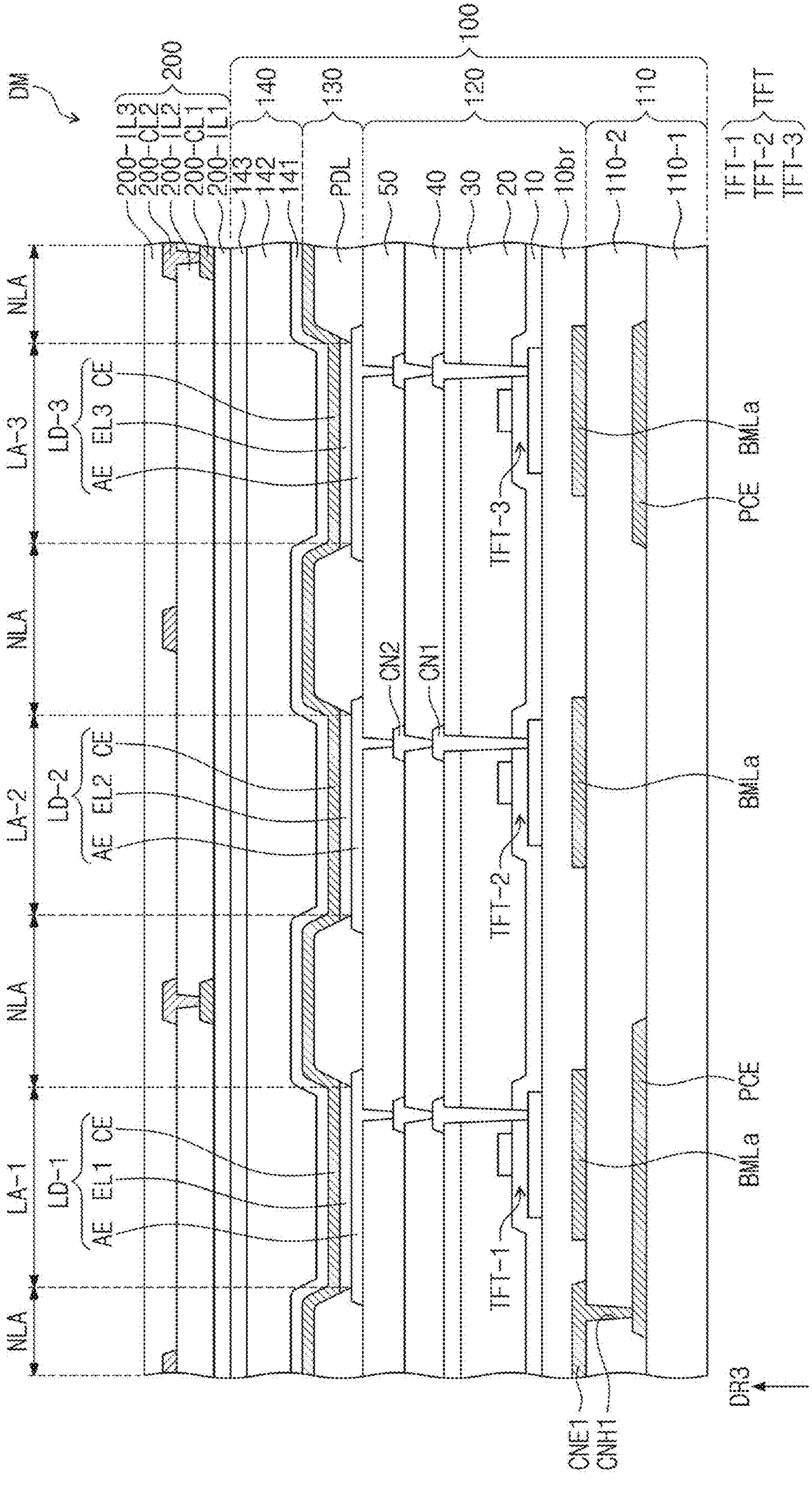
FIG. 12 is a sectional view of a portion of a display module according to an embodiment of the present disclosure.

FIG. 12 is a sectional view of a portion of the display module DM according to an embodiment of the present disclosure. Hereinafter, components identical to the components described with reference to FIG. 7A will be assigned with the identical reference numerals, and descriptions thereabout will be omitted.

Referring to FIG. 12, the shielding pattern BMLa may cover the first to third transistors TFT-1 to TFT-3 when viewed from above the plane. The shielding pattern BMLa may be disposed under the first to third transistors TFT-1 to TFT-3. The shielding pattern BMLa may be disposed to cover the lower surfaces of the first to third transistors TFT-1 to TFT-3. The shielding pattern BMLa may prevent the charging electrode PCE from affecting the first to third transistors TFT-1 to TFT-3. For example, the shielding pattern BMLa may prevent parasitic capacitance and a magnetic field generated by the charging electrode PCE from deteriorating the characteristics of the first to third transistors TFT-1 to TFT-3.

Figure 13A:
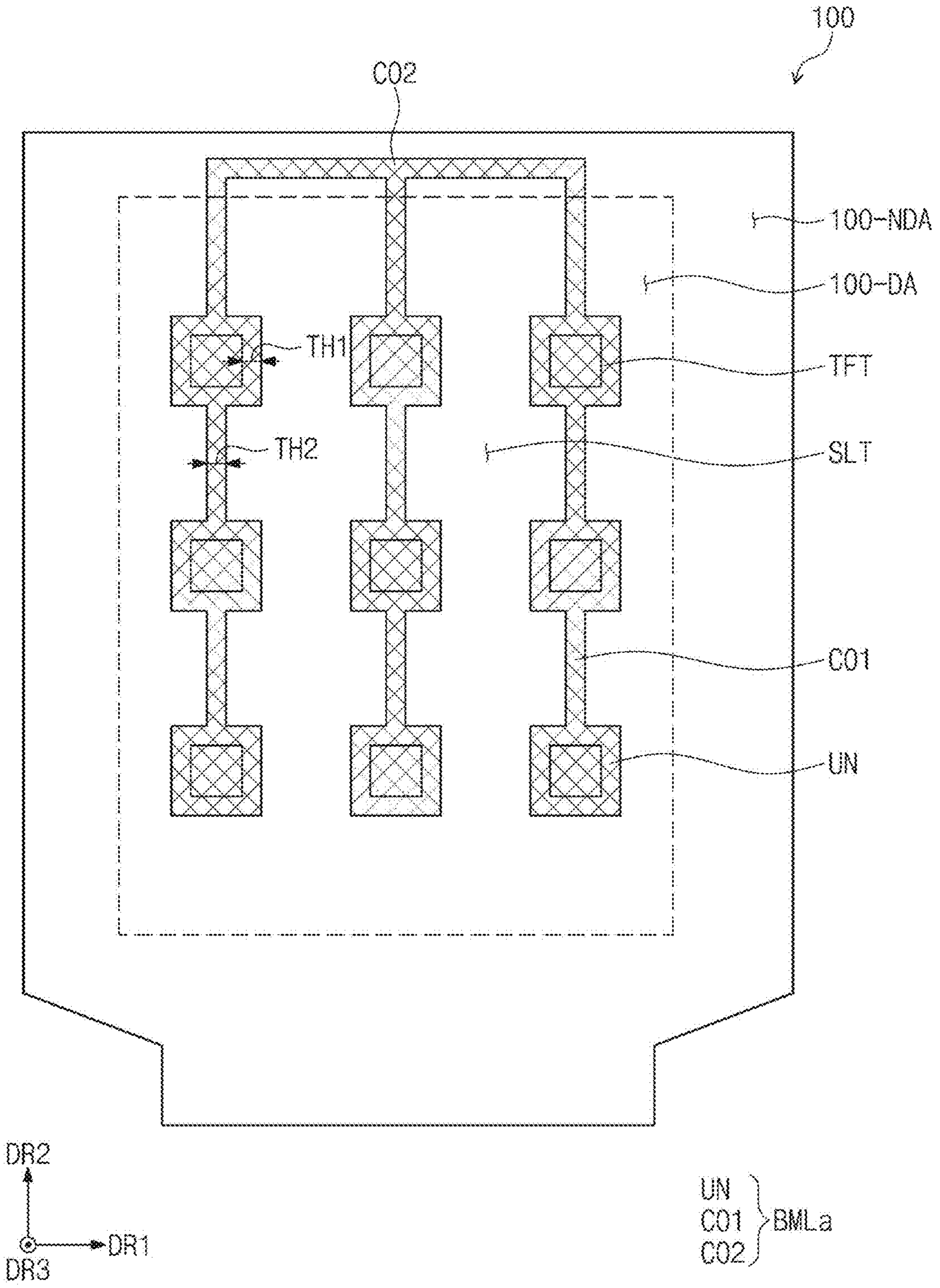
FIGS. 13A to 13E are plan views of transistors and a shielding pattern according to an embodiment of the present disclosure.
Figure 13B:
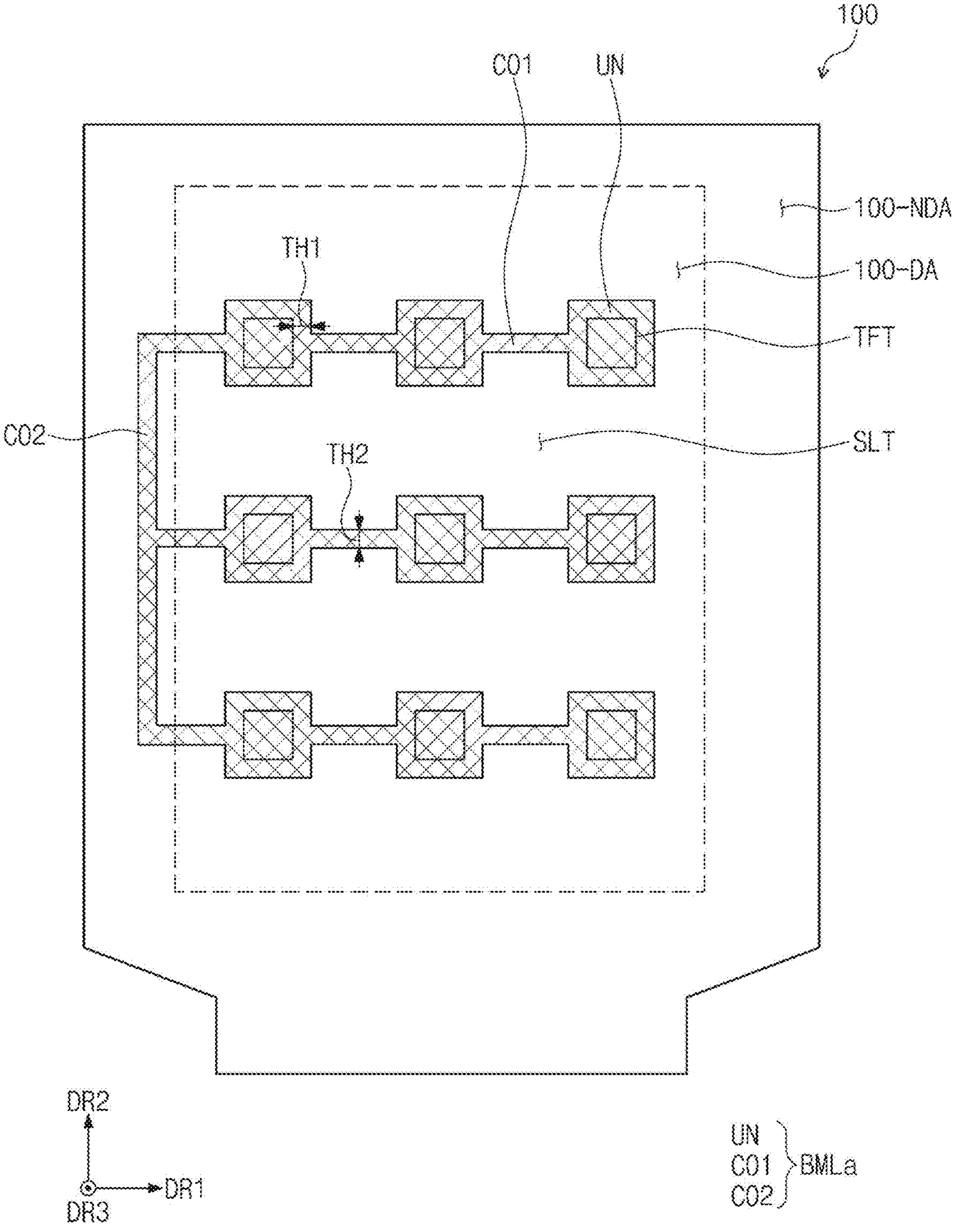
Figure 13C:
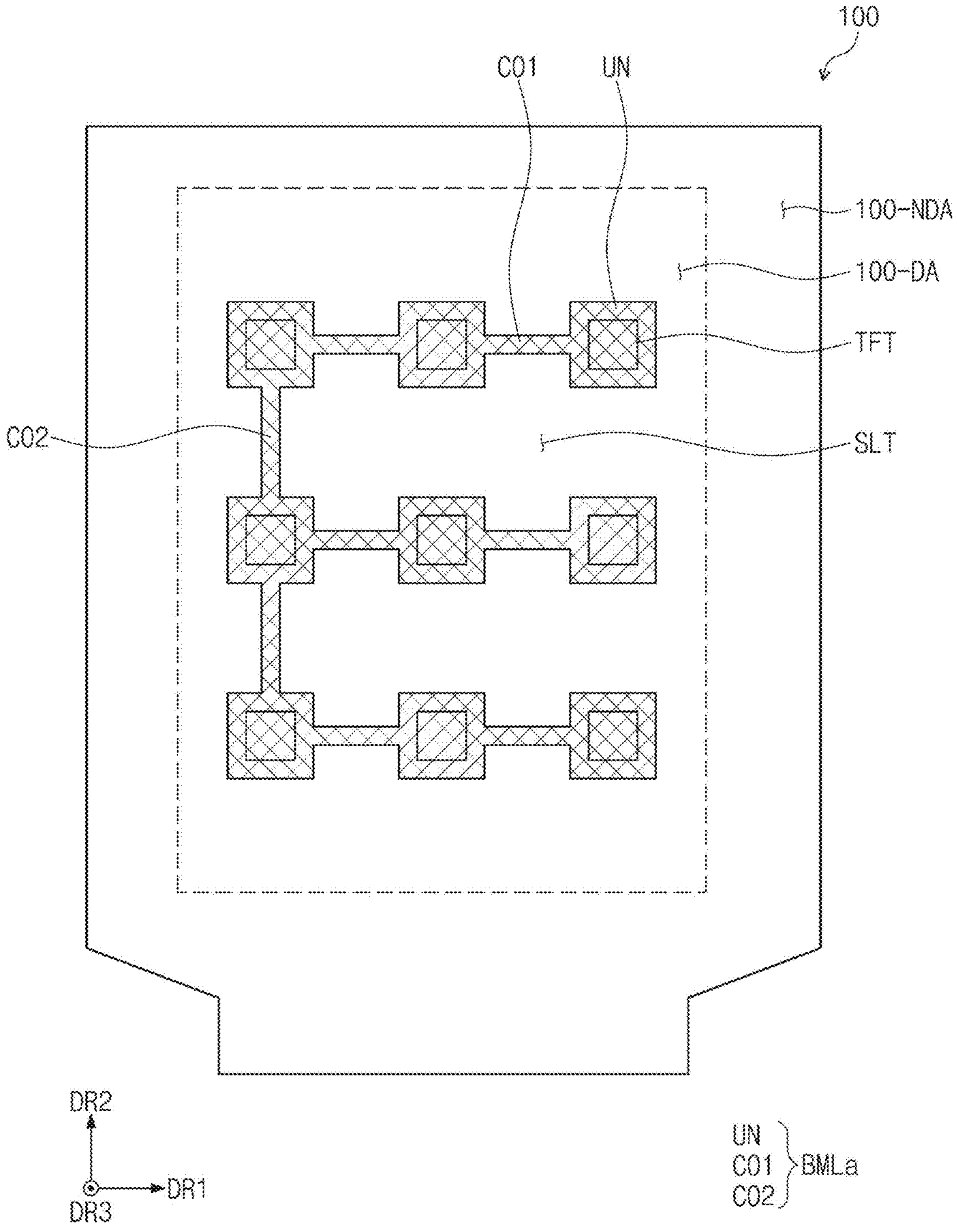
Figure 13D:
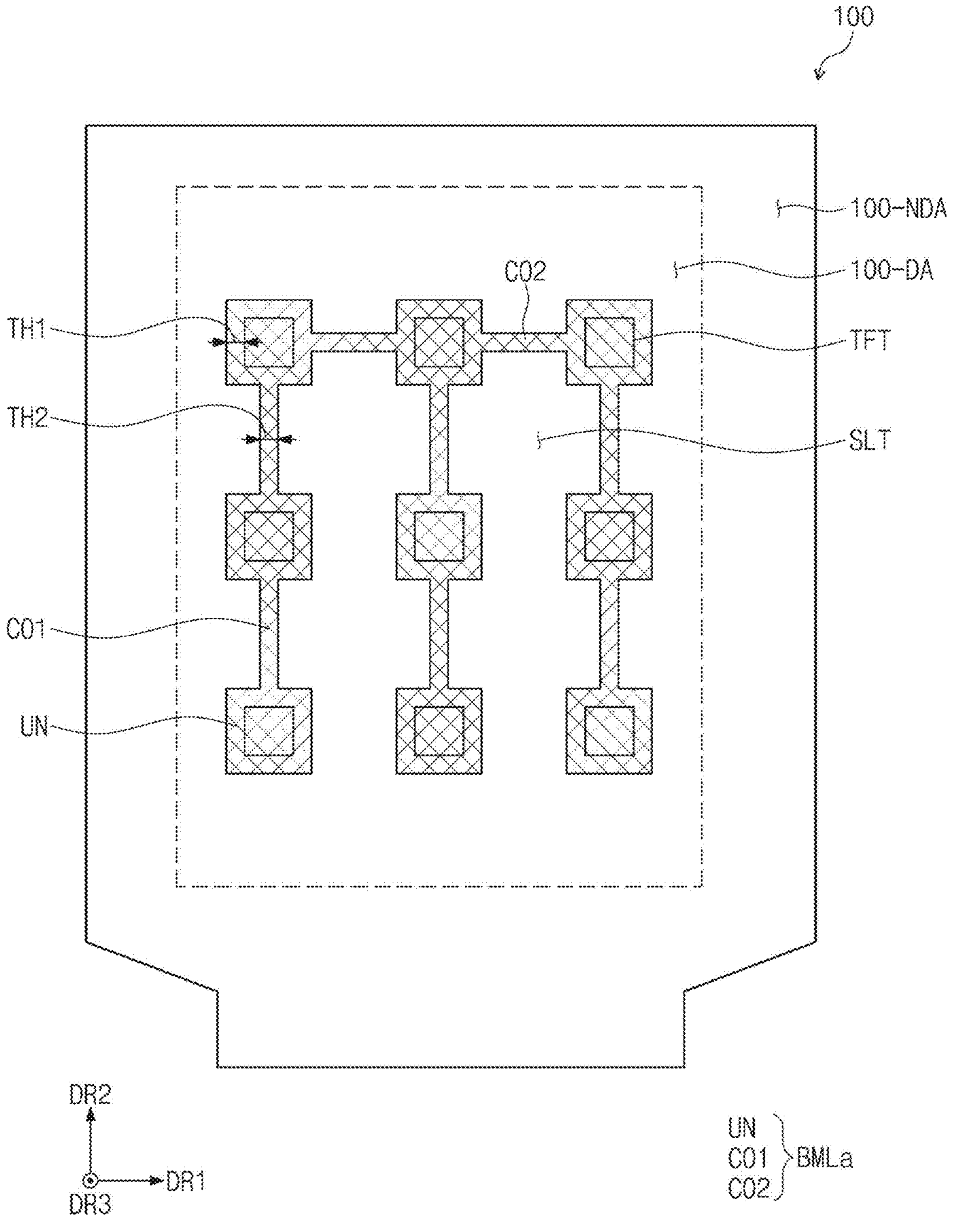
Figure 13E:
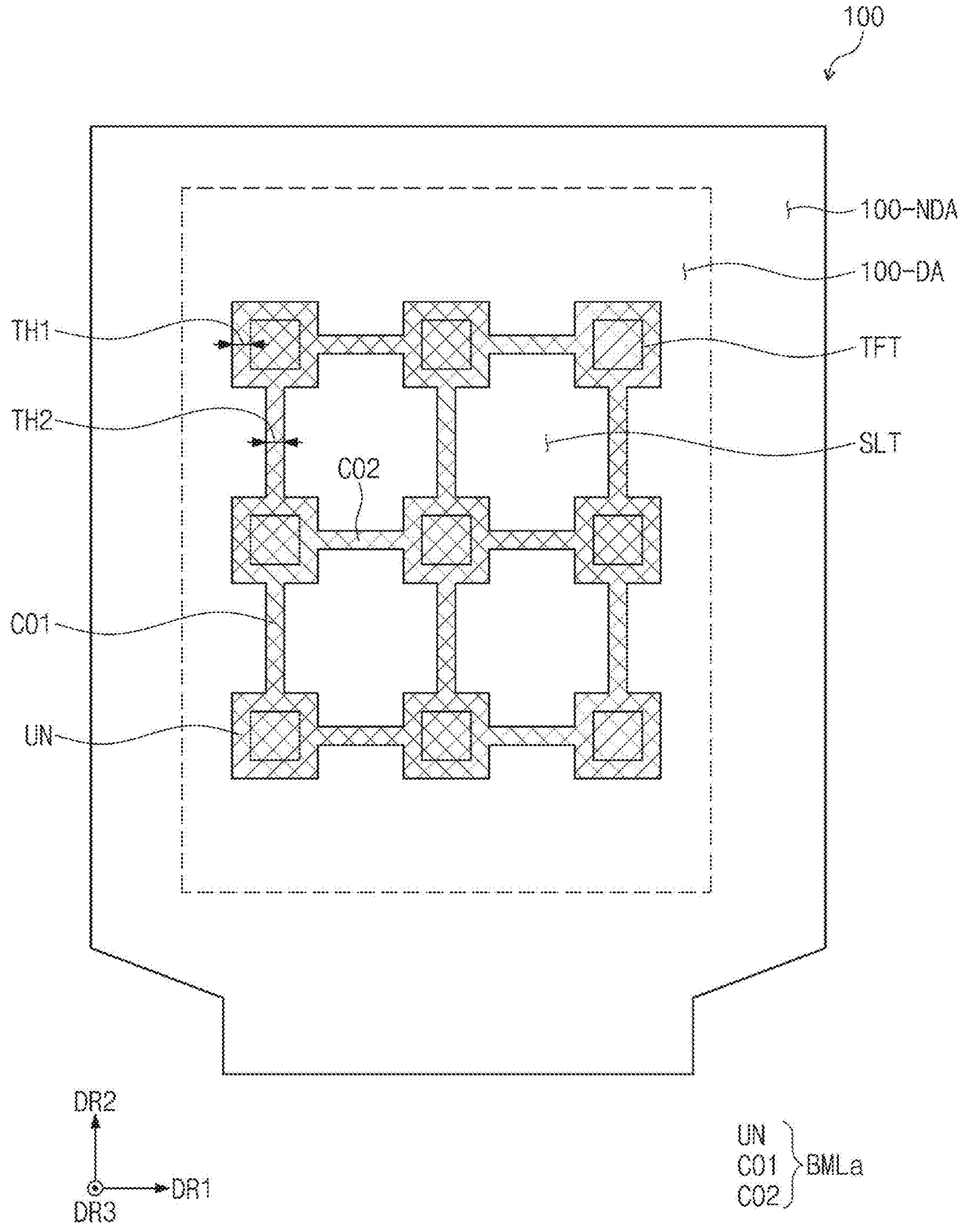

FIGS. 13A to 13E are plan views of transistors TFT and a shielding pattern BMLa according to an embodiment of the present disclosure. In FIGS. 13A and 13E, the shielding pattern BMLa and nine transistors TFT are illustrated.

Referring to FIGS. 13A to 13E, the shielding pattern BMLa may be divided into a plurality of sections by a slit SLT. The slit SLT may not overlap the transistors TFT when viewed from above the plane. The shielding pattern BMLa may include a plurality of unit patterns UN that cover the transistors TFT when viewed from above the plane and connecting patterns CO1 and CO2 that connect the plurality of unit patterns UN with each other. For example, each of the plurality of unit patterns UN may cover the entirety of a corresponding transistor of the transistors TFT. The plurality of unit patterns UN may be a plurality of sections of the shielding pattern BMLa, respectively. The planar areas of the plurality of unit patterns UN may be greater than the planar areas of the transistors TFT.

Referring to FIG. 13A, the shielding pattern BMLa may include the plurality of unit patterns UN and the first and second connecting patterns CO1 and CO2. The outer surfaces of the unit patterns UN may be spaced apart from the outer surfaces of the transistors TFT by a first distance TH1. Accordingly, the shielding pattern BMLa may be prevented from failing to cover the transistors TFT due to an error between layers in a process of forming the shielding pattern BMLa and a process of forming the transistors TFT.

The plurality of unit patterns UN may be connected by the first and second connecting patterns CO1 and CO2. The plurality of first connecting patterns CO1 may extend in the second direction DR2 and may connect the unit patterns UN arranged in the second direction DR2. The second connecting pattern CO2 may connect ends of the plurality of first connecting patterns CO1. The second connecting pattern CO2 may extend in the first direction DR1. The shielding pattern BMLa may be open in the direction opposite to the second direction DR2 when viewed from above the plane.

The second connecting pattern CO2 may overlap the non-display region 100-NDA located on the upper side of the display panel 100. A width TH2 of the first and second connecting patterns CO1 and CO2 may be the minimum line width to be formed by a lithography equipment such as a stepper, which forms the shape of the shielding pattern BMLa in a photolithograph process. Accordingly, the second connecting pattern CO2 may be prevented from occupying the space of the display region 100-DA where a plurality of lines are disposed.

Referring to FIG. 13B, the plurality of first connecting patterns CO1 may extend in the first direction DR1 and may connect the unit patterns UN arranged in the first direction DR1. The second connecting pattern CO2 may connect ends of the plurality of first connecting patterns CO1. The second connecting pattern CO2 may extend in the second direction DR2. The second connecting pattern CO2 may overlap the non-display region 100-NDA adjacent to a side surface of the display panel 100.

Referring to FIG. 13C, the plurality of first connecting patterns CO1 may extend in the first direction DR1 and may connect the unit patterns UN arranged in the first direction DR1. The second connecting pattern CO2 may extend in the second direction DR2 and may connect the unit patterns UN arranged in the second direction DR2. The second connecting pattern CO2 may overlap the display region 100-DA. The second connecting pattern CO2 may be disposed adjacent to one side of the display region 100-DA. The shielding pattern BMLa may be open in the first direction DR1.

Referring to FIG. 13D, the plurality of first connecting patterns CO1 may extend in the second direction DR2 and may connect the unit patterns UN arranged in the second direction DR2. The second connecting pattern CO2 may extend in the first direction DR1 and may connect the unit patterns UN arranged in the first direction DR1. The second connecting pattern CO2 may overlap the display region 100-DA. The second connecting pattern CO2 may be disposed adjacent to the upper side of the display region 100-DA. The shielding pattern BMLa may be open in the direction opposite to the second direction DR2.

Referring to FIG. 13E, the plurality of first connecting patterns CO1 may extend in the second direction DR2 and may connect the unit patterns UN arranged in the second direction DR2. The plurality of second connecting patterns CO2 may extend in the first direction DR1 and may connect the unit patterns UN arranged in the first direction DR1. One unit pattern UN may be connected with adjacent unit patterns UN in the second direction DR2 by the first connecting patterns CO1. One unit pattern UN may be connected with adjacent unit patterns UN in the first direction DR1 by the second connecting patterns CO2. Slits SLT may be disposed between the adjacent transistors TFT. Two unit patterns UN closest to each other among the plurality of unit patterns UN may be connected with each other by the first connecting pattern CO1 or the second connecting pattern CO2.

Figure 14A:
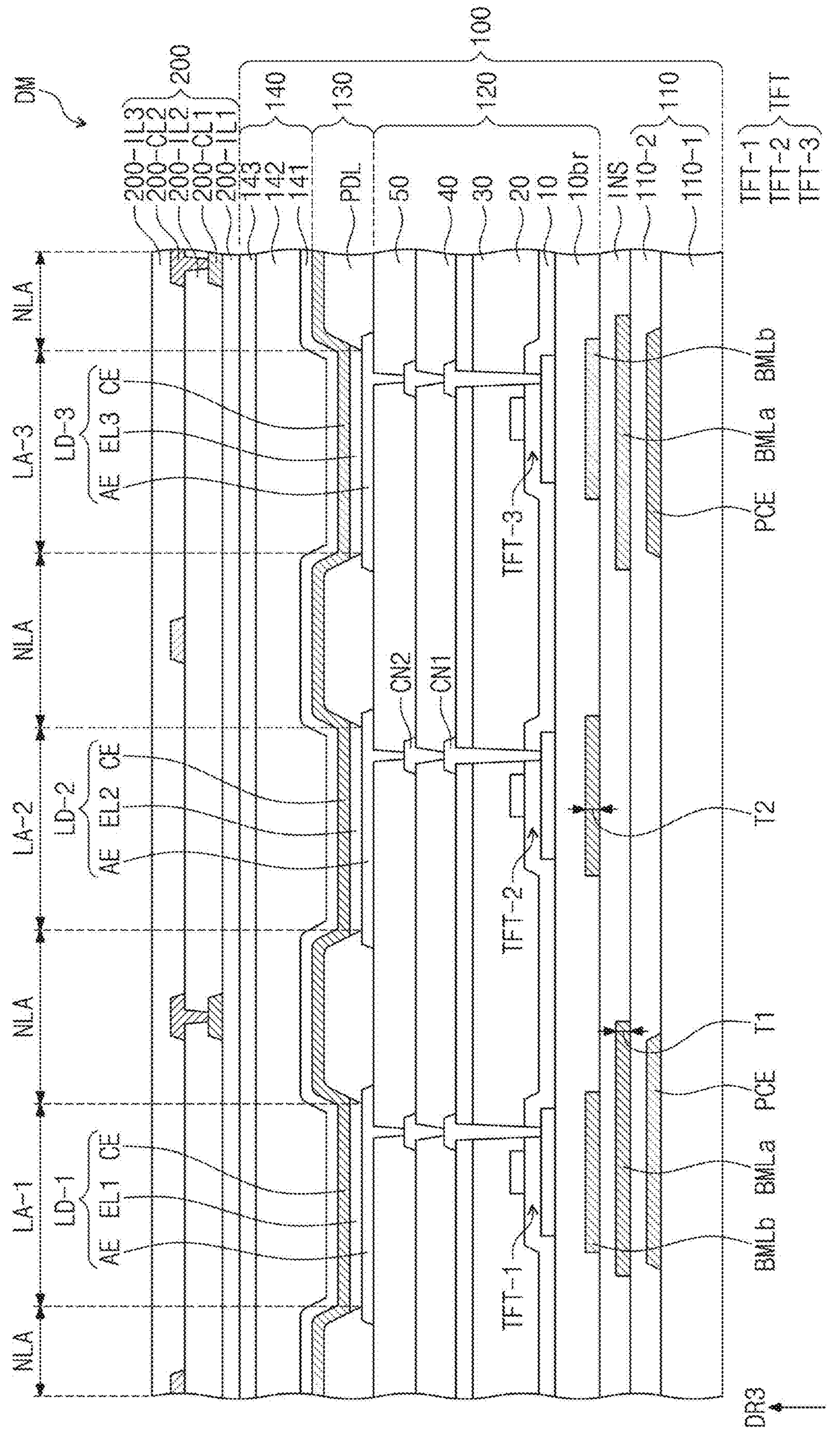
FIGS. 14A and 14B are sectional views of a portion of a display module according to an embodiment of the present disclosure.
Figure 14B:
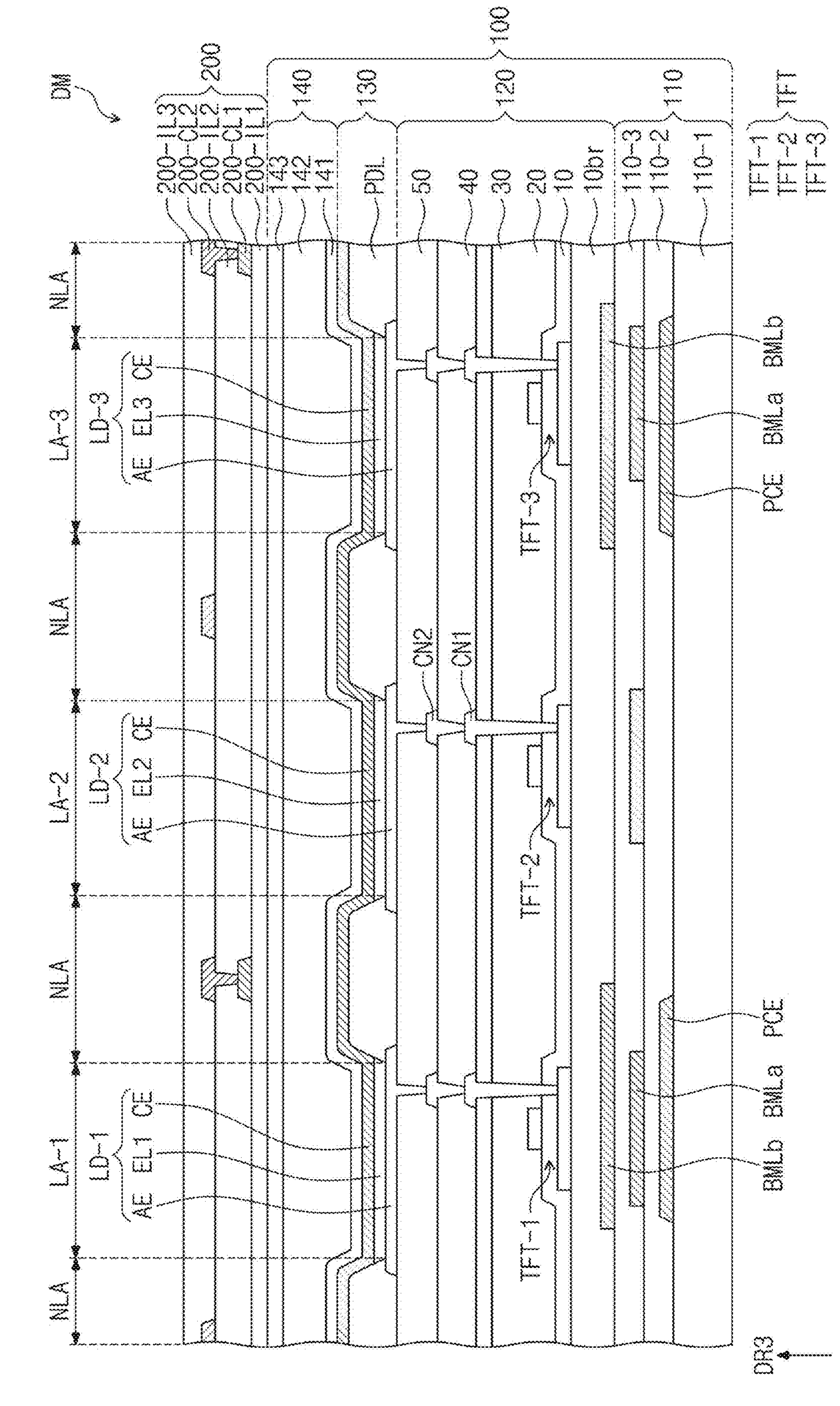

FIGS. 14A and 14B are sectional views of a portion of the display module DM according to an embodiment of the present disclosure. Hereinafter, components identical to the above-described components will be assigned with the identical reference numerals, and descriptions thereabout will be omitted.

Referring to FIGS. 14A and 14B, the display module DM may further include an insulating layer INS and a second shielding pattern BMLb. The insulating layer INS may be disposed on the base layer 110 and may cover an shielding pattern (or, a first shielding pattern) BMLa. The insulating layer INS may be disposed between the first shielding pattern BMLa and the second shielding pattern BMLb. The insulating layer INS may include an insulating material and may prevent electrical connection between the first shielding pattern BMLa and the second shielding pattern BMLb.

The second shielding pattern BMLb may be disposed on the insulating layer INS and may overlap the display region 100-DA (refer to FIG. 5). The relation of Equation 1 regarding the first thickness T1 of the first shielding pattern BMLa may apply to the second thickness T2 of the second shielding pattern BMLb. For example, the second thickness T2 of the second shielding pattern BMLb may satisfy the relation of Equation 1 as described above to secure the charging efficiency of the charging electrode PCE.

Referring to FIG. 14A, the first shielding pattern BMLa may cover the charging electrode PCE when viewed from above the plane, and the second shielding pattern BMLb may cover the transistors TFT when viewed from above the plane. Since the first shielding pattern BMLa and the second shielding pattern BMLb, when viewed from above the plane, cover the charging electrode PCE and the transistors TFT as described above, the charging electrode PCE may be prevented from deteriorating the characteristics of the transistors TFT.

Referring to FIG. 14B, the first shielding pattern BMLa may cover the transistors TFT when viewed from above the plane, and the second shielding pattern BMLb may cover the charging electrode PCE when viewed from above the plane.

Figure 15:
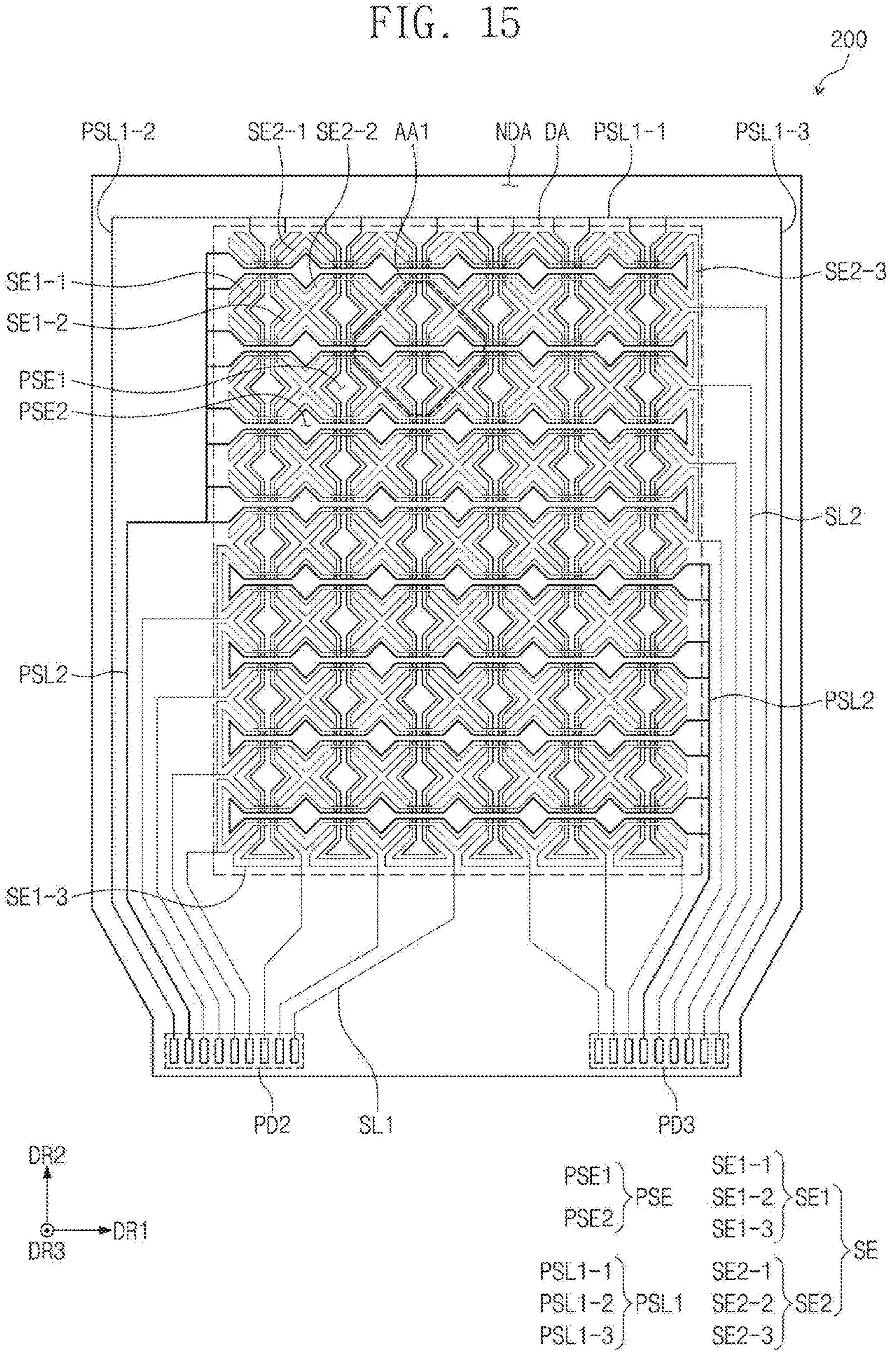
FIG. 15 is a plan view of an input sensor according to an embodiment of the present disclosure.

FIG. 15 is a plan view of the input sensor 200 according to an embodiment of the present disclosure.

Referring to FIG. 15, the input sensor 200 may sense a first input using a capacitance method and may sense a second input using an electromagnetic induction method. The first input may be an input by the user's body FG as described with reference to FIG. 1A, and the second input may be an input by the stylus pen STP as described with reference to FIG. 1A. For example, the first input may be an input capable of causing a change in capacitance, and the second input may be an input that provides a magnetic field signal.

The input sensor 200 may sense the first input and the second input through time division driving. The input sensor 200 may include sensing electrodes for sensing the first input and the second input. A period in which the input sensor 200 operates in a first mode to sense the first input may be defined as a first operation period, and a period in which the input sensor 200 operates in a second mode to sense the second input may be defined as a second operation period. The input sensor 200 may be switched between the first mode and the second mode through selection by the user. In an embodiment, one of the first mode and the second mode may be activated, or the input sensor 200 may be switched between the first mode and the second mode, by activation of a specific application. The input sensor 200 may be maintained in the first mode when the first input is sensed while the input sensor 200 alternately operates in the first mode and the second mode, or may be maintained in the second mode when the second input is sensed while the input sensor 200 alternately operates in the first mode and the second mode.

The sensing electrodes of the input sensor 200 may include a first group of electrodes SE for sensing the first input and a second group of electrodes PSE for sensing the second input. Although six first electrodes PSE1 and eight second electrodes PSE2 belonging to the second group are illustrated as an example, the input sensor 200 may include more first electrodes PSE1 and more second electrodes PSE2 that belong to the second group. Meanwhile, the shapes of the first group of electrodes SE and the second group of electrodes PSE are not limited to those illustrated in FIG. 15 and may be changed into various shapes for the detection of the first input and the second input by the input sensor 200.

The first group of electrodes SE may include first electrodes SE1 that are arranged in the first direction DR1 and that extend in the second direction DR2 and second electrodes SE2 that cross the first electrodes SE1. The first electrodes SE1 and the second electrodes SE2 of the first group may be capacitively coupled.

A drive circuit of the input sensor 200 provides a drive signal to one of the first electrodes SE1 and the second electrodes SE2 of the first group, and a sensing circuit of the input sensor 200 measures a change in the capacitance of a mutual capacitor formed between the first electrodes SE1 and the second electrodes SE2 of the first group through the other of the first electrodes SE1 and the second electrodes SE2 of the first group. After the above-described operation is executed during a first section of the first operation period, the above-described operation may be executed in reverse during a second section of the first operation period. The first section and the second section as one set may be repeated.

The second group of electrodes PSE may include the first electrodes PSE1 that are arranged in the first direction DR1 and that extend in the second direction DR2 and the second electrodes PSE2 that cross the first electrodes PSE1. A magnetic field signal output from the stylus pen STP (refer to FIG. 1A) may be sensed through the first electrodes PSE1 and the second electrodes PSE2 of the second group. The drive circuit of the input sensor 200 provides a drive signal to at least one of the first electrodes PSE1 and the second electrodes PSE2 of the second group, and the sensing circuit of the input sensor 200 senses an electromagnetically induced current formed in the first electrodes PSE1 and the second electrodes PSE2 of the second group.

The input sensor 200 may include a first group of signal lines and a second group of signal lines. The first group of signal lines may include first signal lines SL1 connected to ends of the first electrodes SE1 of the first group and second signal lines SL2 connected to ends of the second electrodes SE2 of the first group, and the second group of signal lines may include a first signal line PSL1 connected to the first electrodes PSE1 of the second group and second signal lines PSL2 connected to ends of the second electrodes PSE2 of the second group.

The first electrodes SE1 and the second electrodes SE2 of the first group and the first electrodes PSE1 and the second electrodes PSE2 of the second group may be disposed in the display region DA. The first signal lines SL1 and the second signal lines SL2 of the first group and the first signal line PSL1 and the second signal lines PSL2 of the second group may be disposed in the non-display region NDA. The electrodes SE1, SE2, PSE1, and PSE2 and the signal lines SL1, SL2, PSL1, and PSL2 may be disposed on the same layer, or may be disposed on different layers.

The input sensor 200 may include second pads PD2 and third pads PD3. The second pads PD2 and the third pads PD3 may be disposed in regions spaced apart from each other in the first direction DR1. Each of the first signal lines SL1 and the second signal lines SL2 of the first group and the first signal line PSL1 and the second signal lines PSL2 of the second group may be connected to at least one corresponding pad among the second pads PD2 and the third pads PD3. The second pads PD2 and the third pads PD3 may be adjacent to the lower end of the input sensor 200 when viewed from above the plane. The first pads PD1 illustrated in FIG. 5 may be disposed between the second pads PD2 and the third pads PD3 when viewed from above the plane.

The input sensor 200 may be divided into a left region and a right region with respect to the center of the input sensor 200 in the first direction DR1. The second pads PD2 are disposed in the left region, and the third pads PD3 are disposed in the right region. The first signal lines SL1 of the first group that are connected to the first electrodes SE1 disposed in the left region may be connected to the second pads PD2. The first signal lines SL1 of the first group that are connected to the first electrodes SE1 disposed in the right region may be connected to the third pads PD3.

The input sensor 200 may be divided into an upper region and a lower region with respect to the center of the input sensor 200 in the second direction DR2. Some of the second signal lines SL2 of the first group may be connected to left ends of the second electrodes SE2 of the first group that are disposed in the lower region. The some of the second signal lines SL2 of the first group may be connected to the second pads PD2. The other second signal lines SL2 of the first group may be connected to right ends of the second electrodes SE2 of the first group that are disposed in the upper region. The other second signal lines SL2 of the first group may be connected to the third pads PD3.

Each of the first electrodes SE1 of the first group may include a first extending portion SE1-1 and a second extending portion SE1-2 that extend in the second direction DR2 and that are spaced apart from each other in the first direction DR1. The first extending portion SE1-1 and the second extending portion SE1-2 may have shapes symmetrical to each other (e.g., horizontally symmetrical to each other) with respect to the second direction DR2. The first electrode PSE1 of the second group may be disposed between the first extending portion SE1-1 and the second extending portion SE1-2.

Each of the first electrodes SE1 of the first group may further include a first intermediate portion SE1-3. In FIG. 15, the first intermediate portion SE1-3 disposed in the lower region is illustrated as an example. The first intermediate portion SE1-3 may not be disposed in the upper region. The first intermediate portion SE1-3 may extend in the first direction DR1. The first intermediate portion SE1-3 may be disposed between one end of the first extending portion SE1-1 and one end of the second extending portion SE1-2. The first signal line SL1 of the first group may be connected to the first intermediate portion SE1-3.

Each of the second electrodes SE2 of the first group may include a third extending portion SE2-1 and a fourth extending portion SE2-2 that extend in the first direction DR1 and that are spaced apart from each other in the second direction DR2. The third extending portion SE2-1 and the fourth extending portion SE2-2 may have shapes symmetrical to each other (e.g., vertically symmetrical to each other) with respect to the first direction DR1. The second electrode PSE2 of the second group may be disposed between the third extending portion SE2-1 and the fourth extending portion SE2-2.

Each of the second electrodes SE2 of the first group may further include a second intermediate portion SE2-3. The second intermediate portions SE2-3 of the second electrodes SE2 of the first group that are disposed in the upper region may be disposed on the right side and may not be disposed on the left side. The second intermediate portions SE2-3 of the second electrodes SE2 of the first group that are disposed in the lower region may be disposed on the left side.

The second intermediate portion SE2-3 may extend in the second direction DR2. The second intermediate portion SE2-3 may be disposed between one end of the third extending portion SE2-1 and one end of the fourth extending portion SE2-2. The second signal line SL2 of the first group may be connected to the second intermediate portion SE2-3.

The first electrodes PSE1 of the second group may extend in the second direction DR2 and may be spaced apart from each other in the first direction DR1. The first electrodes PSE1 of the second group may be disposed on the same layer as the first electrodes SE1 of the first group. The first electrodes PSE1 of the second group may be disposed between the first extending portions SE1-1 and the second extending portions SE1-2 of the first electrodes SE1 of the first group.

In the upper region, ends of the first electrodes PSE1 of the second group may be connected together through the first signal line PSL1 of the second group. One end of the first signal line PSL1 of the second group may be connected to the second pad PD2, and an opposite end of the first signal line PSL1 may be connected to the third pad PD3. The first signal line PSL1 of the second group may include a first portion PSL1-1 that extends in the first direction DR1 and that is connected to ends of the first electrodes PSE1 of the second group that are disposed in the upper region, a second portion PSL1-2 bent from the first portion PSL1-1 and connected to the second pad PD2, and a third portion PSL1-3 bent from the first portion PSL1-1 and connected to the third pad PD3.

The second electrodes PSE2 of the second group may extend in the first direction DR1 and may be spaced apart from each other in the second direction DR2. The second electrodes PSE2 of the second group may be disposed on the same layer as the second electrodes SE2 of the first group. The second electrodes PSE2 of the second group may be disposed between the third extending portions SE2-1 and the fourth extending portions SE2-2 of the second electrodes SE2 of the first group.

The left ends of the second electrodes PSE2 of the second group that are disposed in the upper region may be connected to one of the second signal lines PSL2 of the second group. The right ends of the second electrodes PSE2 of the second group that are disposed in the lower region may be connected to another one of the second signal lines PSL2 of the second group. However, a connection relationship between the second electrodes PSE2 of the second group and the second signal lines PSL2 of the second group is not limited to the above description. For example, in an embodiment of the present disclosure, all of the left or right ends of the second electrodes PSE2 of the second group may be connected to the same second signal line PSL2 of the second group.

Figure 16:
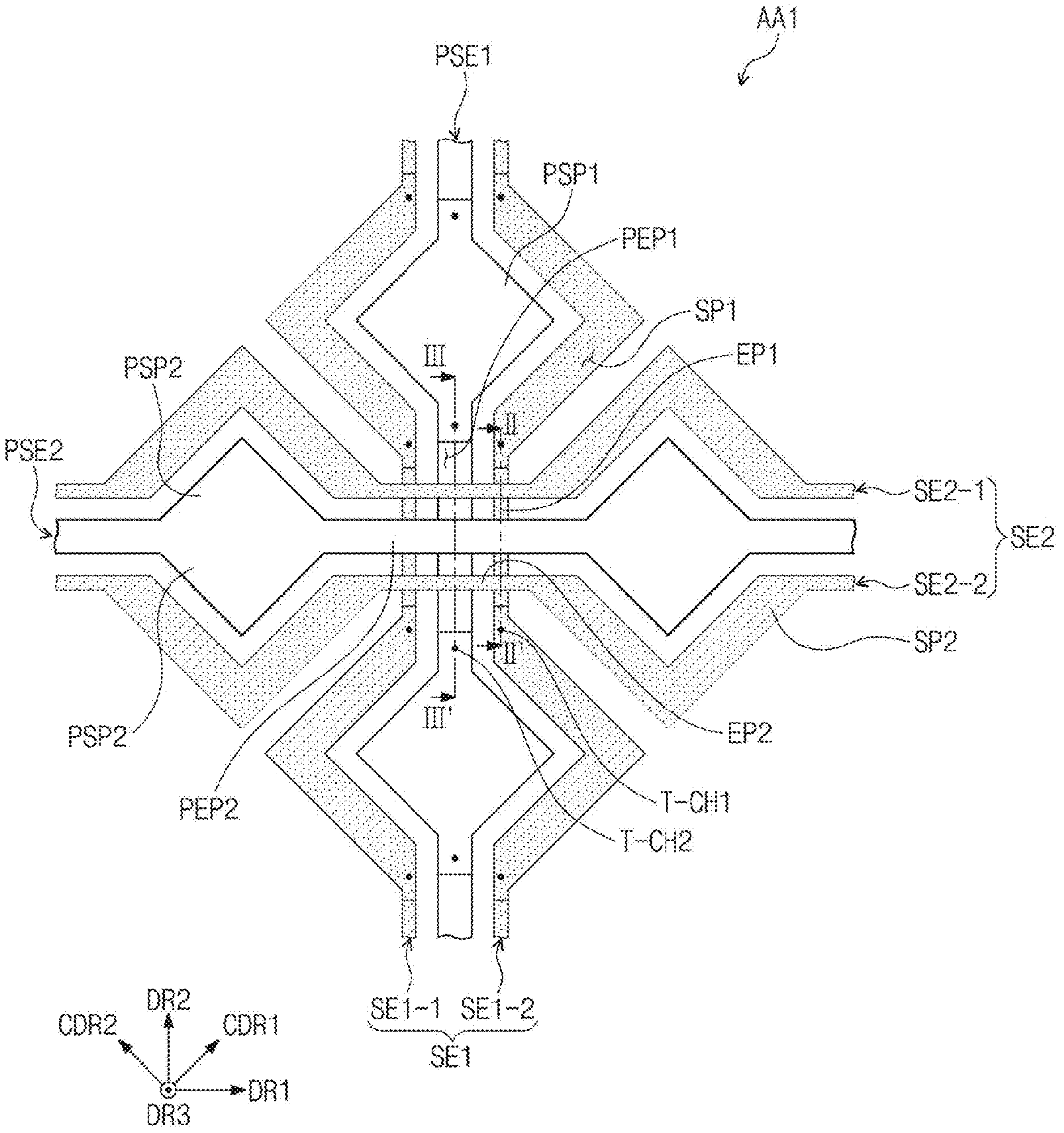
FIG. 16 is an enlarged plan view of a portion of an input sensor according to an embodiment of the present disclosure.
Figure 17:
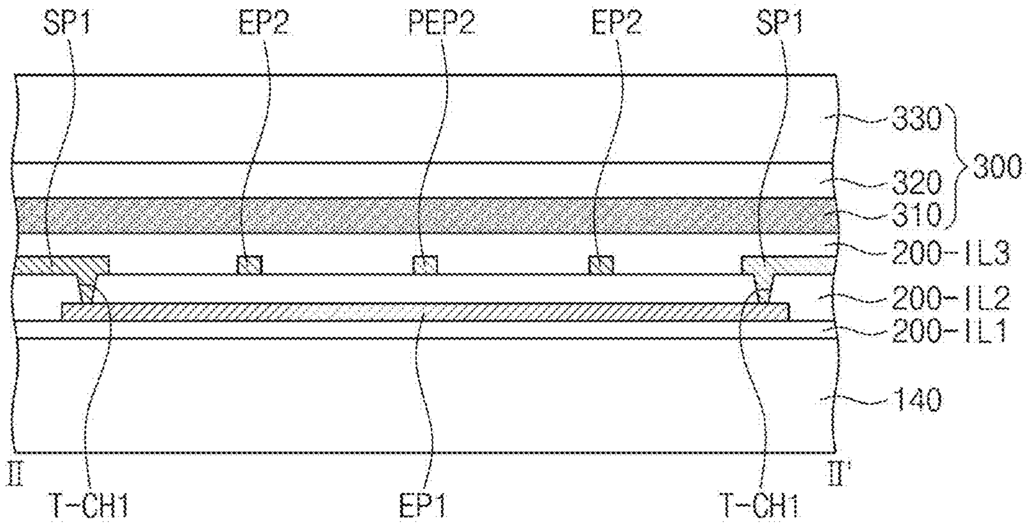
FIGS. 17 and 18 are sectional views of portions of an input sensor according to an embodiment of the present disclosure.
Figure 18:
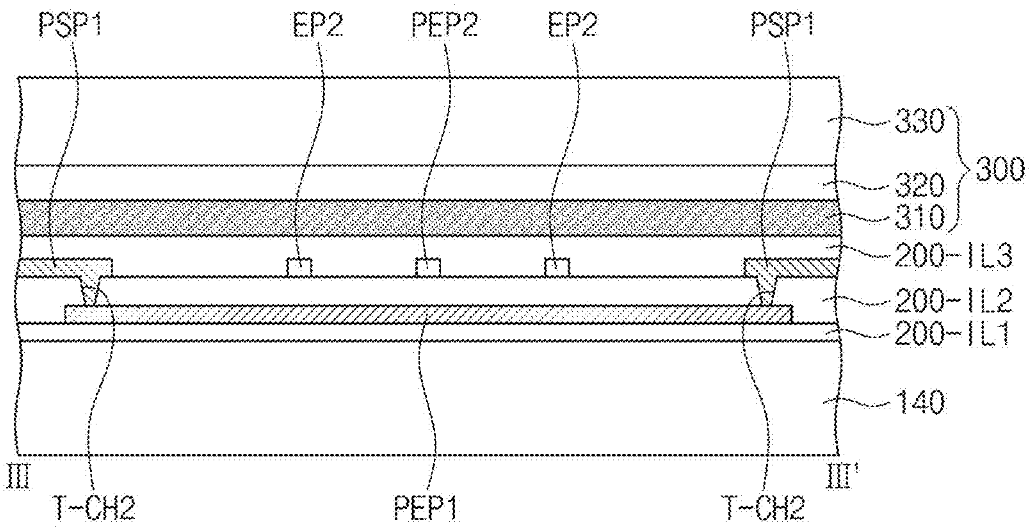
Figure 19:
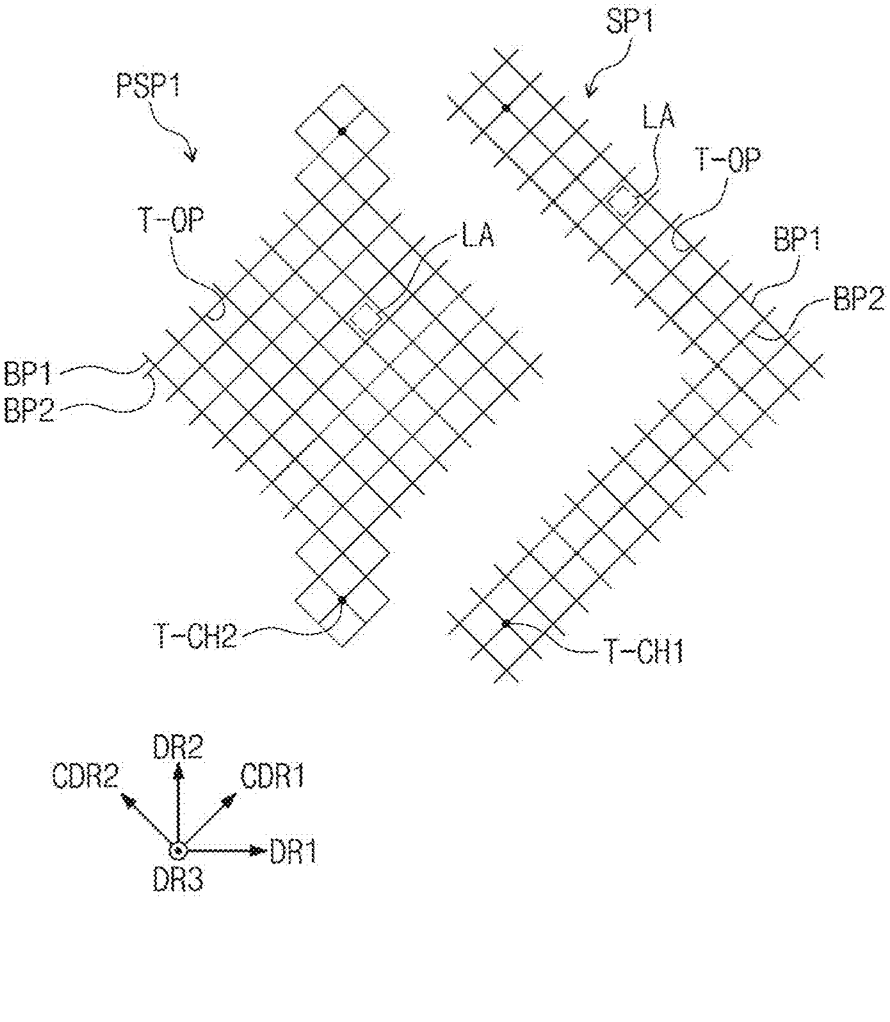
FIG. 19 is an enlarged plan view of a portion of an input sensor according to an embodiment of the present disclosure.

FIG. 16 is an enlarged plan view of a portion of the input sensor 200 according to an embodiment of the present disclosure. FIG. 16 is an enlarged plan view of intersection region AA1 of FIG. 15. FIGS. 17 and 18 are sectional views of portions of the input sensor 200 according to an embodiment of the present disclosure. FIG. 17 is a sectional view of the input sensor 200 corresponding to line II-II' of FIG. 16. FIG. 18 is a sectional view of the input sensor 200 corresponding to line III-III' of FIG. 16. FIG. 19 is an enlarged plan view of a portion of the input sensor 200 according to an embodiment of the present disclosure. FIG. 19 is an enlarged plan view illustrating some of the electrodes illustrated in FIG. 16.

Referring to FIGS. 16 and 17, each of the first extending portion SE1-1 and the second extending portion SE1-2 of the first electrode SE1 of the first group may include first sensing portions SP1 arranged in the second direction DR2 and first intermediate portions EP1 (or, intersection portions), each of which connects two sensing portions adjacent to each other among the first sensing portions SP1. The first sensing portions SP1 may have a bent shape. For example, the first sensing portions SP1 may have a shape bent to the left or right in the first direction DR1 to maintain a certain distance from the first electrode PSE1 of the second group. The first sensing portions SP1 may have a greater width than the first intermediate portions EP1.

The first intermediate portion EP1 is disposed on a layer different from the first sensing portions SP1. The first intermediate portion EP1 disposed under the second insulating layer 200-IL2 may correspond to a bridge. A bridge, such as the first intermediate portion EP1, may be disposed in a region where a first conductive pattern crosses a second conductive pattern. The bridge may constitute a portion of the first conductive pattern. The remaining portion of the first conductive pattern and the second conductive pattern may be disposed on a layer different from the bridge.

The first intermediate portion EP1, which is a bridge, may be disposed to prevent a short circuit between the first and second extending portions SE1-1 and SE1-2, the second electrode SE2 of the first group, and the second electrode PSE2 of the second group. The first intermediate portion EP1 may connect two adjacent first sensing portions SP1 through first contact holes T-CH1 penetrating the second insulating layer 200-IL2.

Each of the third and fourth extending portions SE2-1 and SE2-2 of the second electrode SE2 of the first group may include second sensing portions SP2 arranged in the first direction DR1 and second intermediate portions EP2, each of which is disposed between two second sensing portions adjacent to each other among the second sensing portions SP2. The second sensing portions SP2 may have a bent shape. For example, the second sensing portions SP2 may have a shape bent upward or downward in the second direction DR2 to maintain a certain distance from the second electrode PSE2 of the second group.

The second intermediate portion EP2 is disposed on the same layer (e.g., the second insulating layer 200-IL2) as the second sensing portions SP2. The second intermediate portion EP2 may form one body with the second sensing portions SP2.

The first sensing portions SP1 and the second sensing portions SP2 may be spaced apart from each other without overlapping each other. The first sensing portions SP1 and the second sensing portions SP2 may be alternately disposed in a first crossing direction CDR1 and a second crossing direction CDR2. The first sensing portions SP1 and the second sensing portions SP2 may form mutual capacitors. For example, each of the first sensing portions SP1 and a corresponding one of the second sensing portions SP2 may serve as opposite electrodes of a corresponding mutual capacitor.

Referring to FIGS. 16 and 18, the first electrode PSE1 of the second group may include third sensing portions PSP1 arranged in the second direction DR2 and third intermediate portions PEP1, each of which connects two sensing portions adjacent to each other among the third sensing portions PSP1. The third sensing portions PSP1 may have a shape protruding leftward and rightward in the first direction DR1. The third sensing portions PSP1 may have a shape similar to a rhombic shape.

The third intermediate portion PEP1 is disposed on a layer different from the third sensing portions PSP1. The third intermediate portion PEP1 disposed under the second insulating layer 200-IL2 corresponds to a bridge. The third intermediate portion PEP1, which is a bridge, is disposed to prevent a short circuit between the third sensing portions PSP1, the second electrode SE2 of the first group, and the second electrode PSE2 of the second group. The third intermediate portion PEP1 connects two adjacent third sensing portions PSP1 through second contact holes T-CH2 penetrating the second insulating layer 200-IL2.

The second electrode PSE2 of the second group may include fourth sensing portions PSP2 arranged in the first direction DR1 and fourth intermediate portions PEP2, each of which is disposed between two sensing portions adjacent to each other among the fourth sensing portions PSP2. The fourth sensing portions PSP2 may have a shape protruding upward and downward in the second direction DR2. The fourth intermediate portion PEP2 is disposed on the same layer (e.g., the second insulating layer 200-IL2) as the fourth sensing portions PSP2. The fourth intermediate portion PEP2 may form one body with the fourth sensing portions PSP2.

The positions of bridges may be changed, and portions including the bridges may be changed. According to an embodiment of the present disclosure, unlike in the embodiment described with reference to FIGS. 15 to 18, bridges may be included in the second electrode SE2 of the first group and the second electrode PSE2 of the second group.

Some of the first signal lines SL1 and the second signal lines SL2 of the first group and the first signal line PSL1 and the second signal lines PSL2 of the second group may be disposed on the same layer as the third intermediate portion PEP1, and the others may be disposed on the same layer as the third sensing portions PSP1. This arrangement is to prevent a short circuit between the above-described signal lines. In an embodiment of the present disclosure, most of the above-described signal lines may be disposed on the same layer. However, a bridge may be disposed in a region where the signal lines cross each other.

The first group of electrodes SE and the second group of electrodes PSE described with reference to FIGS. 15 to 18 may have a thickness selected from a range of 0.1 μm to 1 μm. When the first group of electrodes SE and the second group of electrodes PSE have a thickness of less than 0.1 μm, the wiring resistance may be increased, and therefore the input sensing performance of the input sensor 200 may be decreased. When the first group of electrodes SE and the second group of electrodes PSE have a thickness of more than 1 μm, the thickness of the input sensor 200 may be excessively increased so that the total thickness of the electronic device ED (refer to FIG. 1A) may be increased, and therefore folding characteristics may be deteriorated.

The first group of electrodes SE and the second group of electrodes PSE may have a wiring resistance of 100Ω or less. The first group of electrodes SE and the second group of electrodes PSE may have a low resistance of 100Ω or less. Since the charging electrode PCE for charging the stylus pen STP (refer to FIG. 1A) is separately provided between the plurality of resin layers included in the base layer 110 of the display panel 100 as described above with reference to FIGS. 6 to 7B, a space for arrangement of electrodes and lines for charging the stylus pen STP (refer to FIG. 1A) may be unnecessary in the input sensor 200 so that the number of channels of the first group of electrodes SE and the second group of electrodes PSE may be increased. Accordingly, the sensing electrodes including the first group of electrodes SE and the second group of electrodes PSE may have a low resistance of 100Ω or less, and the driving voltage for driving the sensing electrodes may be lowered to about 3.3V or less.

FIG. 19 illustrates an enlarged view of the first sensing portion SP1 and the third sensing portion PSP1 as illustrated in FIG. 16. The first sensing portion SP1 is illustrated to represent the first group of electrodes SE, and the third sensing portion PSP1 is illustrated to represent the second group of electrodes PSE.

Referring to FIG. 19, the first sensing portion SP1 and the third sensing portion PSP1 may have a mesh shape. For example, each of the first sensing portion SP1 and the third sensing portion PSP1 may include second conductive lines BP2 extending in the first crossing direction CDR1 and first conductive lines BP1 extending in the second crossing direction CDR2. The first conductive lines BP1 and the second conductive lines BP2 may be formed through the same process and may form one body. A mesh sheet formed of the first conductive lines BP1 and the second conductive lines BP2 may be subjected to patterning to form the first electrode SE1 and the second electrode SE2 of the first group and the first electrode PSE1 and the second electrode PSE2 of the second group illustrated in FIG. 15.

Openings T-OP having a rhombic shape may be defined by the first conductive lines BP1 and the second conductive lines BP2. The openings T-OP may correspond to the emissive region LA as illustrated in FIG. 6. For example, the first conductive lines BP1 and the second conductive lines BP2 overlap the non-emissive region NLA as illustrated in FIG. 6.

Figure 20:
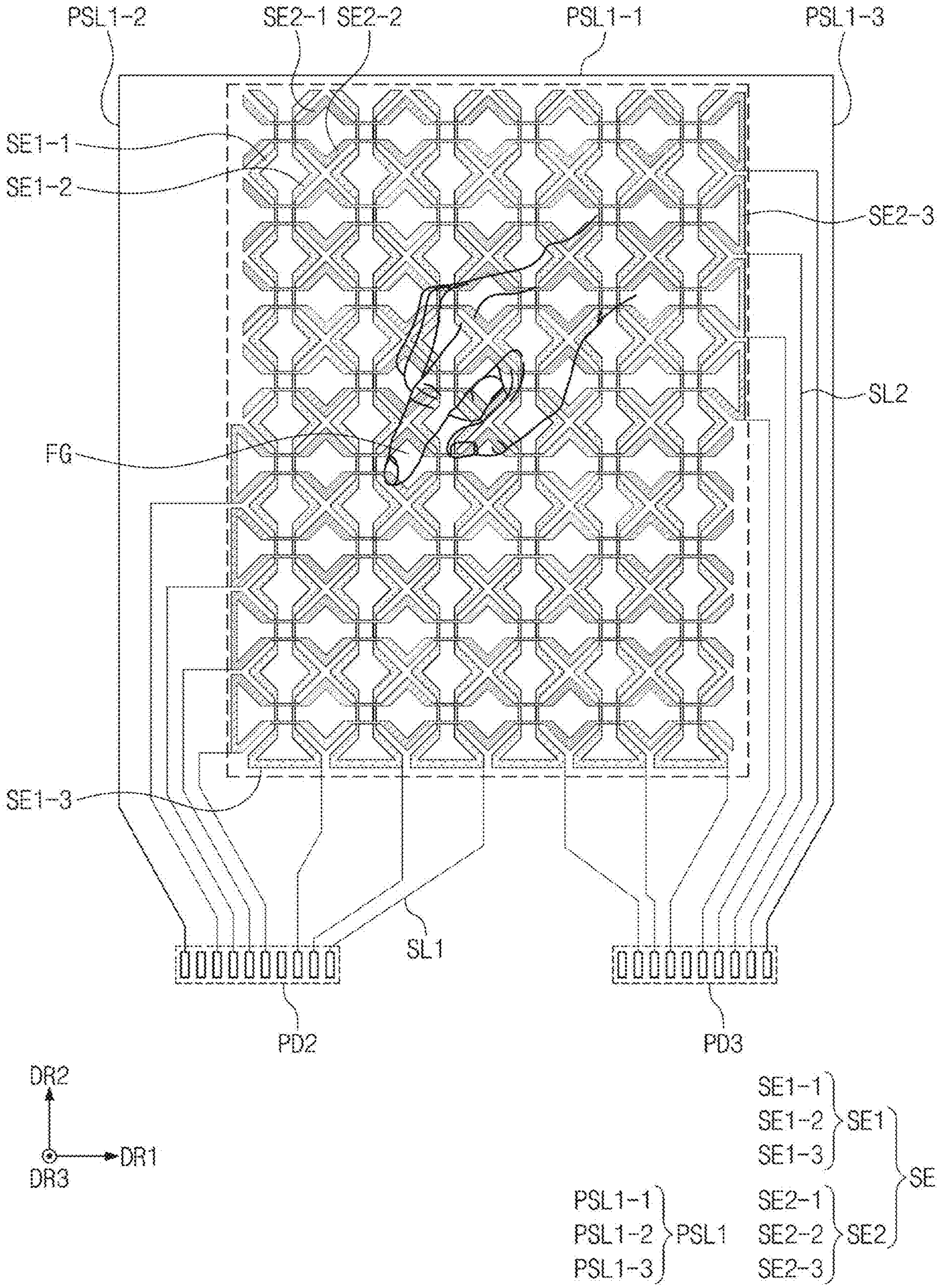
FIG. 20 is a plan view illustrating electrodes included in an input sensor according to an embodiment of the present disclosure during a first sensing period.

FIG. 20 is a plan view illustrating the electrodes included in the input sensor 200 according to an embodiment of the present disclosure during a first sensing period. FIG. 20 is a plan view illustrating the first group of electrodes SE of FIG. 15 during an operation period.

During the first sensing period, the second group of electrodes PSE illustrated in FIG. 15 are not involved in an operation of the input sensor 200. That is, the input sensor 200 does not provide a drive signal to the second group of electrodes PSE and does not sense signals from the second group of electrodes PSE. For simplicity of illustration, the second group of electrodes PSE of FIG. 15 are not illustrated in FIG. 20.

During the first operation period, the drive circuit of the input sensor provides drive signals to the first electrodes SE1 or the second electrodes SE2 of the first group. For example, the drive circuit of the input sensor may scan the first electrodes SE1 or the second electrodes SE2 of the first group. For example, the drive circuit of the input sensor sequentially provides the drive signals to the first electrodes SE1 of the first group through the first signal lines SL1 of the first group. Activation periods of the drive signals applied to the first electrodes SE1 of the first group may be different from one another. The drive signals may include a plurality of pulse waves or a plurality of sine waves within the activation periods. The drive circuit of the input sensor may be embedded in a separate driver IC of the input sensor, or may be embedded in the driver IC DIC (refer to FIG. 2) mounted on the display panel 100.

Current paths from the electrodes receiving the drive signals among the first electrodes SE1 of the first group to the second electrodes SE2 of the first group are formed. The current paths pass through the mutual capacitor formed between the first electrodes SE1 and the second electrodes SE2 of the first group. A change in the capacitance of the mutual capacitor is detected through the second electrodes SE2 of the first group. The sensing circuit of the input sensor measures electric currents through the second electrodes SE2 of the first group and calculates the capacitance change based on the measured electric currents. For example, the electric current measured through the electrode where the input by the user's body FG occurs among the second electrodes SE2 of the first group is different from the electric currents measured through the other electrodes. The sensing circuit of the input sensor may be embedded in a separate driver IC of the input sensor, or may be embedded in the driver IC DIC (refer to FIG. 2) mounted on the display panel 100.

Figure 21:
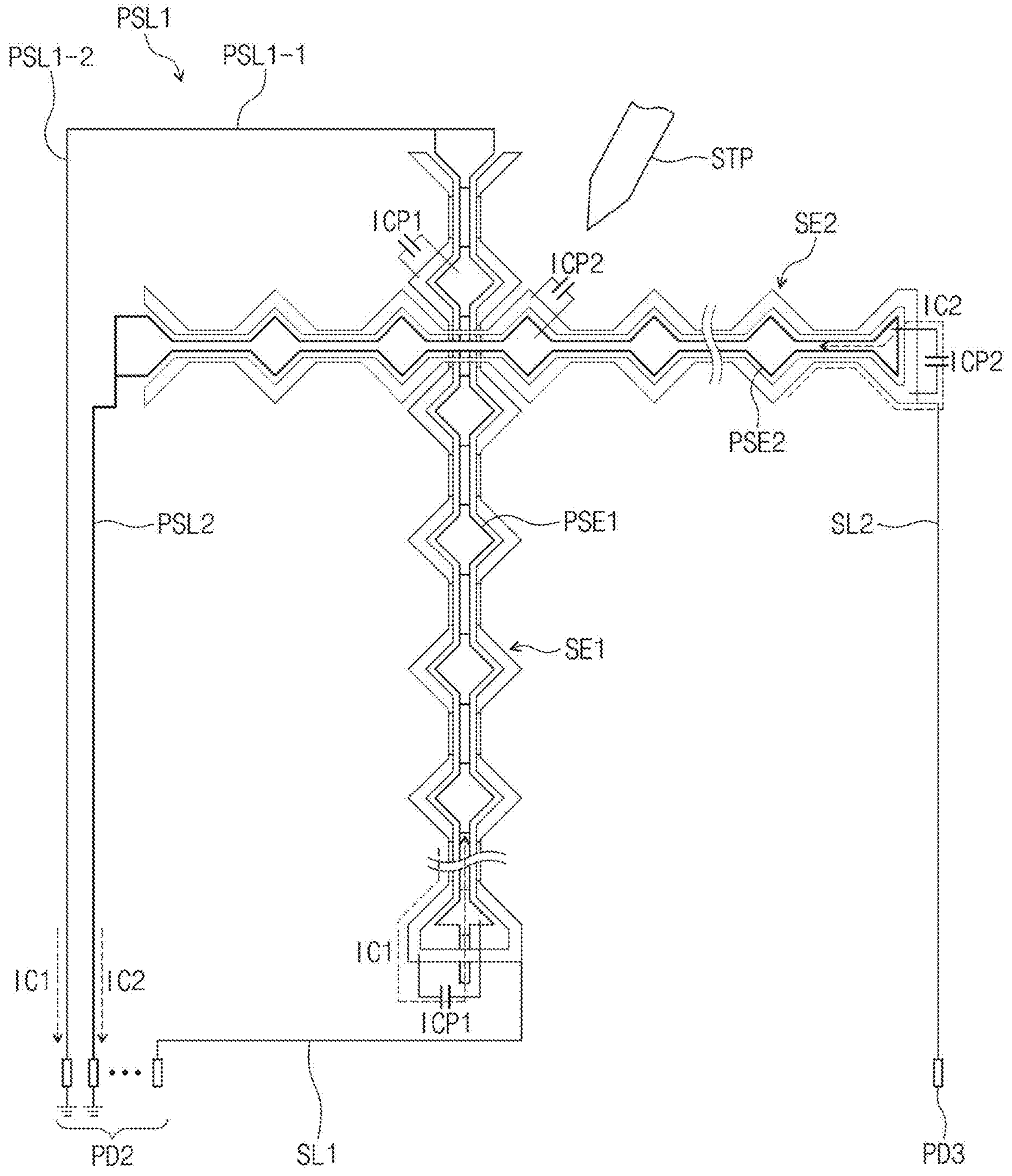
FIG. 21 is a plan view illustrating electrodes included in an input sensor according to an embodiment of the present disclosure during a second sensing period.

FIG. 21 is a plan view illustrating the electrodes included in the input sensor 200 according to an embodiment of the present disclosure during a second sensing period. In FIG. 21, one first electrode SE1 of the first group and one first electrode PSE1 of the second group in which an induced current is generated by a magnetic field signal output from the stylus pen STP are illustrated. An induced current is generated in one second electrode SE2 of the first group and one second electrode PSE2 of the second group illustrated in FIG. 21 by the magnetic field signal output from the stylus pen STP.

Referring to FIGS. 15 and 21, during the second sensing period, the sensing circuit of the input sensor may apply a ground voltage to the first signal line PSL1 of the second group and the second signal line PSL2 of the second group. Referring to FIG. 21, the second pad PD2 connected to the first signal line PSL1 of the second group may be grounded, and the second pad PD2 connected to the second signal line PSL2 of the second group that is disposed in the left region may be grounded. The resonance circuit of the stylus pen STP generates a magnetic field while being discharged. An induced current may be generated in the input sensor 200, which is inductively coupled with the resonance circuit of the stylus pen STP, by the magnetic field emitted from the stylus pen STP.

A first capacitor ICP1 may be defined between the first electrode SE1 of the first group and the first electrode PSE1 of the second group, and a second capacitor ICP2 may be defined between the second electrode SE2 of the first group and the second electrode PSE2 of the second group. As the first signal line PSL1 of the second group is grounded, a first induced current IC1 may flow from the first electrode SE1 of the first group to the first electrode PSE1 of the second group through the first capacitor ICP1. As the second signal line PSL2 of the second group is grounded, a second induced current IC2 may flow from the second electrode SE2 of the first group to the second electrode PSE2 of the second group through the second capacitor ICP2. The sensing circuit of the input sensor may sense the first induced current IC1 through the first signal line SL1 of the first group and the second pad PD2 connected thereto and may sense the second induced current IC2 through the second signal line SL2 of the first group and the third pad PD3 connected thereto, thereby identifying an input by the stylus pen STP.

According to the embodiments of the present disclosure, the sensing electrodes for sensing an input of a stylus pen and the charging electrode for charging the stylus pen may be spaced apart from each other with the pixels therebetween. Accordingly, the number of channels of the sensing electrodes included in the input sensor may be increased, and thus the sensing performance of the sensing electrodes may be improved.

According to the embodiments of the present disclosure, the shielding pattern may have a certain thickness or less. Accordingly, the magnetic field generated by the shielding pattern may be prevented from cancelling the magnetic field of the charging electrode and decreasing the charging efficiency.

According to the embodiments of the present disclosure, the shielding pattern may reduce interference with the pixel drive element when the charging electrode is driven.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A display device comprising:

a display panel including a display region and a non-display region around the display region; and an input sensor disposed on the display panel, the input sensor including a sensing electrode configured to sense an electromagnetically induced current, wherein the display panel includes:

a base layer including a plurality of resin layers;

a plurality of pixels disposed on the base layer and overlapping the display region;

a charging electrode disposed under at least one resin layer among the plurality of resin layers and overlapping the display region; and a first shielding pattern disposed on the base layer and overlapping the display region, the first shielding pattern having a first thickness and having at least one slit dividing the first shielding pattern into a plurality of sections, and wherein the first shielding pattern overlaps one transistor of one pixel among the plurality of pixels when viewed in a plan view, and wherein the at least one slit does not overlap the one transistor of another pixel among the plurality of pixels when viewed in the plan view.

2. The display device of claim 1, wherein the first shielding pattern overlaps the charging electrode when viewed in the plan view.

3. The display device of claim 1, wherein the first thickness corresponds to a thickness satisfying a relation of the following equation:

$$T1 \leq \left(\frac{D}{ABC}\right)^{1/2},$$

where T1 represents the first thickness, A is pi (π), B is permeability of the first shielding pattern, C is frequency of electric current flowing through the first shielding pattern, and D is resistivity of the first shielding pattern.

4. The display device of claim 1, wherein the first shielding pattern includes:

a plurality of unit patterns including a first unit pattern covering the one transistor; and a plurality of connecting patterns, each of the plurality of connecting patterns connecting two adjacent unit patterns of the plurality of unit patterns.

5. The display device of claim 4, wherein an entirety of the one transistor is covered by the first unit pattern when viewed in the plan view.

6. The display device of claim 1, wherein the charging electrode is disposed in spaces between two adjacent slits among the at least one slit when viewed in the plan view.

7. The display device of claim 1, wherein the at least one slit includes a plurality of slits, and wherein the plurality of slits extend in a first direction and are spaced apart from each other in a second direction crossing the first direction.

8. The display device of claim 1, wherein the at least one slit includes a plurality of slits, and wherein the plurality of slits radially extend with respect to a center of the first shielding pattern.

9. The display device of claim 1, wherein the at least one slit has a single slit, wherein the single slit includes a plurality of first slit portions extending in a first direction and a plurality of second slit portions extending in a second direction crossing the first direction, and wherein each of the plurality of second slit portions connects two adjacent first slit portions of the plurality of first slit portions.

10. The display device of claim 1, wherein the plurality of resin layers include:

a first resin layer; and a second resin layer disposed on the first resin layer, wherein the charging electrode is disposed on the first resin layer and covered by the second resin layer, and wherein the first shielding pattern is disposed on the second resin layer.

11. The display device of claim 10, wherein the display panel further comprises:

an insulating layer covering the first shielding pattern; and a second shielding pattern disposed on the insulating layer and overlapping the display region.

12. The display device of claim 11, wherein a second thickness of the second shielding pattern corresponds to a thickness satisfying a relation of the following equation:

$$T2 \leq \left(\frac{D}{ABC}\right)^{1/2},$$

where T2 represents the second thickness.

13. The display device of claim 11, wherein one of the first shielding pattern and the second shielding pattern covers the one transistor when viewed from above a plane, and wherein the other of the first shielding pattern and the second shielding pattern covers the charging electrode when viewed from above the plane.

14. The display device of claim 1, wherein the sensing electrode includes:

a first electrode of a first group extending in a first direction;

a second electrode of the first group extending in a second direction crossing the first direction and capacitively coupled with the first electrode of the first group;

a first electrode of a second group extending in the first direction and sense the electromagnetically induced current;

a second electrode of the second group extending in the second direction and sense the electromagnetically induced current;

a first signal line of the first group connected to one end of the first electrode of the first group;

a second signal line of the first group connected to one end of the second electrode of the first group;

a first signal line of the second group connected to one end of the first electrode of the second group; and a second signal line of the second group connected to one end of the second electrode of the second group.

15. The display device of claim 1, wherein the first shielding pattern includes at least one of rhodium (Rh), tungsten (W), and molybdenum (Mo).

16. An electronic device comprising:

a display panel including a display region and a non-display region around the display region; and an input sensor disposed on the display panel, the input sensor including a sensing electrode sensing an electromagnetically induced current, wherein the display panel includes:

a plurality of pixels overlapping the display region, each pixel including a light emitting element and at least one transistor connected to the light emitting element;

a charging electrode spaced apart from the sensing electrode with the plurality of pixels therebetween and overlapping the display region, wherein the charging electrode is below a first pixel of the plurality of pixels; and a shielding pattern disposed over the charging electrode and overlapping the display region, the shielding pattern being divided into a plurality of sections by at least one slit, and the shielding pattern disposed between the charging electrode and the first pixel.

17. The electronic device of claim 16, wherein a first thickness T1 of the shielding pattern satisfies a relation of the following equation:

$$T1 \leq \left(\frac{D}{ABC}\right)^{1/2},$$

where T1 is the first thickness, A is pi (π), B is permeability of the shielding pattern, C is frequency of electric current flowing through the shielding pattern, and D is resistivity of the shielding pattern.

18. The electronic device of claim 16, wherein the shielding pattern covers the charging electrode when viewed in a plan view.

19. The electronic device of claim 16, wherein the shielding pattern covers the at least one transistor when viewed in a plan view.

20. The electronic device of claim 16, wherein the plurality of sections are configured to form a current path generating a magnetic field.

* * * * *